(12) United States Patent
Saeki

(10) Patent No.: US 6,509,224 B2
(45) Date of Patent: Jan. 21, 2003

(54) SEMICONDUCTOR DEVICE AND METHOD FOR MANUFACTURING THEREOF

(75) Inventor: Takanori Saeki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/818,917

(22) Filed: Mar. 28, 2001

(65) Prior Publication Data

US 2001/0013601 A1 Aug. 16, 2001

Related U.S. Application Data

(62) Division of application No. 09/019,740, filed on Feb. 6, 1998, now Pat. No. 6,225,657.

(30) Foreign Application Priority Data

Feb. 7, 1997 (JP) .............................. 9-040101

(51) Int. Cl.[7] ........................................ H01L 21/8242
(52) U.S. Cl. ...................................... 438/241; 438/238
(58) Field of Search ................................ 438/241, 239, 438/243, 244, 238

(56) References Cited

U.S. PATENT DOCUMENTS

| | | | |
|---|---|---|---|
| 4,803,535 A | * 2/1989 | Taguchi | 257/301 |
| 4,873,205 A | 10/1989 | Critchlow et al. | 437/200 |
| 4,921,816 A | * 5/1990 | Ino | 438/239 |
| 5,170,372 A | 12/1992 | Wong et al. | 257/304 |
| 5,309,008 A | 5/1994 | Watanabe | 257/304 |
| 5,442,584 A | 8/1995 | Jeong et al. | 375/149 |
| 5,838,038 A | 11/1998 | Takashima et al. | 257/301 |
| 5,998,257 A | * 12/1999 | Lane et al. | 438/239 |

FOREIGN PATENT DOCUMENTS

| | | |
|---|---|---|
| JP | 63-96951 | 4/1988 |
| JP | 1-231363 | 9/1989 |
| JP | 1-243460 | 9/1989 |
| JP | 4-256359 | 9/1992 |
| JP | 8-17938 | 1/1996 |
| JP | 9-27599 | 1/1997 |

OTHER PUBLICATIONS

"ISSCC96/Session 16/Technology Directions: Memory/Paper FP 16.2", IEEE International, pp. 262–263.

* cited by examiner

*Primary Examiner*—Michael Trinh
(74) *Attorney, Agent, or Firm*—Foley & Lardner

(57) ABSTRACT

A semiconductor device in which the number of steps intrinsic to a memory cell is reduced to as small a value as possible to realize reduction in cell size and invulnerability against software error. A gate oxide film 306 and a capacitance insulating film 310 are formed by one and the same oxide film forming step, while a gate electrode 305 and a charge holding electrode 309 are formed by one and the same electrode forming step. A capacitance electrode connecting local interconnection 311 and a bit line connection local connection 312 are formed by the same interconnection forming step whilst active areas 303 neighboring in the word line direction are arranged with an offset of one gate electrode 305. An area of the isolation film 302 between extending word lines is arrayed adjacent to the Z–Z' direction of the capacitance forming diffusion layer 307 of the active area 303. A trench 304 can be arranged in an isolation oxide film 302 between throughout-extending word lines in a direction 90° offset from the long side direction of the active area 303. There is no pattern of a charge holding electrode 309 such that the trench 304 can be arranged proximate to both side gate electrodes 305 at a separation of approximately one-fourth the minium separation of the gate electrodes.

3 Claims, 52 Drawing Sheets

PATTERN-NUMBER CORRELATION OTHER THAN THE GATE ELECTRODES 305 (WORD LINES) AND BIT LINES 313

X-X'

Z-Z'

US 6,509,224 B2

SEMICONDUCTOR DEVICE AND METHOD FOR MANUFACTURING THEREOF

This is a Divisional Application of Application Ser. No. 09/019,740, filed Feb. 6, 1998, now U.S. Pat. No. 6,225,657.

TECHNICAL FIELD OF THE INVENTION

This invention relates to a semiconductor device and, more particularly, it relates to a memory cell structure of a dynamic random access memory made up of a sole transistor and sole capacitor, and a method for manufacturing same.

BACKGROUND OF THE INVENTION

Since the time of development of a memory cell of a dynamic random access memory made up of a sole transistor and a sole capacitor, it has become difficult to simplify the structure and to save the areal space by circuit configuration. Thus, attempts have been made to realize saving in areal space by a three-dimensional capacitor structure by the device process, self-alignment of contact interconnections and by multi-layered interconnections. In these attempts, the memory cell structure, starting from a planar capacitor structure in which a gate electrode 505 of a MOS transistor and a counterelectrode 509 of a capacitor charge holding electrode are formed on a semiconductor substrate 501, as shown in FIG. 48, was roughly diverged into a trench capacitor structure and a stacked structure. In the trench capacitor structure, shown in FIG. 49, a hole or a trench 604 is formed in a semiconductor substrate 601, carrying a gate electrode 605 of a MOS transistor and a counterelectrode 609 of a capacitor charge holding electrode, and the hole surface is used as a capacitor charge holding electrode, that is as a capacitance forming diffusion layer 607. In the stacked structure, shown in FIG. 50, a capacitor charge holding electrode 711, that is a stacked electrode 711, is formed on a semiconductor substrate 701, carrying a gate electrode 705 of a MOS transistor and a counterelectrode 709 of the capacitor charge holding electrode.

Referring to FIG. 48, 502 is a device isolating oxide film, 503 an active area, 506 a gate oxide film, 507 is a capacitance forming diffusion layer, 508 a bit line connecting diffusion layer, 510 a capacitance insulating film, 513 a bit line and 515 is a connection hole. Referring to FIG. 49, 602 is a device isolating oxide film, 606 a gate oxide film, 608 a bit line connection diffusion layer, 609 a counterelectrode of a charge holding electrode, 610 a capacitance insulating film, 613 a bit line and 615 is a connection hole. Referring to FIG. 50, 703 is an active area, 705 a gate electrode, 706 a gate oxide film, 707 a capacitance forming diffusion layer, 708 a bit line connection diffusion layer, 710 a capacitance insulating film, 713 a bit line, and each of 714, 715 is a connection hole.

The trench capacitor structure was further diverged into a system having a substrate as a capacitor charge holding electrode, as shown in FIG. 49, and a system having a substrate 801 as a counterelectrode of a capacitor charge holding electrode, as shown in FIG. 51. Referring to FIG. 51, 802 is a device isolating oxide film, 803 an active area, 804 a trench, 805 a gate electrode, 806 a gate oxide film, 807 a capacitance forming diffusion layer, 808 a bit line connection diffusion layer, 809 a charge holding electrode, 810 a capacitance insulating layer, 813 a bit line, and 815 is a connection hole.

Referring to FIG. 50, the stacked structure was evolved from the on-word-line stacked electrode system of forming a stacked electrode 711 on a gate electrode 705 to a on-bit-line stacked electrode structure, as shown in FIG. 52, of forming a capacitor made up of a stacked electrode 911 and a counterelectrode 909 of the charge holding electrode.

The following problems have been encountered and/or turned out in the course of investigations toward the present invention.

Recently, with the increasing system speed, a demand for raising the data transfer speed between a logic device such as a micro-processor or a gate array and the memory device is increasing. For raising the data transfer speed between chips, a dedicated input/output circuitry and dedicated boards are required. In addition, power consumption at the input/output circuitry and the package cost are increased, such that it has become necessary to have the logic device and the memory device mounted on a sole chip.

In contradistinction from the manufacturing process for a logic device for which basically the manufacturing process for the (M)S transistor suffices, the manufacturing process for a memory device is in need of a manufacturing process for a three-dimensional capacitor in addition to the manufacturing process for a CMOS transistor.

Therefore, since the manufacturing process for the three-dimensional capacitor represents a redundant process for the area of the logic device, the cost of a sole chip is higher than that of a chip of the logic device by itself and a sole chip of the dynamic random access memory device.

Moreover, in the memory cell of the stacked structure, since a capacitor made up of the stack electrode 711, 911 and the counterelectrode 709, 909 of the charge holding electrode after formation of the gate electrode of the MOS transistor as shown in FIGS. 50 and 52, the extent/amount of the heat treatments after formation of the MOS transistor is increased to deteriorate characteristics of the MOS transistors.

In the trench capacitor structure, since the capacitor structure is produced before formation of the gate electrode, the problem of deterioration of MOS transistor characteristics is not liable to be raised. However, the electrode for the capacitor and the capacitance insulating film are formed by a process other than the logic device process, thus inevitably increasing the number of steps and cost.

For overcoming these problems, a proposal has been made for systems for manufacturing the dynamic random access memory device by the manufacturing process for the CMOS transistor by using an insulating film for the capacitor and an insulating film for the transistor in common and by using an electrode for a capacitor and an electrode for the transistor in common (see a reference material 'ISSCC96 FP16.1'). In one of these systems, since the capacitor is of a planar structure, the memory cell area is excessively increased. In another of the above systems, similarly employing the capacitor electrode and the transistor electrode in common, a trench capacitor structure is used, in which a trench is formed in a capacitor forming region of the substrate prior to format ion of the insulating film for the transistor, with the hole surface being used as a capacitor charge holding electrode (see JP Patent Kokai Publication JP-A-1-231363).

SUMMARY OF THE DISCLOSURE

With this system, the capacitor portion is decreased in area in an amount corresponding to the trench. However, since the transistor electrode and the counterelectrode of the capacitor charge holding electrode are formed by the same interconnection layer, and hence the separation width corresponding to the machining tolerance for lithography needs to be provided, the memory cell becomes larger in cell size than the memory cell of the trench capacitor structure of the type not employing the insulating film for the capacitor and the insulating film for the transistor in common. Moreover, since the hole surface is used as the capacitor charge holding electrode, the junction area between the semiconductor substrate and the charge holding electrode is increased in proportion to the surface area of the electrode, thus worsening the data holding characteristics of the chip and also software error properties.

On the other hand, in the trench capacitor structure of the system having the substrate as a counterelectrode of the capacitor charge holding electrode, since the substrate surface is used as a counterelectrode of the charge holding electrode, in case where the trench is formed directly in the diffusion area connecting to the capasitance holding electrode of the transistor, it becomes difficult to suppress the effect of parasitic elements in the isolation area between the diffusion area connecting to the capacitance holding electrode and the substrate of the counterelectrode of the capacitance.

The dynamic random access memory device usually has an internal voltage decreasing circuit, a voltage raising circuit and a substrate potential generating circuit. In the logic device, the internal voltage decreasing circuit, voltage raising circuit and the substrate potential generating circuit are required for controlling the transistor threshold value for decreasing the stand-by leak current.

In such potential generating circuit, a compensation capacitance device is essential. However, since the dynamic do random access memory device usually employs a gate electrode, a problem is raised that a large area is taken up in the chip.

In view of the above-mentioned status of the art, it is an object of the present invention to provide a novel semiconductor device and a manufacturing method for same in which not only the number of steps proper to the memory cell is reduced to as small a number as possible and in which the cell size is reduced and immunity from software error is realized to the greatest extent possible.

Other objects of the present invention will become apparent in the entire disclosure.

For accomplishing the above object, various aspects of the solutions according to the present invention will be explained below.

According to a first aspect of the present invention there is provided a semiconductor device having a dynamic random access memory having a plurality of memory cells each having a transistor and a capacitor. The semiconductor device has the following features. A gate oxide film of the transistor and a capacitance insulating film of the capacitor are formed by the same insulating layer. A gate electrode of the transistor and a charge holding electrode of the capacitor are formed by eliminating unneeded portions of the same electrically conductive layer to give a desired shape. A counterelectrode of the charge holding electrode of the capacitor is formed by a recess, that is a trench, in the surface of a semiconductor substrate.

According to a second aspect of the present invention the semiconductor device has the following features, particularly in the semiconductor device of the first aspect of the present invention. A plurality of active areas are formed on a surface of a semiconductor substrate for forming the transistor of the dynamic random access memory, and an area is formed with an insulating film for isolation of the active area. The trench is formed in the area coated with the insulating film for isolation of the active area by providing an opening in the insulating film for isolation of the active area in a pre-set portion other than the active area.

According to a third aspect of the present invention the semiconductor device has the following features, particularly in the semiconductor device of the first or second aspect. A trench is formed at an intermediate between neighboring gate electrodes. A part or the entire of the charge holding electrode of the capacitor is formed by the same electrically conductive film as the gate electrode and buried (i.e., disposed) in the trench.

According to a forth aspect of the present invention the semiconductor device has the following features, particularly in the semiconductor device of the first, second or third aspect of the present invention. The active areas of the gate electrode neighboring to each other in the direction of the channel width are offset by one neighboring gate electrode, The trench is formed in a direction 90° offset from the long side direction of the active area.

According to a fifth aspect of the present invention the semiconductor device has the following features, particularly in the semiconductor device of the third or fourth aspect of the present invention. The charge holding electrodes buried in the trench and a capacitance connecting portion of the active areas forming the transistor are connected to each other by lateral growth(formation or provision) of a selectively grown electrical conductor.

According to a sixth aspect of the present invention the semiconductor device has the following features, particularly in the semiconductor device of the third or fourth aspect of the present invention. The charge holding electrodes buried in the trench and a capacitance connecting portion of the active area forming the transistor are connected to each other by lateral growth(formation or provision) of a selectively grown electrically conductive member of silicon and by lateral growth(formation or provision) by silicidation of the electrical conductor.

According to a seventh aspect of the present invention the semiconductor device has the following features, particularly in the semiconductor device of the first to seventh aspects of the present invention, the active area making up the transistor is isolated from the semiconductor substrate by a substrate isolating silicon oxide film.

According to an eighth aspect of the present invention, particularly in the semiconductor device of the first to eighth aspects of the present invention, the trench is formed in an area other than the memory cell array area so as to be used as a capacitance device.

According to a further aspect, the present invention also provides a method for manufacturing a semiconductor device having a dynamic random access memory having a plurality of memory cells each having a transistor and a capacitor. The method comprises various steps. Namely, a gate oxide film of the transistor and a capacitance insulating film of the capacitor are formed by one and the same oxide film forming step. A gate electrode of a charge holding electrode of the capacitor are formed by one and the same electrode forming step by removing an unneeded portion of the same electrically conductive layer to a desired shape (pattern). A charge holding electrode of the capacitor is arranged on the electrical conductor side, and a counterelectrode of the charge holding electrode is formed as a recess, that is a trench, in the surface of the semiconductor substrate. Further aspects of the present invention are set forth in the various claims and will be apparent from the entire disclosure in conjunction with the drawings.

REFERRED EMBODIMENTS OF THE INVENTION

Preferred embodiments of the present invention will hereinafter be explained. In the preferred embodiments, the semiconductor device of the present invention has a dynamic random access memory having plural memory cells each made up of a sole transistor and a sole capacitor. The gate oxide film of the transistor (106 of FIG. 2) and a capacitor insulating film (110 of FIG. 2) are formed by an insulating film produced by the same oxide film forming steps. A gate electrode of the transistor (105 of FIG. 2) and a capacitor charge holding electrode (109 of FIG. 2) are formed by the same electrode forming steps, whilst the counterelectrode of the capacitor charge holding electrode is formed by or as a trench formed in the semiconductor substrate surface.

Figure 12:
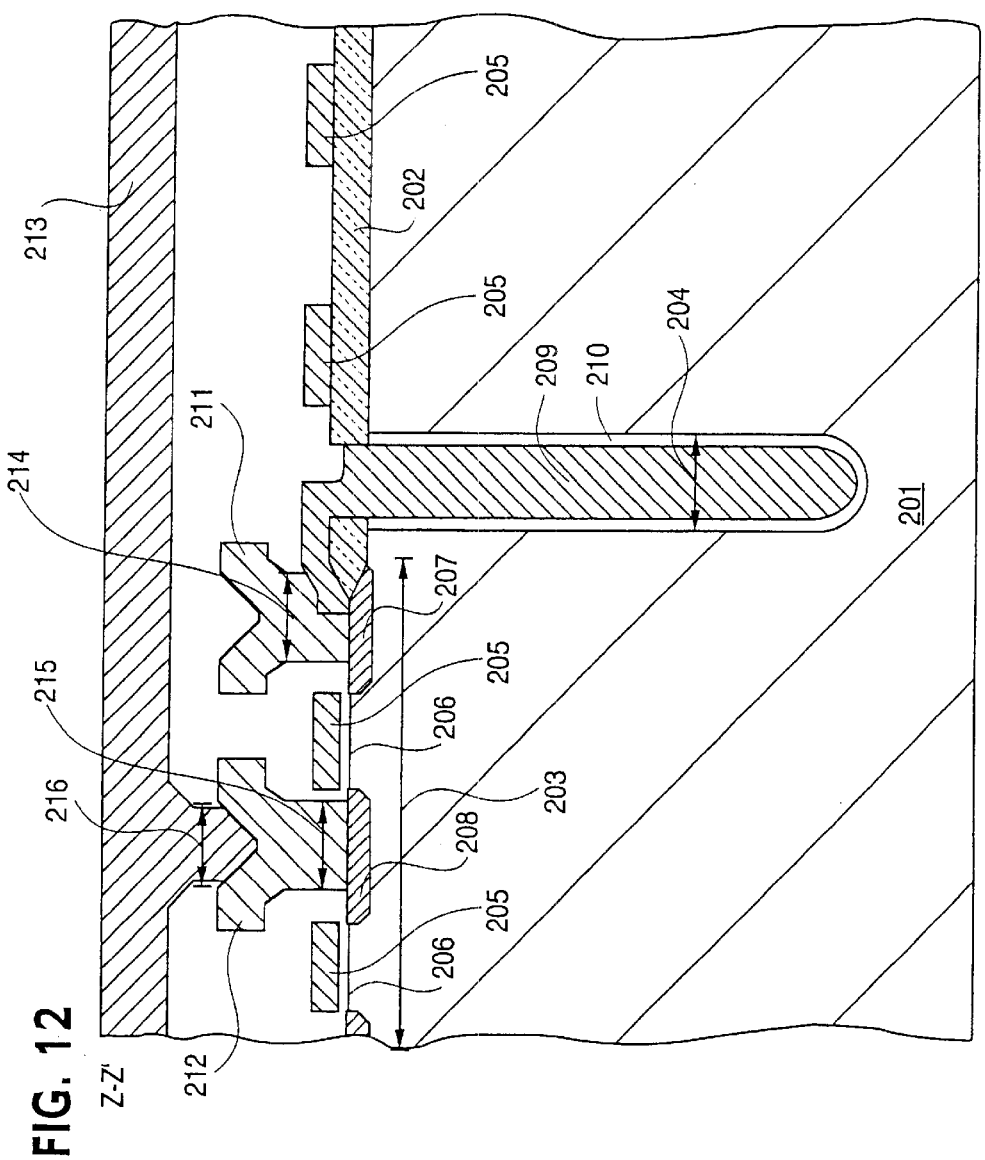
FIG. 12 is a cross-sectional view taken along line Z–Z' of FIG. 11.

In accordance with the preferred embodiment, the trench forming position is at an intermediate position between neighboring gate electrodes, and the charge holding electrode of a capacitor, formed by the same electronically conductive film as the gate electrode, is buried wholly or partially in the trench (see e.g., FIG. 12).

Figure 17:
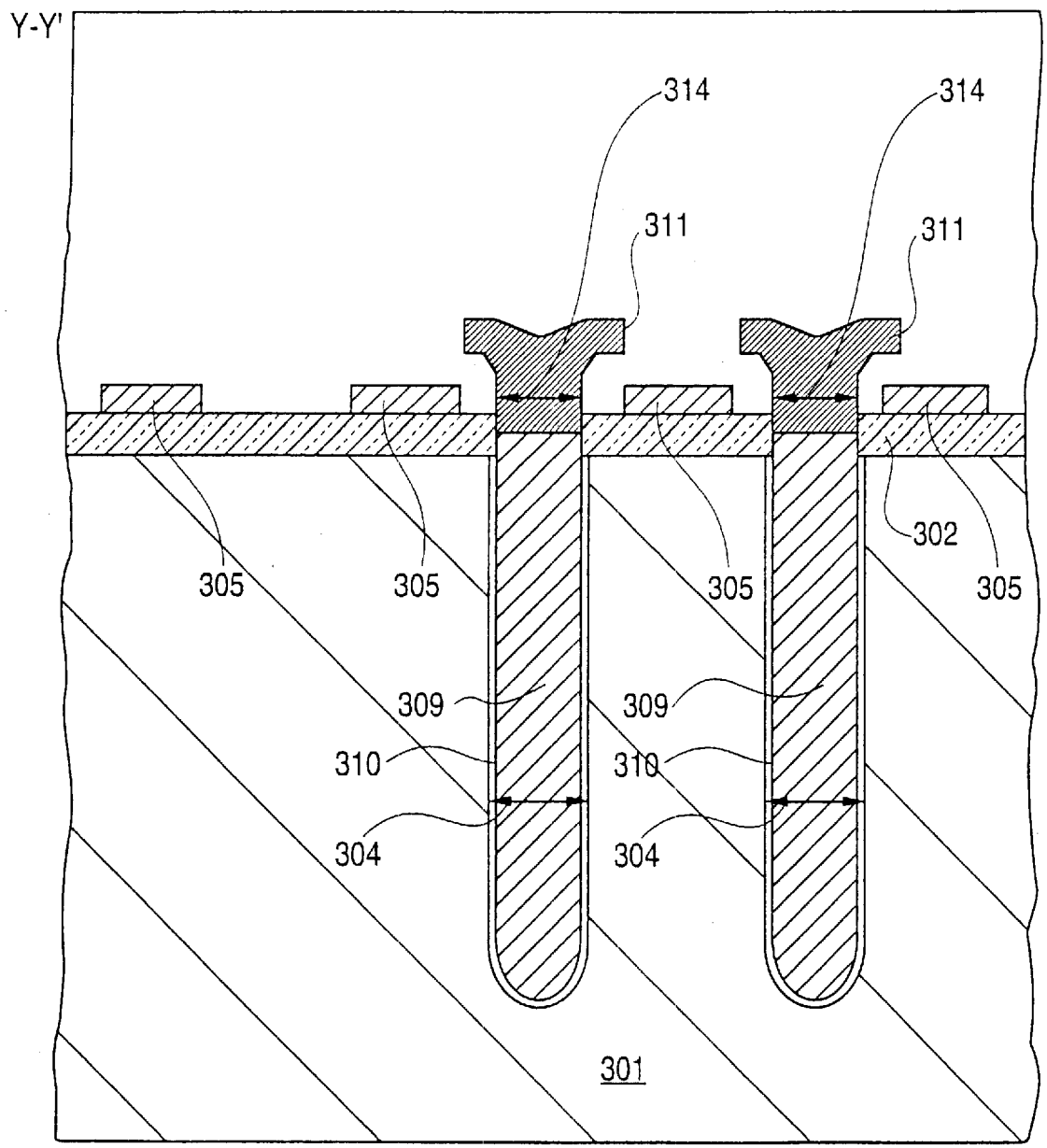
FIG. 17 is a cross-sectional view taken along line Y–Y' of FIG. 15.
Figure 18:
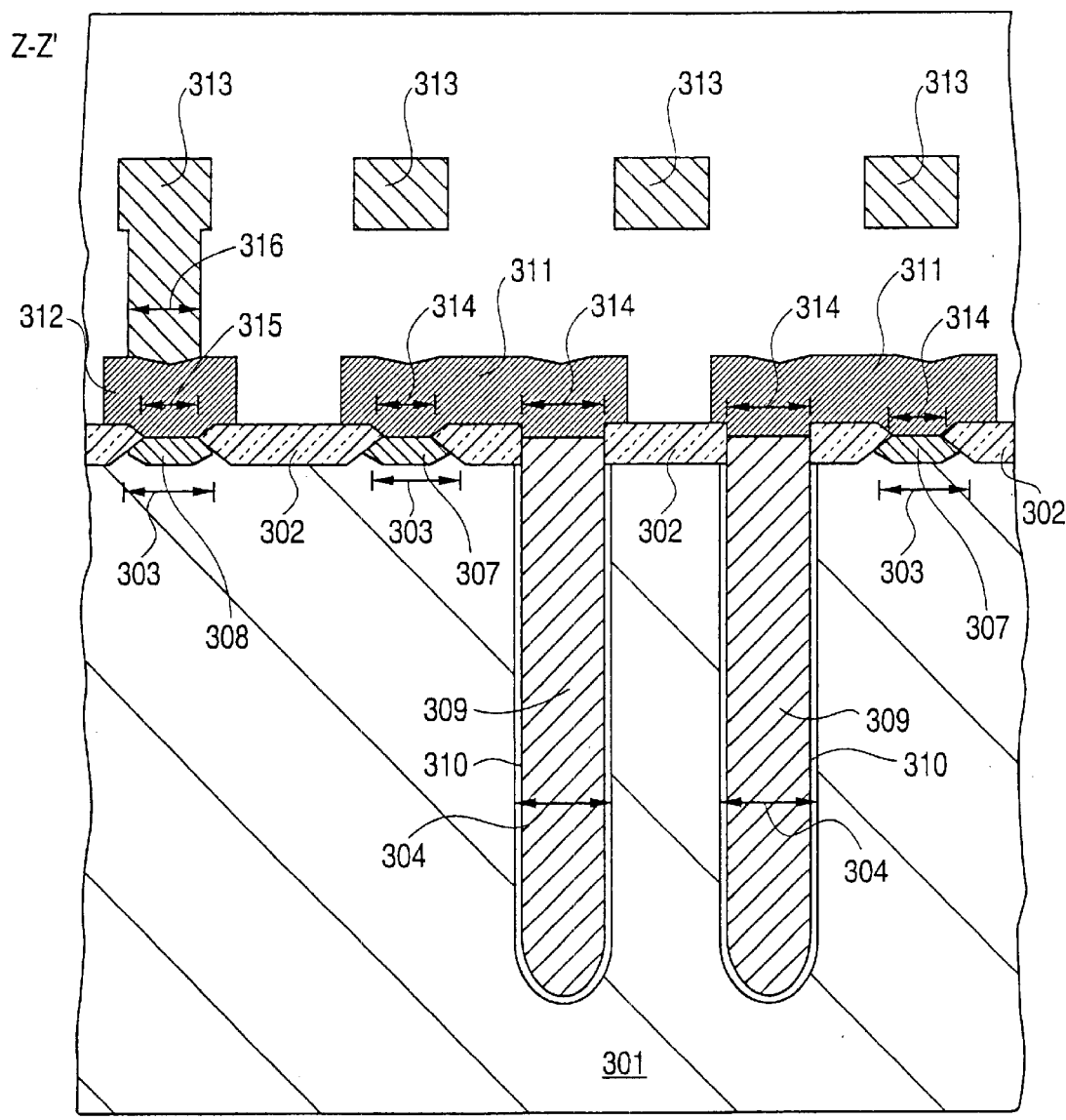
FIG. 18 is a cross-sectional view taken along line Z–Z' of FIG. 15.

In a preferred embodiment of the present invention, a local interconnection for connecting a capacitance electrode (such as 311 of FIG. 18) and a bit line connecting local interconnection (such as 312 of FIG. 18) are formed by the same interconnection forming step, whilst active areas neighboring to one another in the word line direction (such as 303 of FIGS. 16 and 18) are offset by one gate electrode (word line) (305 in FIG. 16) such that an area of the isolation oxide film between word lines (302 of FIG. 16) extending throughout is arrayed adjacent to the Z–Z' direction of the capacitance forming diffusion layer of the active area (307 of FIG. 18). Thus, the trench (304 of FIGS. 17 and 18) can be arranged in the isolation oxide film area between the throughout-extending word lines in a direction 90° offset from the long-side (longitudinal) direction of the active area, that is in the Z–Z' direction(see FIG. 15).

Since there is no pattern of the charge holding electrode, and the trench (304 of FIG. 17) is disposed in proximity to the gate electrodes on both sides to a position of an extent of one quarter of the minimum separation between the gate electrodes, there may be provided a memory cell of high reliability and small area by adding only the trench opening step. For further illustration of the embodiments of the present invention, preferred embodiments of the present invention will be explained with reference to the drawings.

Embodiment 1

Figure 1:
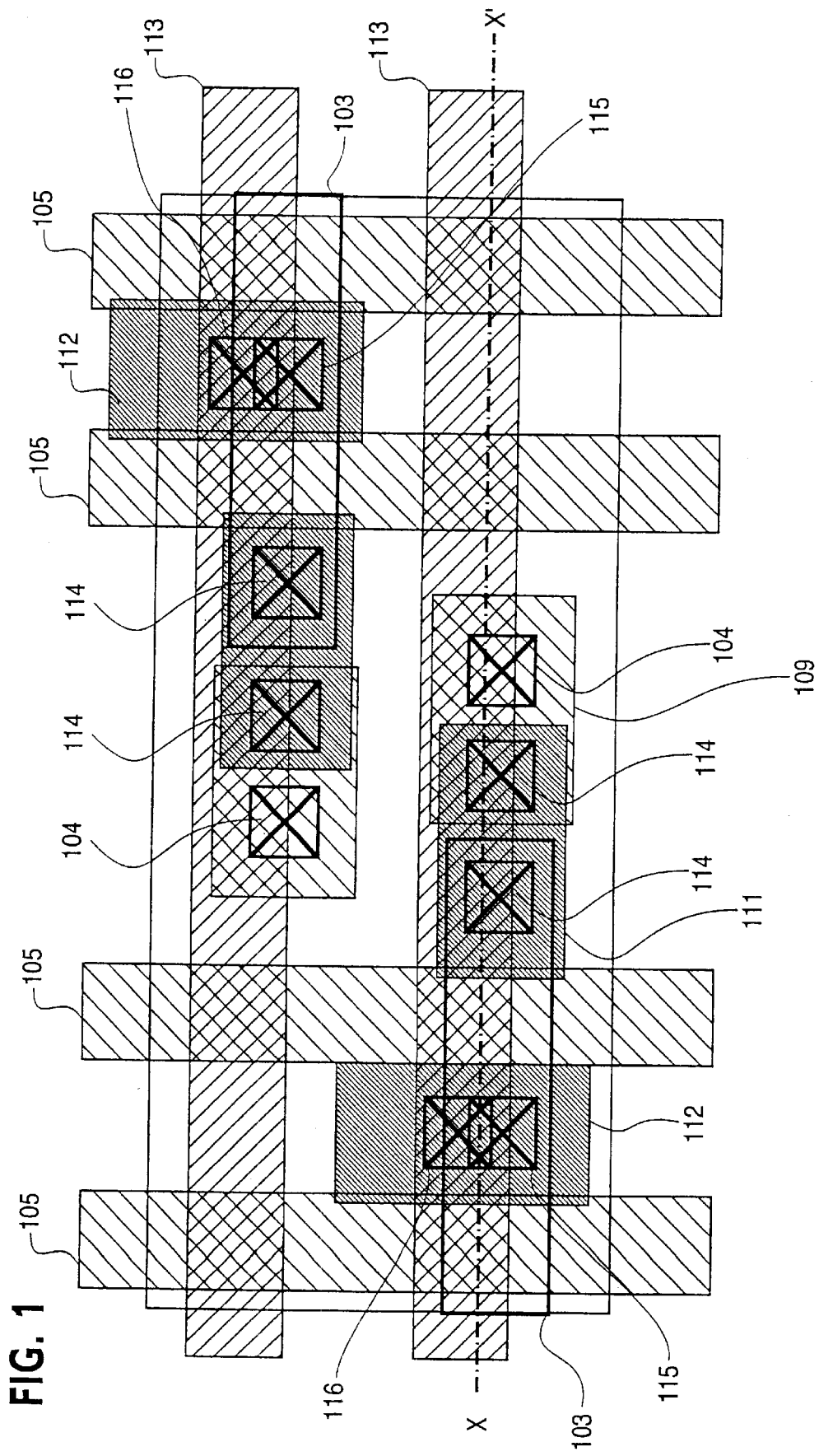
FIG. 1 is a plan view of a first embodiment of the present invention.

A first embodiment of the semiconductor memory device of the present invention is hereinafter explained. FIG. 1 is a plan view for illustrating a first embodiment of the semiconductor memory device of the present invention, whilst FIG. 2 is a cross-sectional view taken along line X–X' of FIG. 1.

Figure 2:
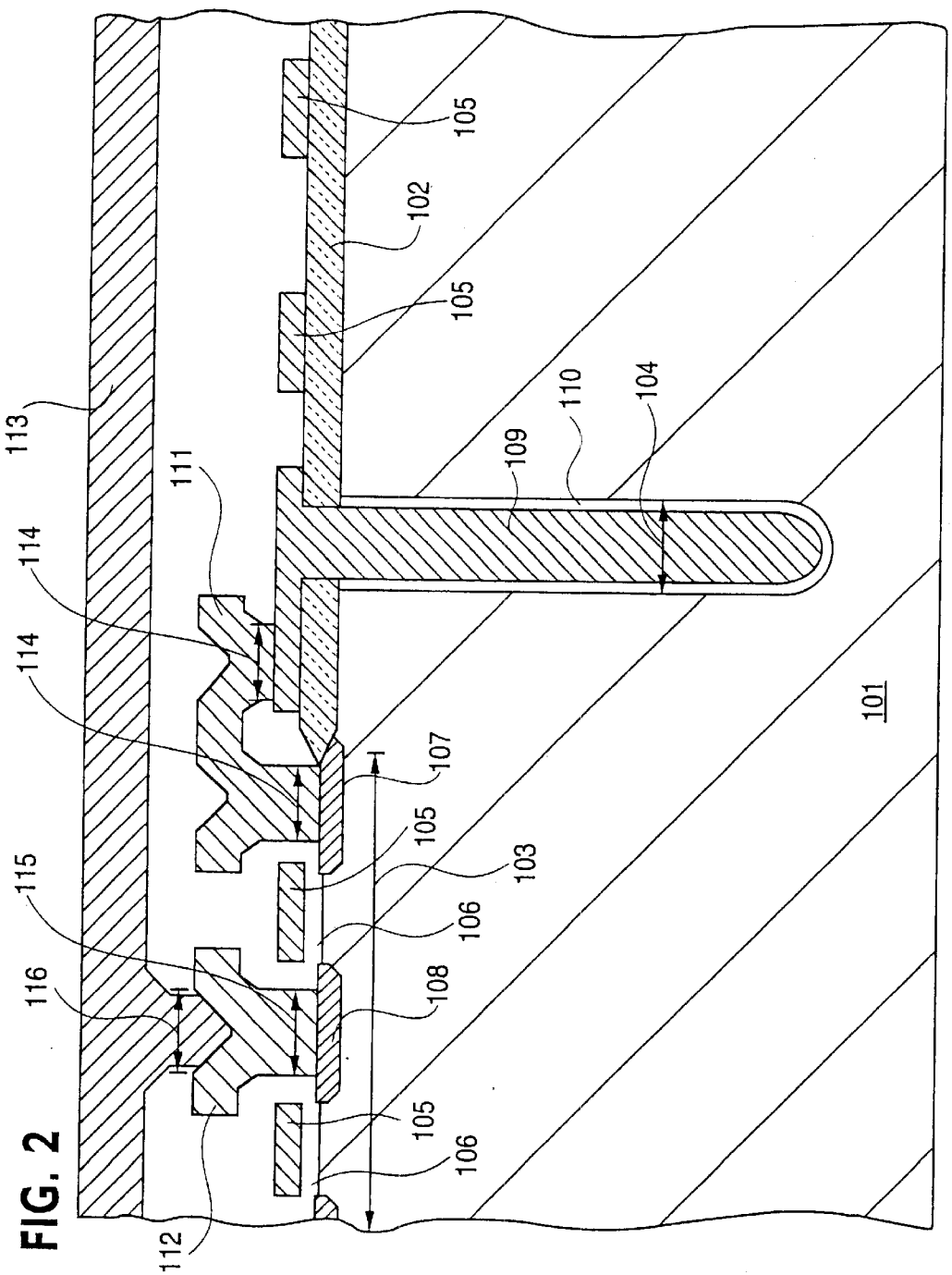
FIG. 2 is a cross-sectional view taken along line X–X' of FIG. 1.

Referring to FIGS. 1 and 2, 101 is a semiconductor substrate, 102 an isolation oxide film or a so-called selective oxide film, and 103 is an active area, that is an area of the surface of the semiconductor substrate 101 not covered by the selective oxide film 102. 104 is a trench, formed in the semiconductor substrate, the interior surface (wall surface) of which is a counterelectrode of the charge holding electrode. 105 is a gate electrode simultaneously used as a word line. Between the gate electrode 105 and the inactive area 103 is a gate oxide film 106. 107 is a capacitance forming diffusion layer, and 108 is a bit line connection diffusion layer. 109 is a charge holding electrode. Between the charge holding electrode 109 and the surface of the semiconductor substrate 101 in the inside of the trench 104 is a capacitance insulating film 110. 111 is a capacitance electrode connecting local interconnection and 11 2 is a bit line connecting local interconnection, while 113 is a bit line.

The capacitance electrode connecting local interconnection 111 interconnects the capacitance forming diffusion layer 107 and the charge holding electrode 109 by a connection hole 114, whilst the bit line connecting local interconnection 112 interconnects the bit line connection diffusion layer 108 and the bit line 113 via connection holes 115 and 116.

In the present embodiment, the gate electrode 106 and the capacitance insulating film 110 are formed by the same oxide film forming step, while the gate electrode 105 and the charge holding electrode 109 are formed by the same electrode forming step.

Similarly, the capacitance electrode connecting local interconnection 111 and the bit line connecting local interconnection 112 are formed by the same interconnection forming step.

The use of the same step in common for plural steps in the present embodiment is confirmed by the manufacturing process.

FIGS. 3 to 10 are cross-sectional views for illustrating the manufacturing process of the semiconductor memory device of the present embodiment step-by-step. Referring to FIGS. 3 to 10, the manufacturing method of the semiconductor memory device of the present embodiment is hereinafter explained.

Figure 3:
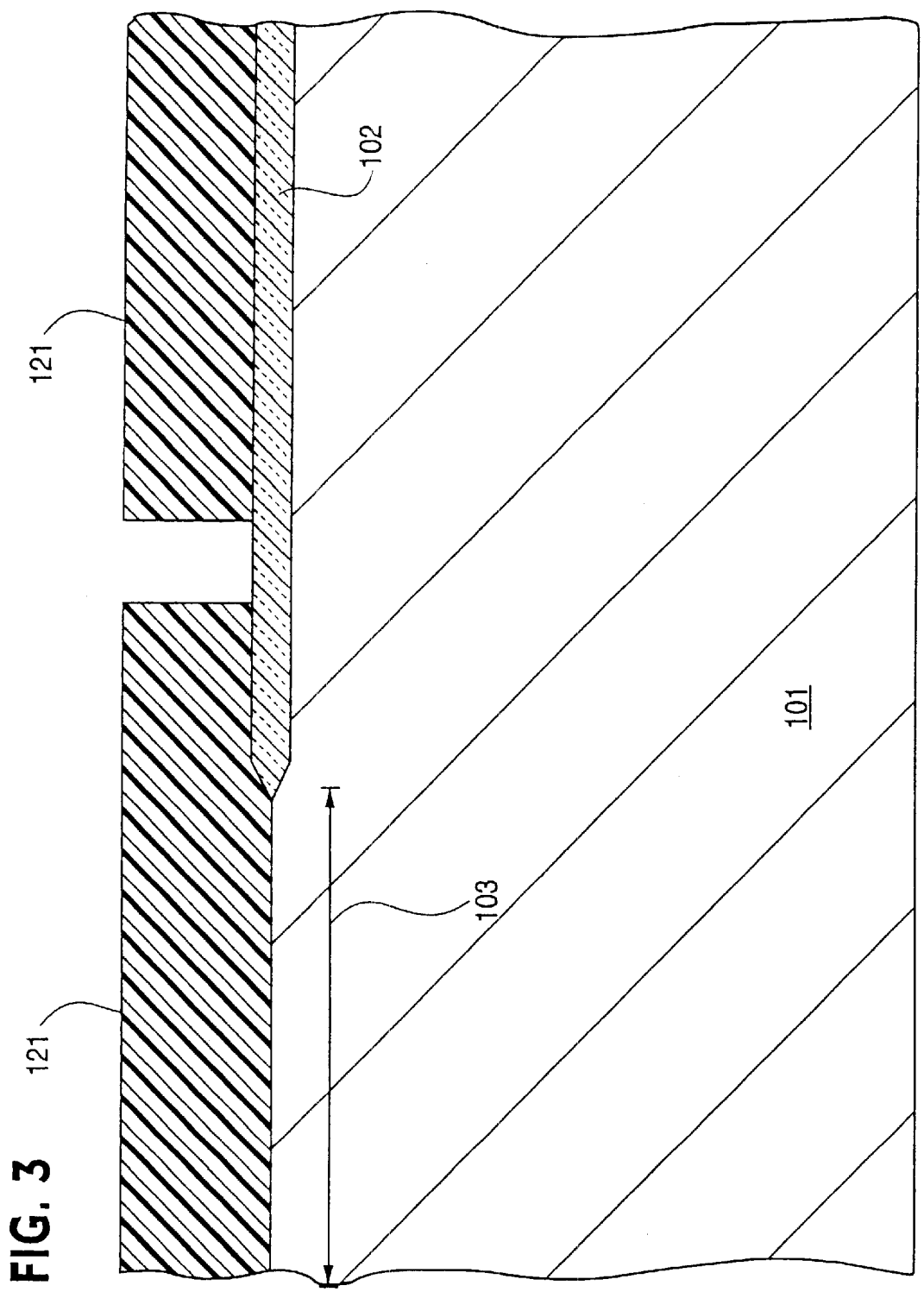
FIG. 3 is a cross-sectional view showing a process of the first embodiment of the present invention (corresponding to the cross-section taken along line X–X' of FIG. 1).
Figure 4:
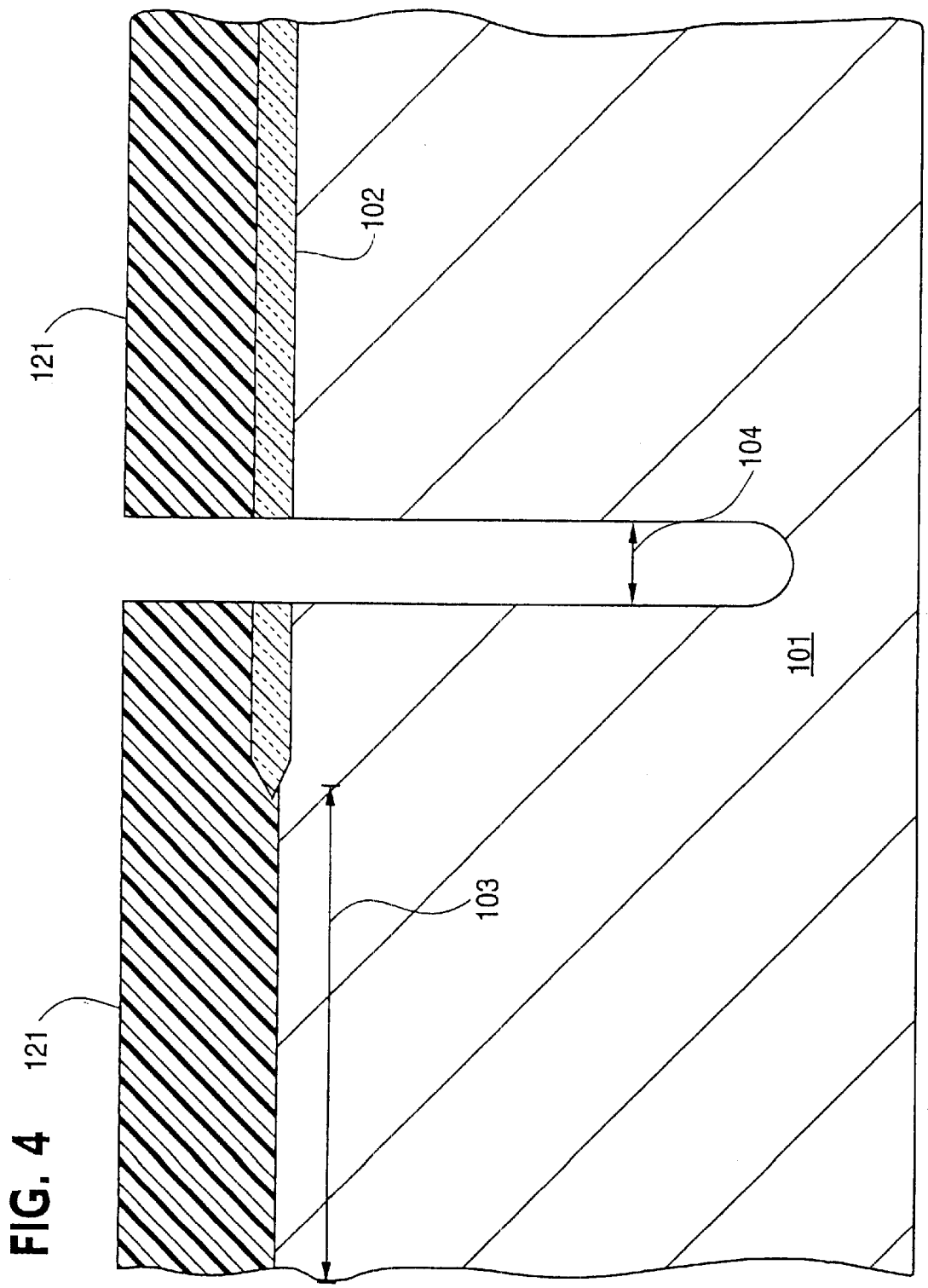
FIG. 4 is a cross-sectional view showing the process of the first embodiment of the present invention.

First, referring to FIG. 3, the isolation oxide film 102 and the active area 103 are formed on the semiconductor substrate 101, after which a photoresist 121 for lithography for forming the trench 104 is formed. Then, as shown in FIG. 4, part of the isolation oxide film 102 and part of the semiconductor substrate 101 are removed to a desired depth by anisotropic etching.

Figure 5:
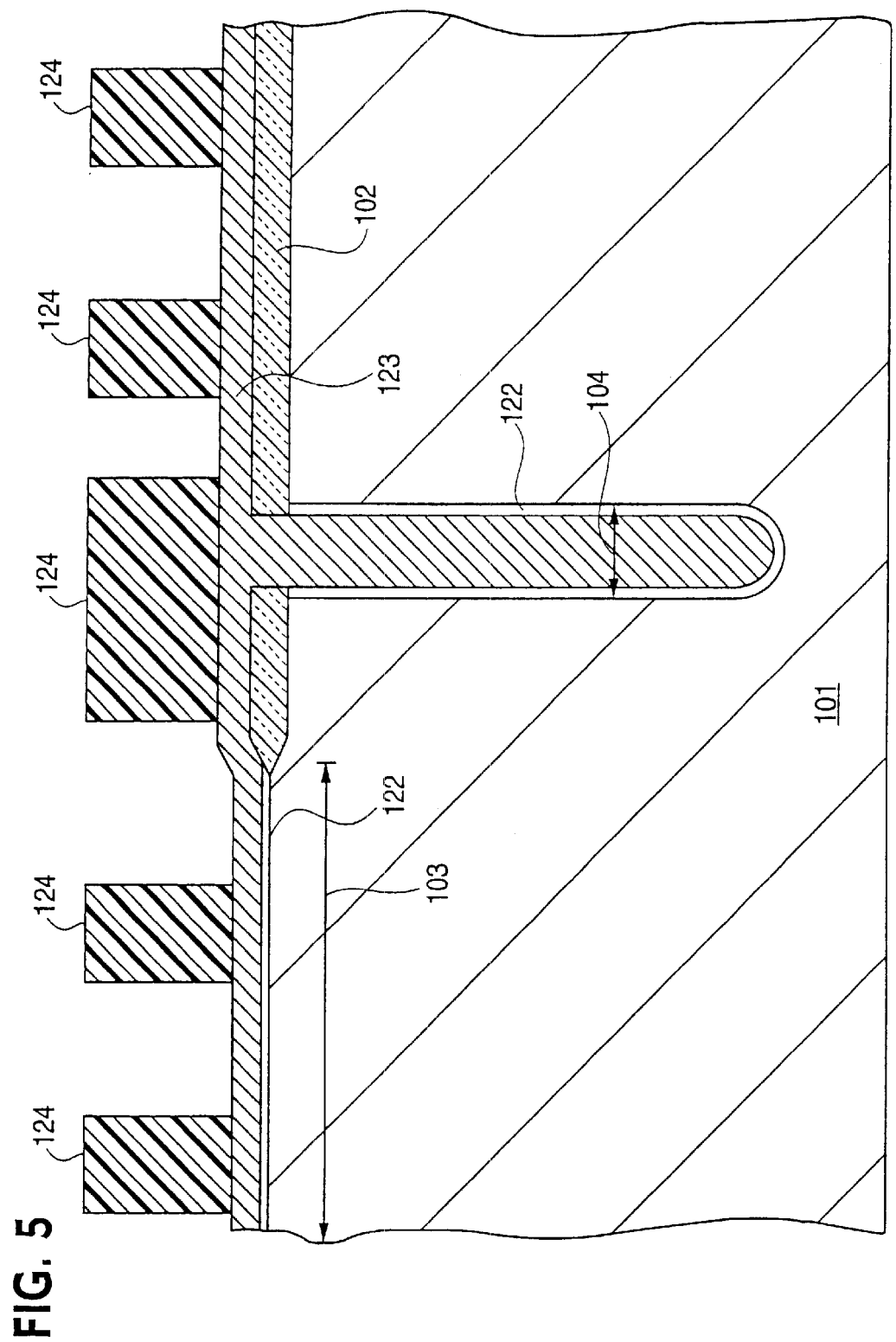
FIG. 5 is a cross-sectional view showing the process of the first embodiment of the present invention.

The photoresist 121 is then removed and, after a suitable cleaning step, a silicon oxide film 122 is formed by a thermal oxidation method or by a chemical vapor gas phase growth (deposition) method. An electrically conductive film 123 formed by a dual-layer structure of polycrystalline silicon and metal silicide is formed and, as shown in FIG. 5, a photoresist 124 having a pattern of the gate electrode 105 and the charge holding electrode 109 is formed by photolithography.

Figure 6:
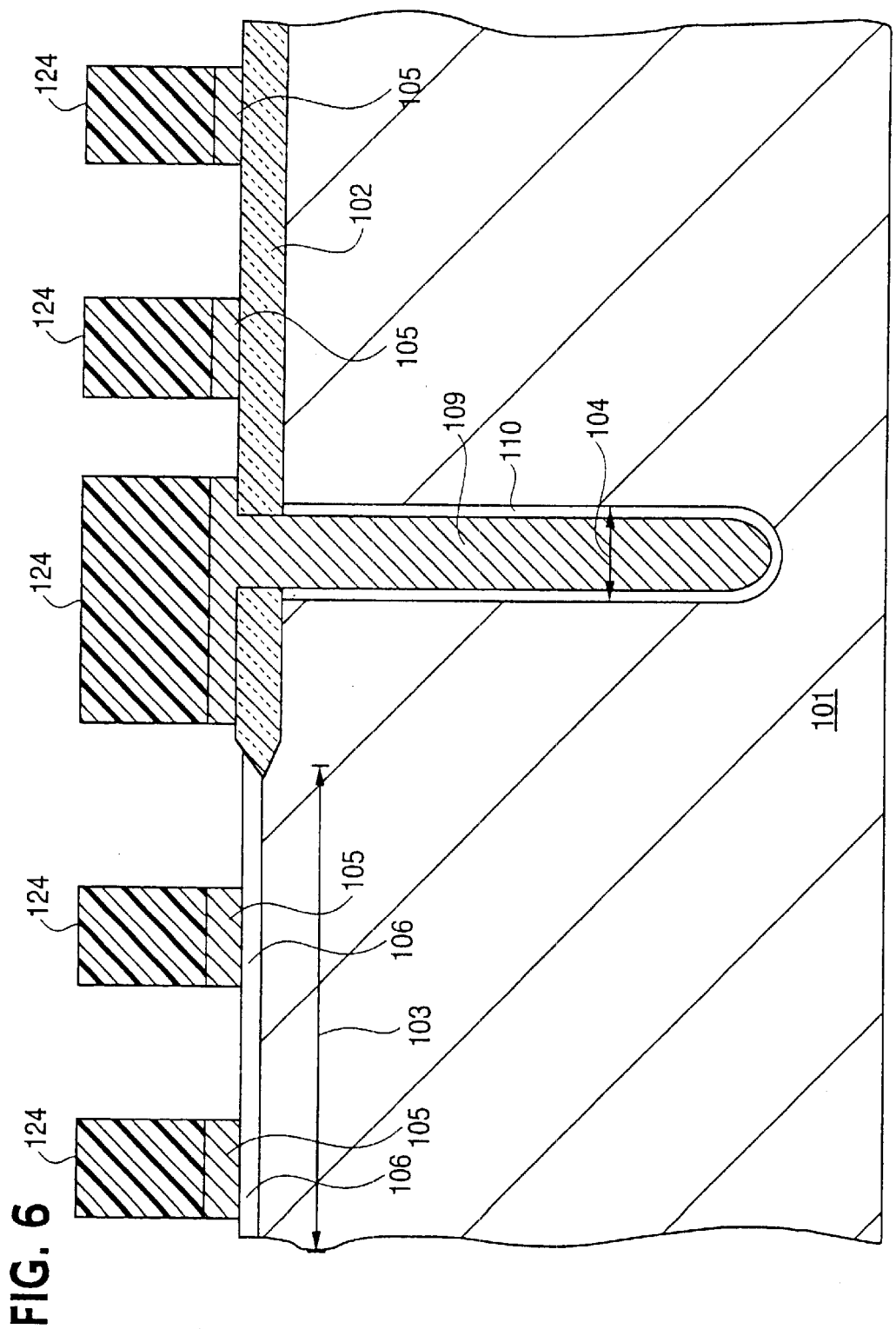
FIG. 6 is a cross-sectional view showing the process of the first embodiment of the present invention.

Then, an unneeded portion of the electrically conductive film 123 is removed by anisotropic etching to form the gate electrode 105 and the charge holding electrode 109, as shown in FIG. 6. At this time, the silicon oxide film 122 below the gate electrode 105 serves as a gate oxide film 106, while the silicon oxide film 122 beneath the charge holding electrode 109 serves as the capacitance insulating film 110.

Figure 7:
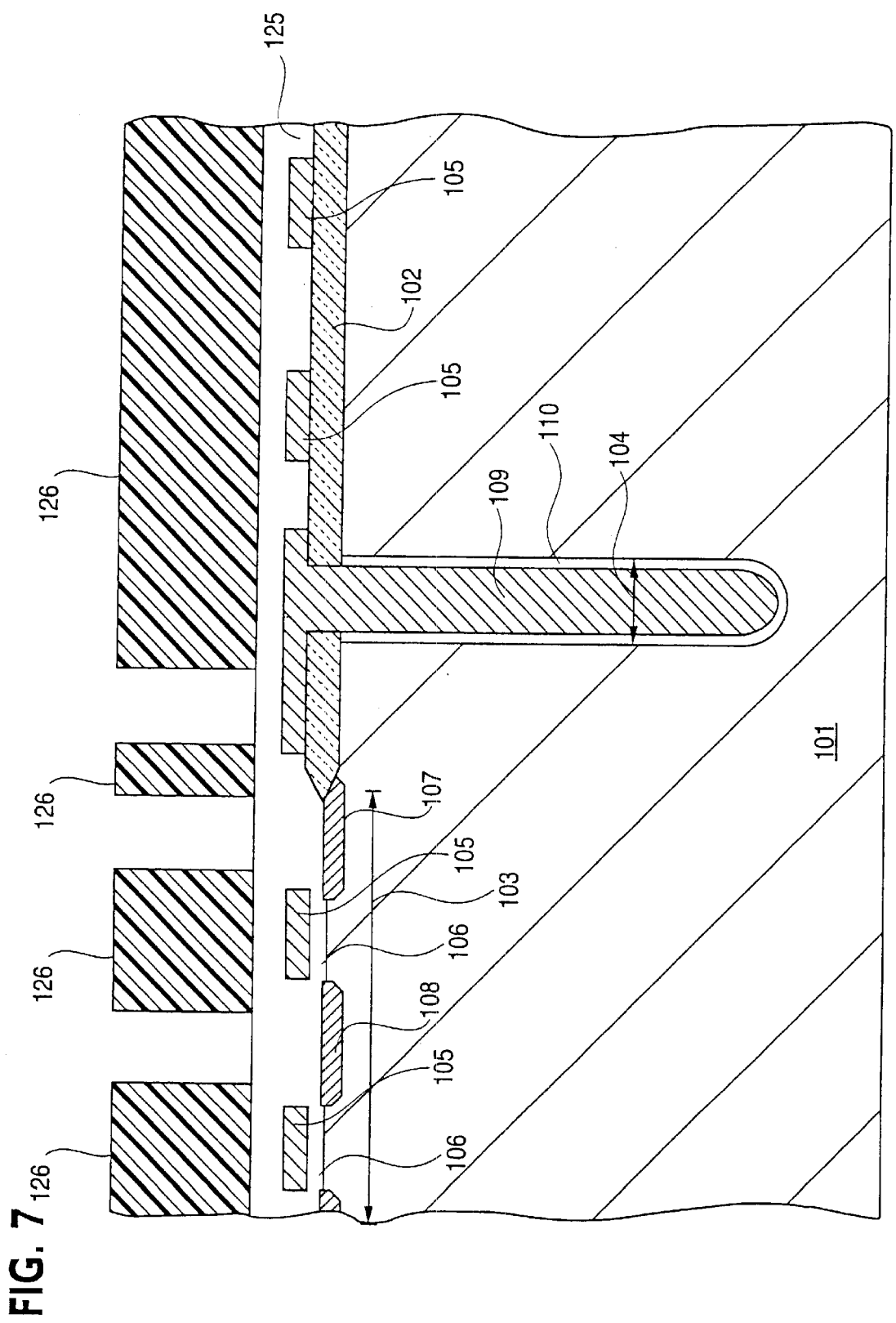
FIG. 7 is a cross-sectional view showing the process of the first embodiment of the present invention.

The photoresist 124 is then removed and, by a suitable cleaning step and an impurity introducing step by ion implantation, the capacitance forming diffusion layer 107 and the bit line connection diffusion layer 108 are formed. Then, as shown in FIG. 7, a photoresist 126 having a pattern of connection holes 114, 115 is formed by photolithography.

Figure 8:
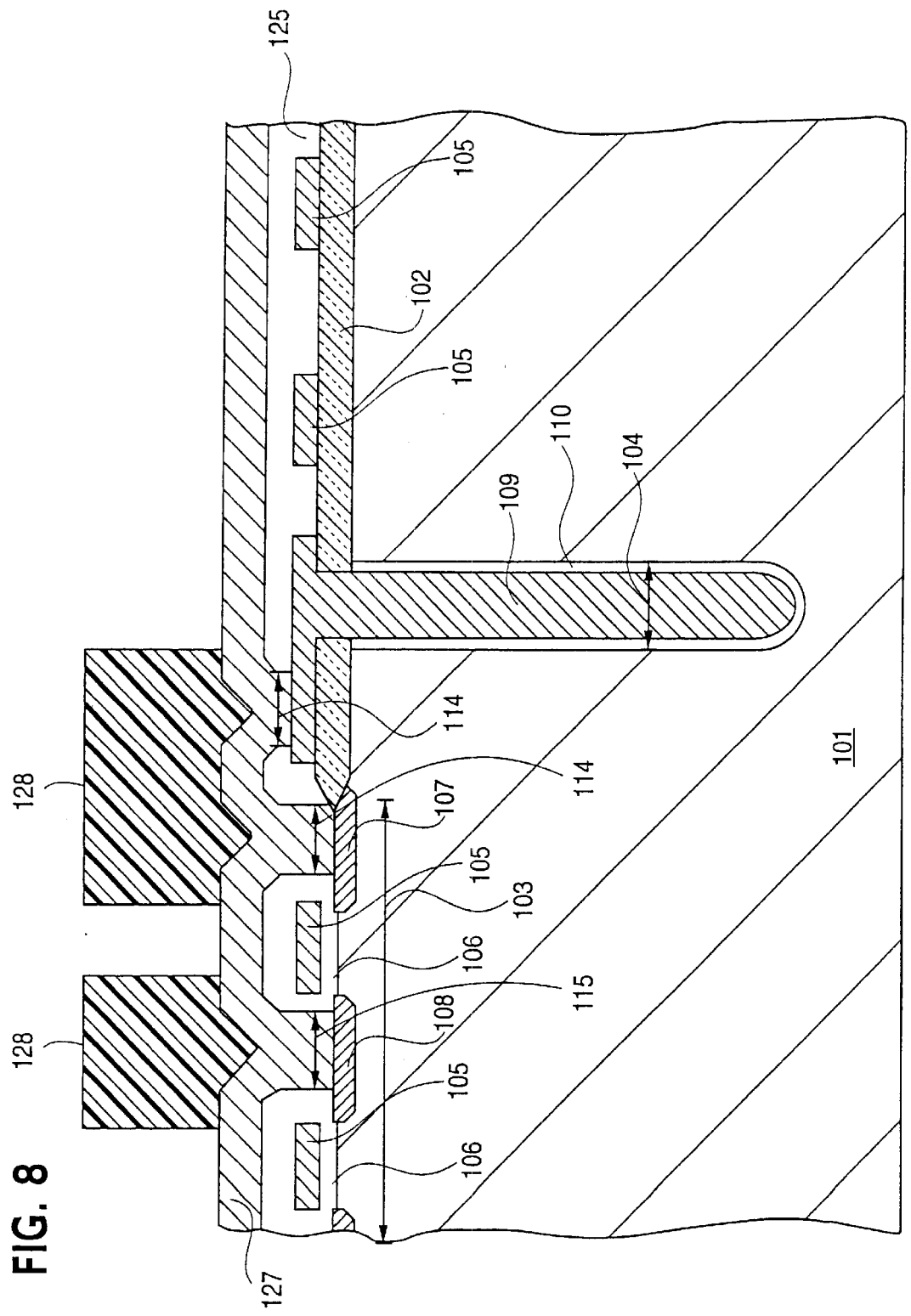
FIG. 8 is a cross-sectional view showing the process of the first embodiment of the present invention.

Then, an unneeded portion of the interlayer insulating film 125 is removed by anisotropic etching and an electrically conductive film 127 mainly formed by, e.g., aluminum is formed. A photoresist 128 having a pattern of the capacitance electrode connecting local interconnection 111 and the bit line connecting local interconnection 112 then is formed by photolithography, as shown in FIG. 8.

Figure 9:
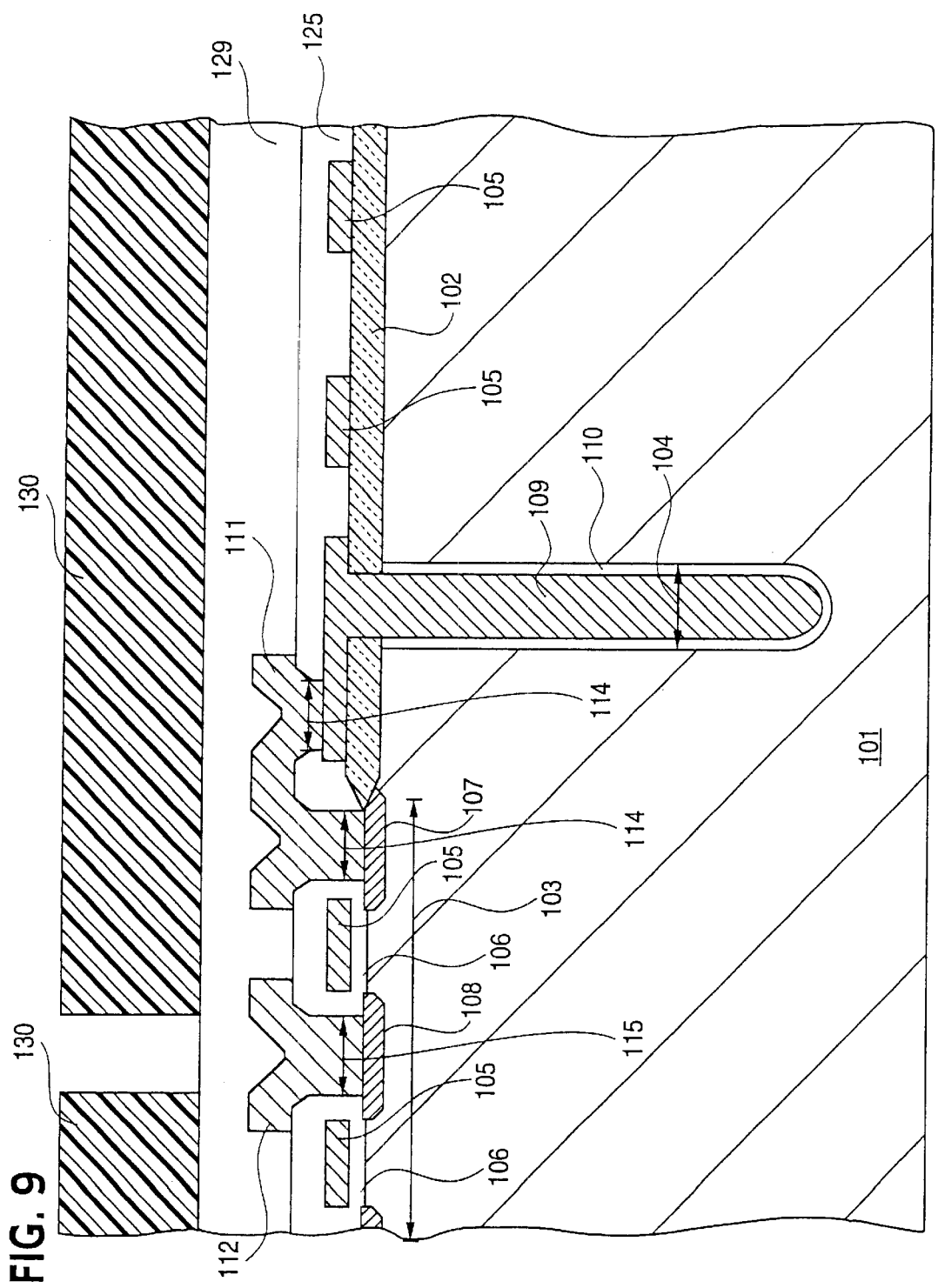
FIG. 9 is a cross-sectional view showing the process of the first embodiment of the present invention.

Then, an unneeded portion of the electrically conductive film 127 is removed by anisotropic etching or forming the capacitance electrode connecting local interconnection 111 and the bit line connecting local interconnection 112. The photoresist 127 is removed and, after a suitable cleaning step, an interlayer insulating film 129 is formed, and a photoresist 130 having the pattern of the connection hole 116 is formed by by photolithography, as shown in FIG. 9.

Figure 10:
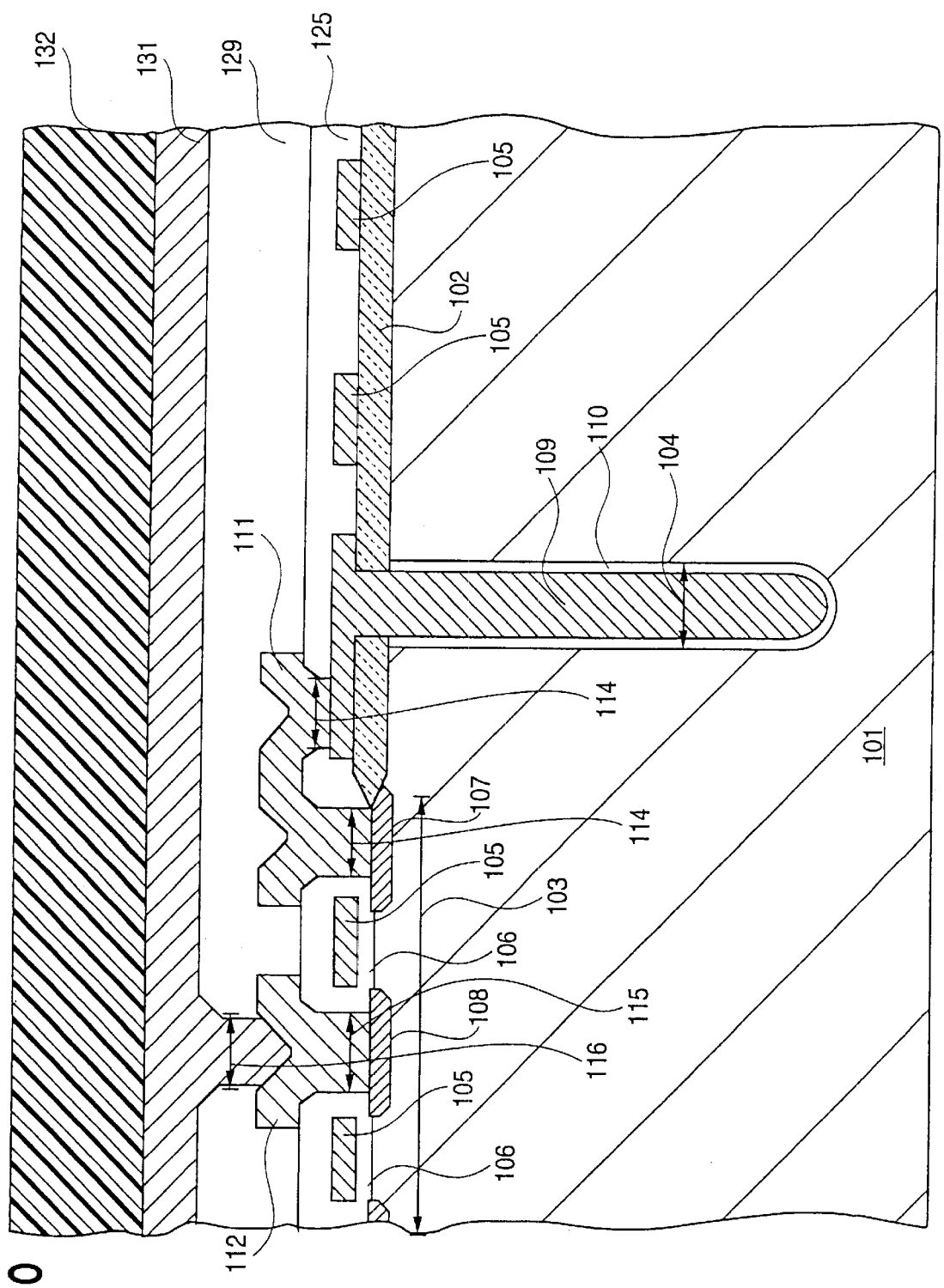
FIG. 10 is a cross-sectional view showing the process of the first embodiment of the present invention.

Then, an unneeded portion of the interlayer insulating film 129 is removed by anisotropic etching. Then, an electrically conductive film 131 formed mainly of aluminum is formed, and a photoresist 132 having the pattern of the bit line 113 is formed by photolithography, as shown in FIG. 10.

Then, an unneeded portion of the electrically conductive film 126 is removed by anisotropic etching for forming the bit line 113 for completing the structure of the memory cell shown in FIGS. 1 and 2.

In FIGS. 1 and 2, the reference numerals for the interlayer insulating film, shown in FIGS. 3 to 10, are omitted for avoiding complexity in the drawings. In the illustration of the manufacturing process from FIGS. 3 to 10, there are a variety of combinations for the process obviously required for introducing impurities or the planarizing step for the interlayer insulating film and a desired technique may be selected from known techniques. Since these techniques are not limiting the present invention, the description therefor is omitted for simplicity. Moreover, specified numerical figures of the film thicknesses of the electrically conductive films and insulating films and the dimension of the interconnection are not explained since these films or interconnections can be manufactured with the known numerical values used in the dynamic random access memory structure.

In the first embodiment of the present invention, the gate oxide film 106 and the capacitance insulating film 110 are formed by the same oxide film forming step, while the gate electrode 105 and the charge holding electrode 109 are formed, by the same electrode forming step, so that, by addition only of the step for forming the trench 104, the memory cell can be manufactured by the same number of steps as that for producing the CMOS logic device based on the ordinary mono-layer gate interconnection and the dual-layer metal interconnection. Since the memory cell area is increased only by a value corresponding to the size of the charge holding electrode 109 and the separation between the charge holding electrode 109 and the gate electrode 105, the memory cell size can be reduced to approximately twice the size of the memory cell formed by the designing dedicated solely to memory and which is determined by the pitch between the word line and the bit line.

In the memory cell of the present embodiment, since the charge holding electrode 109 is disposed on the side of the electrically conductive film, instead of on the side of the semiconductor substrate, that is the substrate 101 is used as a counterelectrode of the charge holding electrode 109, the memory ell of the present embodiment is hardly susceptible to the effect of software error as is the case with the memory cell of the stacked structure. Moreover, the junction area between the charge holding electrode 109 and the semiconductor substrate 101 can be reduced as in the case of the memory cell of the stacked structure.

In the present embodiment, two separate connection holes 114 are opened in the capacitance forming diffusion layer 107 and in the charge holding electrode 109 for interconnection. However, it is also possible for the capacitance electrode connecting local interconnection 111 to interconnect the capacitance forming diffusion layer 10 and the charge holding electrode 109 by the sole connection hole 114, as will be explained as Embodiment 2.

Embodiment 2

Figure 11:
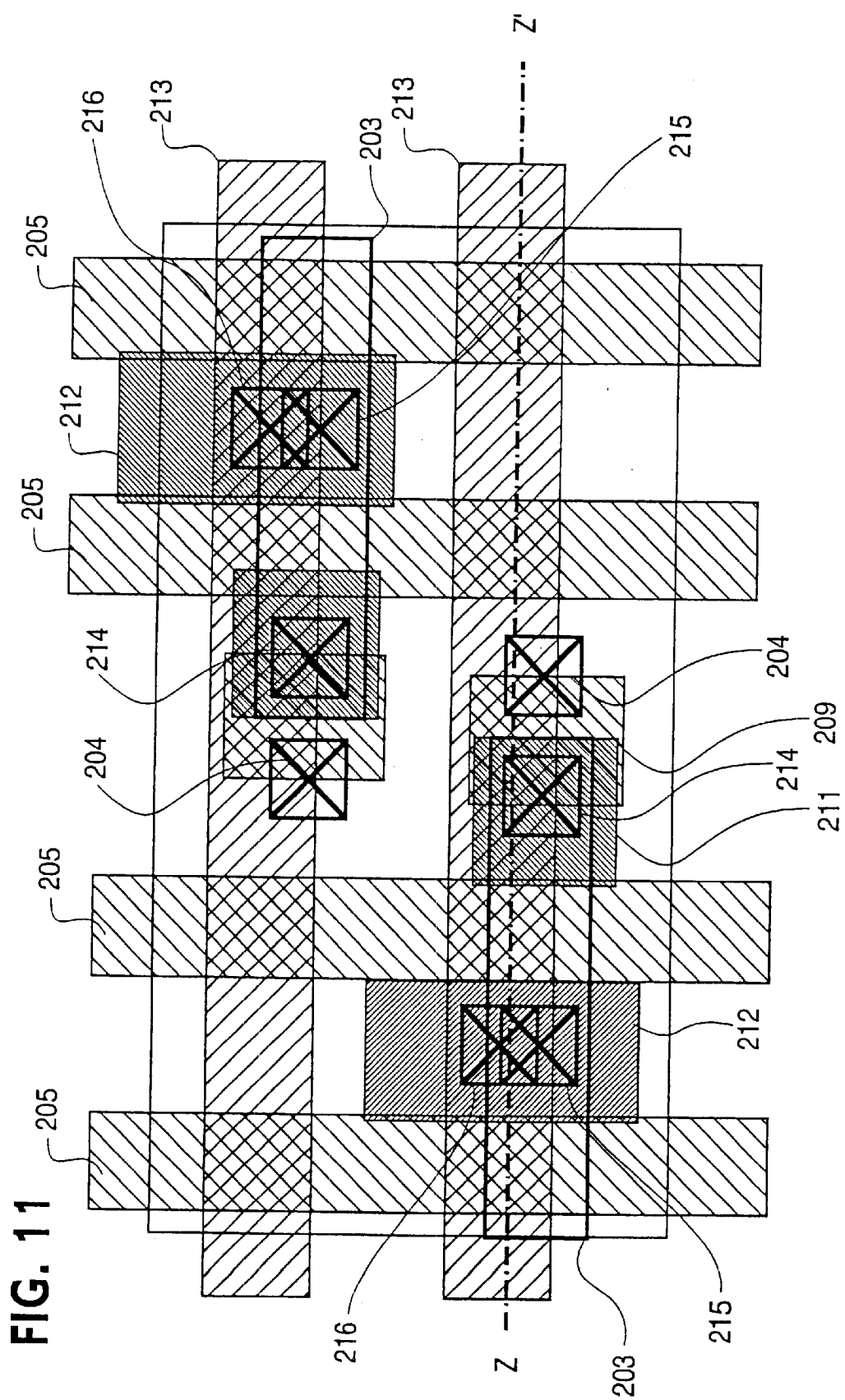
FIG. 11 is a plan view showing a second embodiment of the present invention.

A second embodiment of the present invention is hereinafter explained. FIG. 11 is a plan view showing a second embodiment of the present invention and FIG. 12 is a cross-sectional view for illustrating the second embodiment taken along line Z–Z' in FIG. 11.

Referring to FIGS. 11 and 12, 201 is a semiconductor substrate, 202 is an isolation oxide film or a so-called selective oxide film and 203 is an active area that is an area of the surface of the semiconductor substrate 201 not covered by the selective oxide film 202. 204 is a trench, the semiconductor substrate surface in the inside of which becomes(i.e., acts as) a counterelectrode of the charge holding electrode. 205 is a gate electrode operating simultaneously as a word line. Between this gate electrode 205 and the active area 203 is a gate oxide film 206. 207 is a capacitance forming diffusion layer and 208 is a bit line connection diffusion layer. 209 is a charge holding electrode. Between the charge holding electrode 209 and the surface of the semiconductor substrate 201 within the trench 204 is a capacitance insulating film 210. 211 is a capacitance electrode connecting local interconnection and 212 is a bit line connection local interconnection 212. 213 is a bit line.

The capacitance electrode connecting local interconnection 211 interconnects the capacitance forming diffusion layer 207 and the charge holding electrode 209 by a connection hole 214. The bit line connection local connection 212 interconnects the bit line connection diffusion layer 208 and the bit line 213 via connection holes 215, 216.

In the present embodiment, similarly to the previous first embodiment, the gate oxide film 206 and the capacitance insulationg film 210 are formed by the same oxide film forming step, while the gate electrode 205 and the charge holding electrode 209 are formed by the same electrode forming step.

Similarly, the capacitance electrode connecting local interconnection 211 and the bit line connection local connection 212 are formed by the same interconnection forming step.

As characteristic of the present invention, the trench 204 is not completely covered by the pattern of the charge holding electrode 209, while the trench 204 as compared to the above-described first embodiment is arranged at a position proximate to the gate electrode 205 on the isolation oxide film 202 up to approximately one-fourth of the interval between the gate electrode 205 on the isolation oxide film 202 and the capacitance holding electrode 209, such that the pattern of the charge holding electrode 209 can be designed to a size smaller than the charge holding electrode 109 of the above-described first embodiment. In this manner, the memory cell area can be made smaller by approximately 15% that of the first embodiment such that the memory cell area can be reduced to approximately 1.5 times as large as the memory cell size designed by the solely memory-dedicated design.

Figure 13:
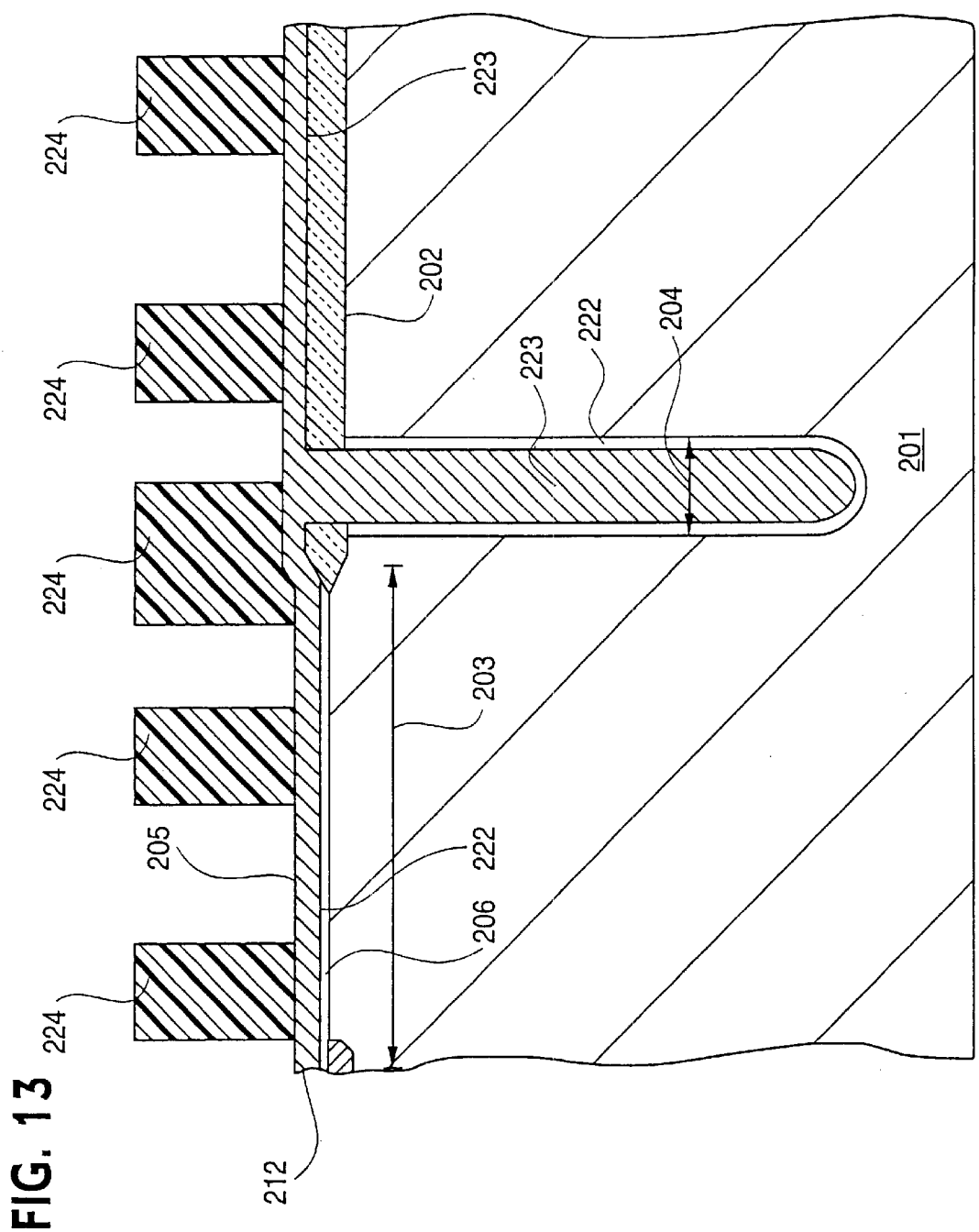
FIG. 13 is a cross-sectional view showing a process of the second embodiment of the present invention.
Figure 14:
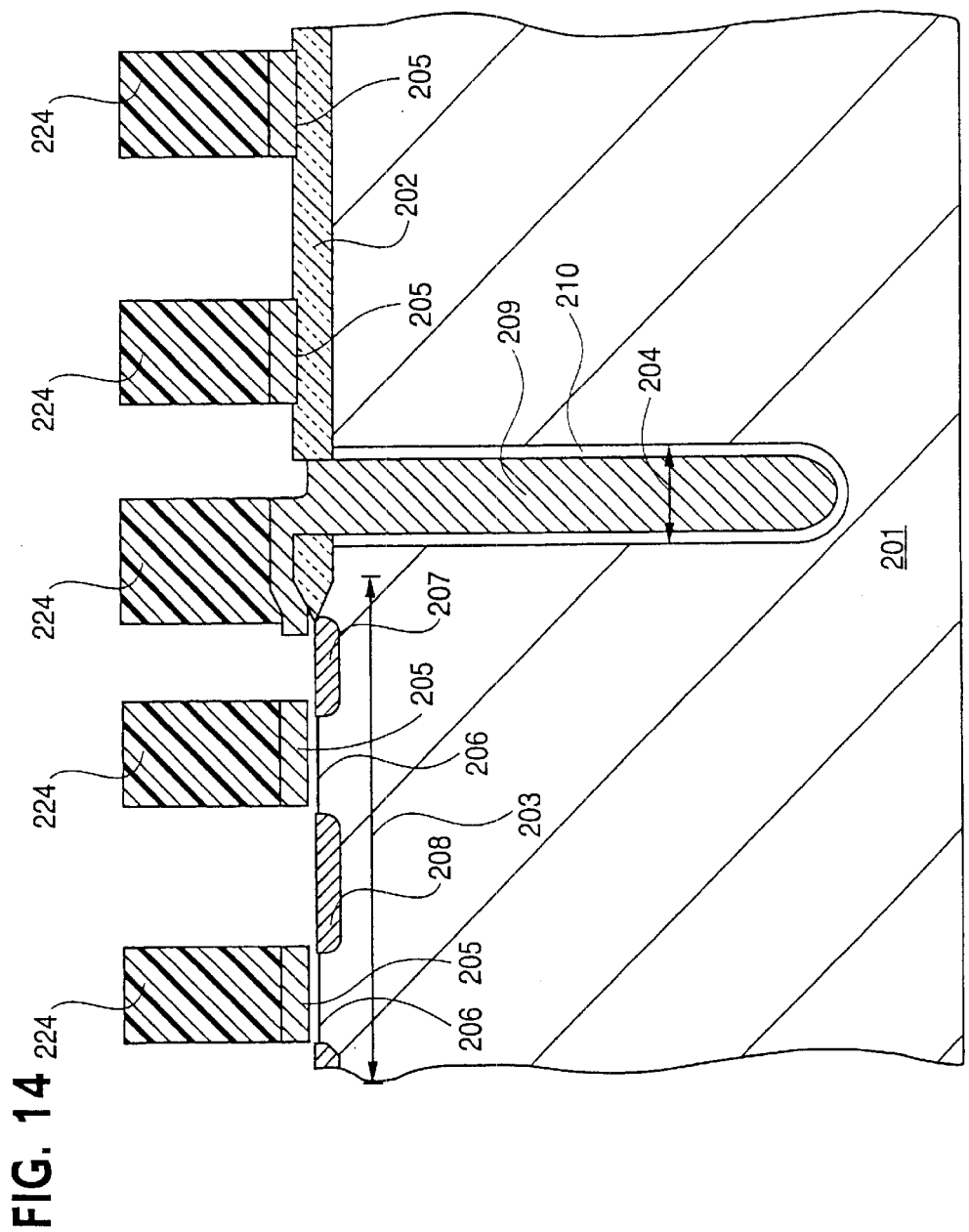
FIG. 14 is a cross-sectional view showing the process of the second embodiment of the present invention.

The manufacturing method of the present embodiment is substantially the same as that explained in the above-described first embodiment. However, as stated in connection with the characteristics of the present embodiment, there is a small difference in the forming step of the gate electrode 205 and the charge holding electrode 209 due to the small size of the charge holding electrode 209. Therefore, this step is now explained by referring to FIGS. 13 and 14, which are similar to FIGS. 5 and 6 of the above-described first embodiment.

Since the trench 204 is not completely covered by the photoresist forming a pattern of the charge holding electrode 209 and the gate electrode 205, the electrically conductive film 223 on the trench 204 is etched off, that is etched back, in an amount approximately corresponding to the thickness of the electrically conductive film 223 when forming the gate electrode 205 and the charge holding electrode 209. This represents the difference of the present embodiment from the above-described first embodiment.

Embodiment 3

Figure 15A:
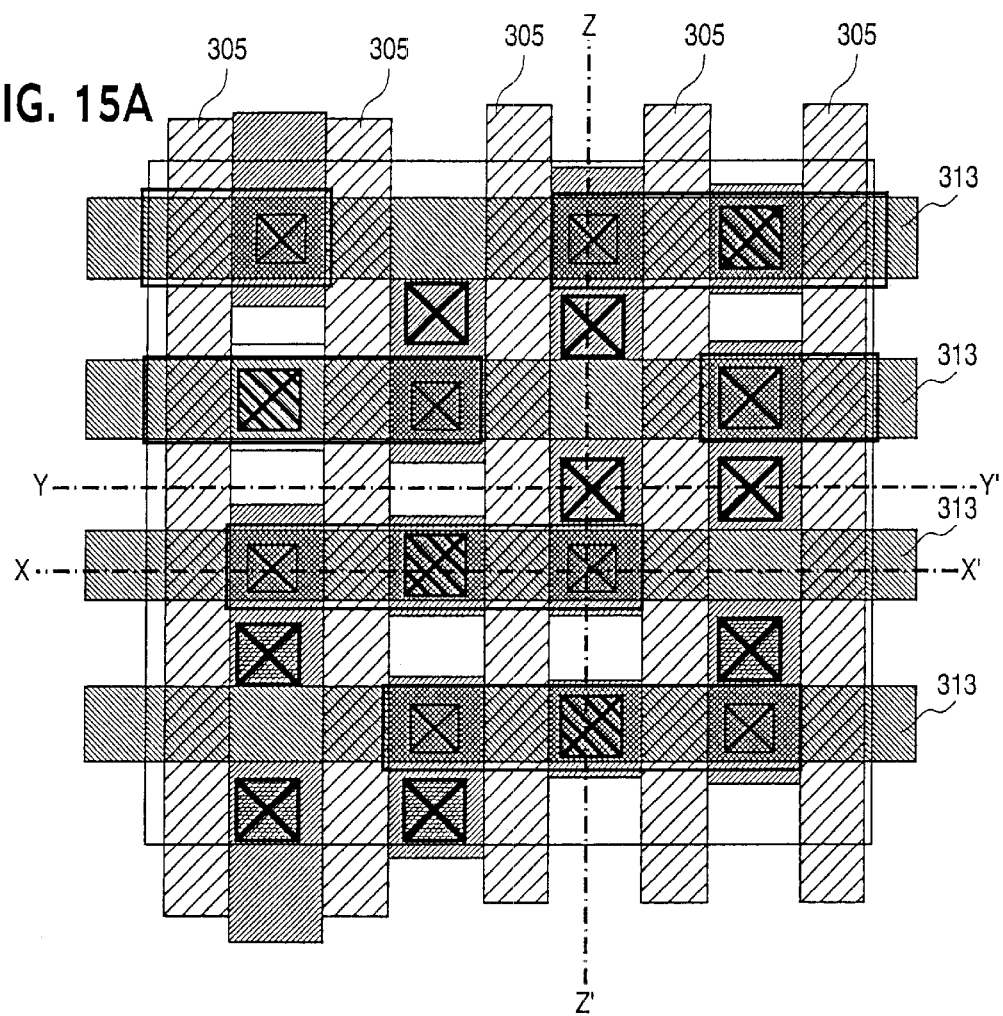
FIG. 15 is a plan view showing a third embodiment of the present invention.
Figure 15B:
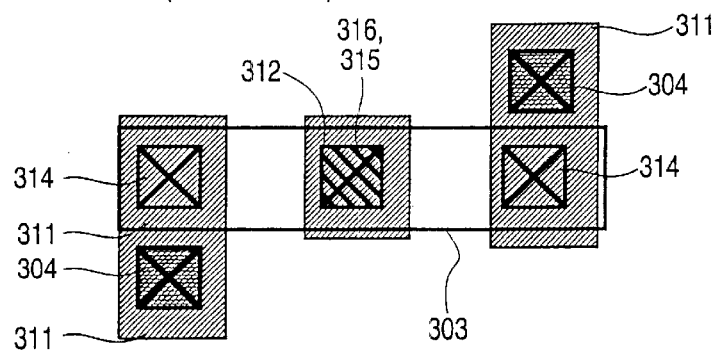
Figure 16:
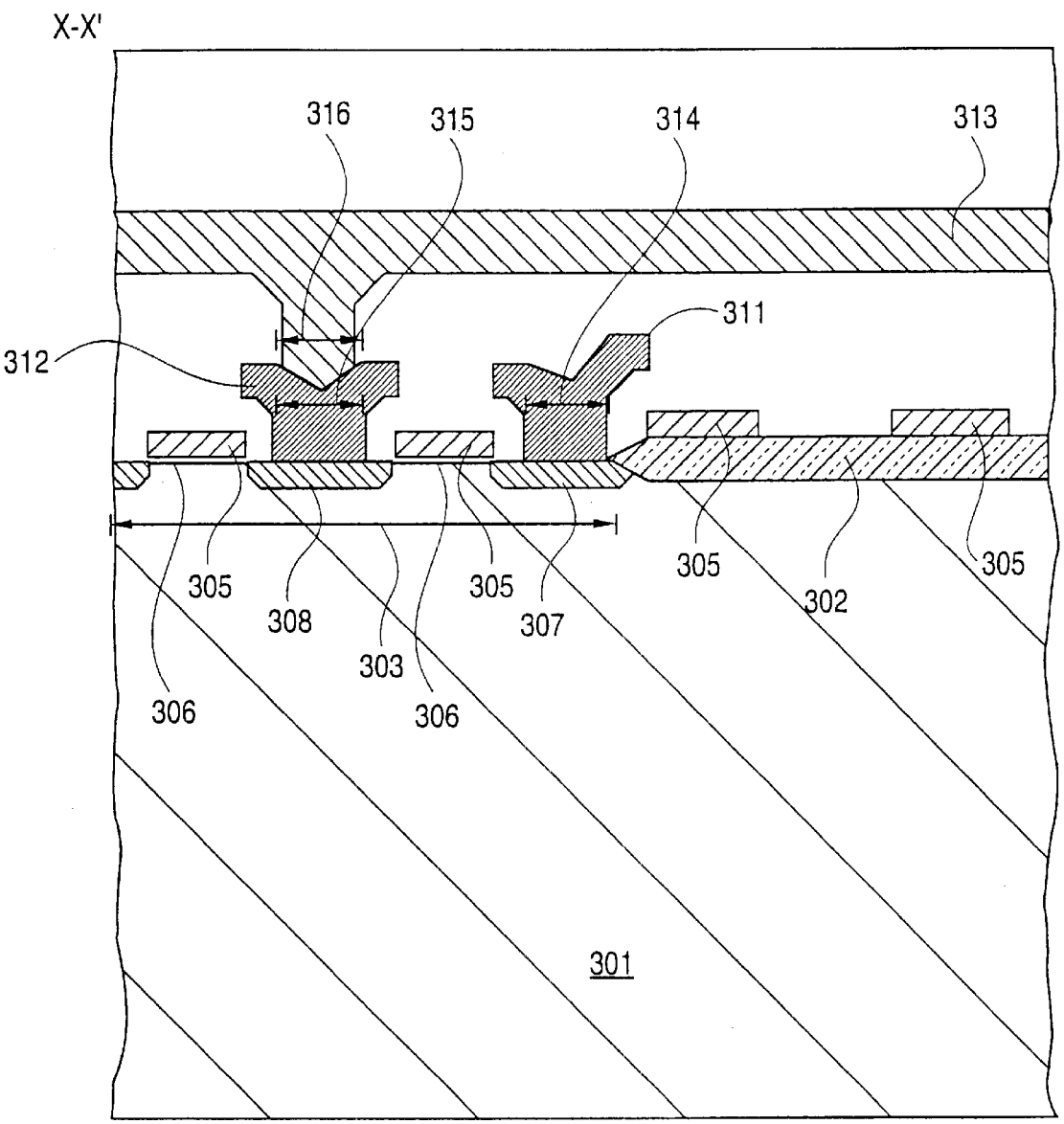
FIG. 16 is a cross-sectional view taken along line X–X' of FIG. 15.

A third embodiment of the present invention is hereinafter explained. FIG. 15 is a plan view for illustrating the third embodiment. FIG. 15B shows the correspondence between a pattern and the numerical figures other than bit lines and gate electrodes of FIG. 15A, and FIG. 16 shows the cross-section of the third embodiment of the present inovention taken along line X–X' of FIG. 15A. FIG. 17 shows a cross-section of a third embodiment of the present invention taken along line Y–Y' of FIG. 15A. FIG. 18 is a cross-sectional view, taken along line Z–Z' of FIG. 15A.

Referring to FIGS. 15 to 18, 301 is a semiconductor substrate, 302 is an isolation oxide film or a so-called selective oxide film and 303 is an active area that is an area of the surface of the semiconductor substrate 201 not covered by the selective oxide film 302. 304 is a trench, the semiconductor substrate surface in the inside of which acts as a counterelectrode of the charge holding electrode. 305 is a gate electrode operating simultaneously as a word line. Between this gate electrode 305 and the active area 303 is a gate oxide film 306. 307 is a capacitance forming diffusion layer and 308 is a bit line connection diffusion layer. 309 is a charge holding electrode. Between the charge holding electrode 309 and the surface of the semiconductor substrate 301 within the trench 304 is a capacitance insulating film 310. 311 is a capacitance electrode connecting local interconnection and 312 is a bit line connection local interconnection 312. 313 is a bit line.

The capacitance electrode connecting local interconnection 311 interconnects the capacitance forming diffusion layer 307 and the charge holding electrode 309 by a connection hole 314. The bit line connecting local interconnection 312 interconnects the bit line connection diffusion layer 308 and the bit line 313 via connection holes 315, 316.

In the present embodiment, similarly to the previous first and second embodiments, the gate oxide film 306 and the capacitance insulating film 310 are formed by the same oxide film forming step, while the gate electrode 305 and the charge holding electrode 309 are interconnected by the same electrode forming step.

Similarly, the capacitance electrode connecting local interconnection 311 and the bit line connecting local interconnection 312 are formed by the same interconnection forming step.

The features of the present embodiment, that is the points of difference thereof from the above-described first and second embodiments, are hereinafter explained.

(1) The first point of difference is as follows; In the above-described first and second embodiments, the active areas 103, 203 of the gate electrode (word line) of the memory cell transistor neighboring in the channel width direction (i.e., wordline direction) to each other are offset by two neighboring gate electrodes (word lines), whereas, in the present embodiment, the active areas 303 neighboring in the word line direction are offset by one gate electrode (word line) 305.

(2) The second point of difference is that, in the above-described first and second embodiments,the trenches 104, 204 are arranged along the long sides of the active areas 103, 203, that is along the direction X–X' of FIGS. 1 and 11, whereas, in the present embodiment, the trench 304 is arrayed in a direction offset by 90° from the long side direction of the active area 303, that is in a direction Z–Z' in FIG. 15.

This arrangement is rendered possible by the manner of arrangement of the active area 303 which is the first characteristics of the present embodiment (see (1) above). That is, by arranging the active areas 303 neighboring to each other in the word line direction to be displaced each other by one gate electrode (word line) 305, the area of the isolation oxide film 302 between the throughout-extending word lines is arranged next to the Z–Z' direction array of the capacitance forming diffusion layer 307 of the active area 303. Therefore, the trench 304 can be arranged in an area of the isolation oxide film 302 between the throughout-extending word lines in a direction offset 90° from the long side (longitudinal) direction of the active area 303, that is in the direction Z–Z' of FIG. 15.

(3) The third point of difference is that there is no lithographic pattern of the charge holding electrode 309 and the trench 304 is arranged at both side gate electrodes 305 at a separation of approximately one-fourth the minimum separation of the gate electrode 305 such that the separation between the gate electrodes can be designed to be smaller than the case of the above-described first and second embodiments. In the present embodiment, the memory cell area can be reduced by approximately 35% and 25% as compared to that in the first embodiment and to that in the second embodiment, respectively, while it can be reduced up to approximately 1.1 times the memory cell size of the solely memory-dedicated design.

The manufacturing method of the present embodiment is substantially equal to that explained in the first or second embodiment. However, due to the absence of the lithographic pattern of the charge holding electrode 309, in accordance with the characteristics of the present embodiment, there results a slight difference in the gate electrode 305, charge holding electrode 309, capacitance electrode connecting local interconnection 311 and in the bit line connecting local interconnection 312. This difference is hereinafter explained by referring to FIGS. 19 to 36. This step corresponds to FIGS. 5 and 6 and to FIGS. 13 and 14 for the first and second embodiments, respectively.

FIGS. 19, 22, 25, 29 and 33 are cross-sectional views of the process taken along line X–X' of FIG. 15, while FIGS. 20, 23, 26, 30 and 34 are cross-sectional views of the process taken along line Y–Y' of FIG. 15 and FIGS. 21, 24, 27, 31 and 35 are cross-sectional views of the process taken along line Z–Z' of FIG. 15.

Figure 28:
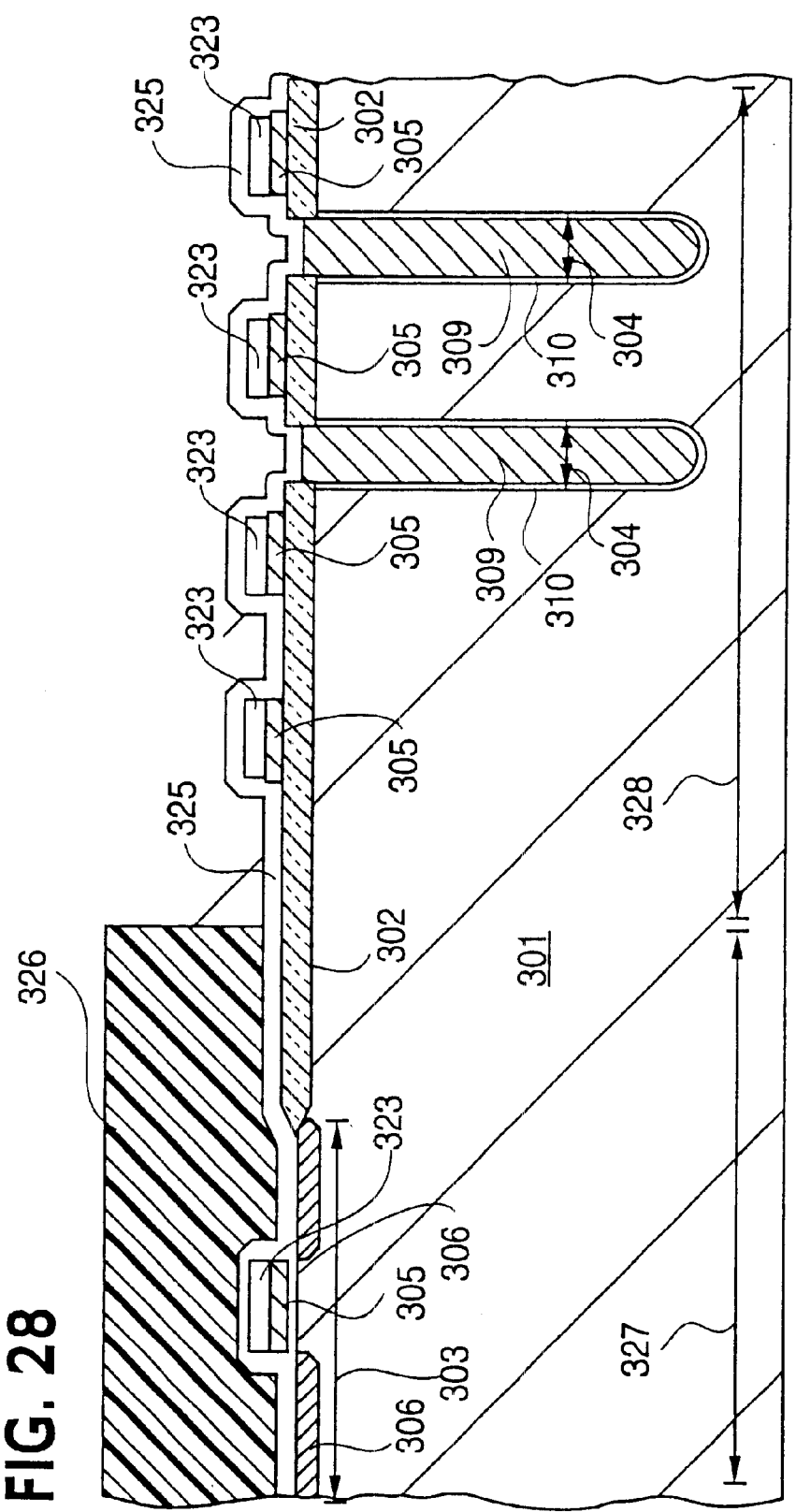
FIG. 28 is a cross-sectional view of the process of the boundary area between the memory cell array area and the peripheral logic circuit other than the memory cell array of the third embodiment of the present invention.
Figure 29:
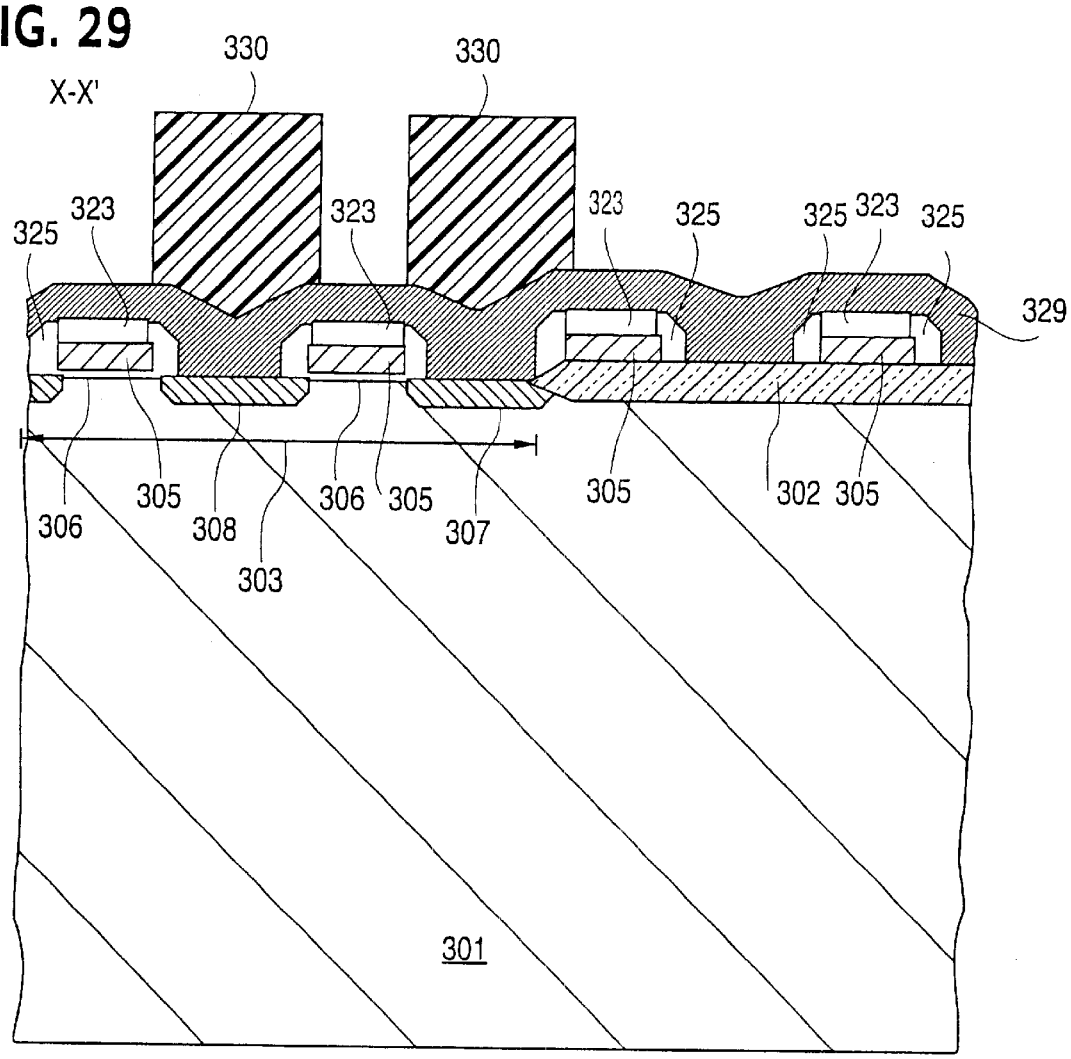
FIG. 29 is a cross-sectional view showing the process of the third embodiment of the present invention (corresponding to the cross-section taken along line Y–Y' of FIG. 15).
Figure 30:
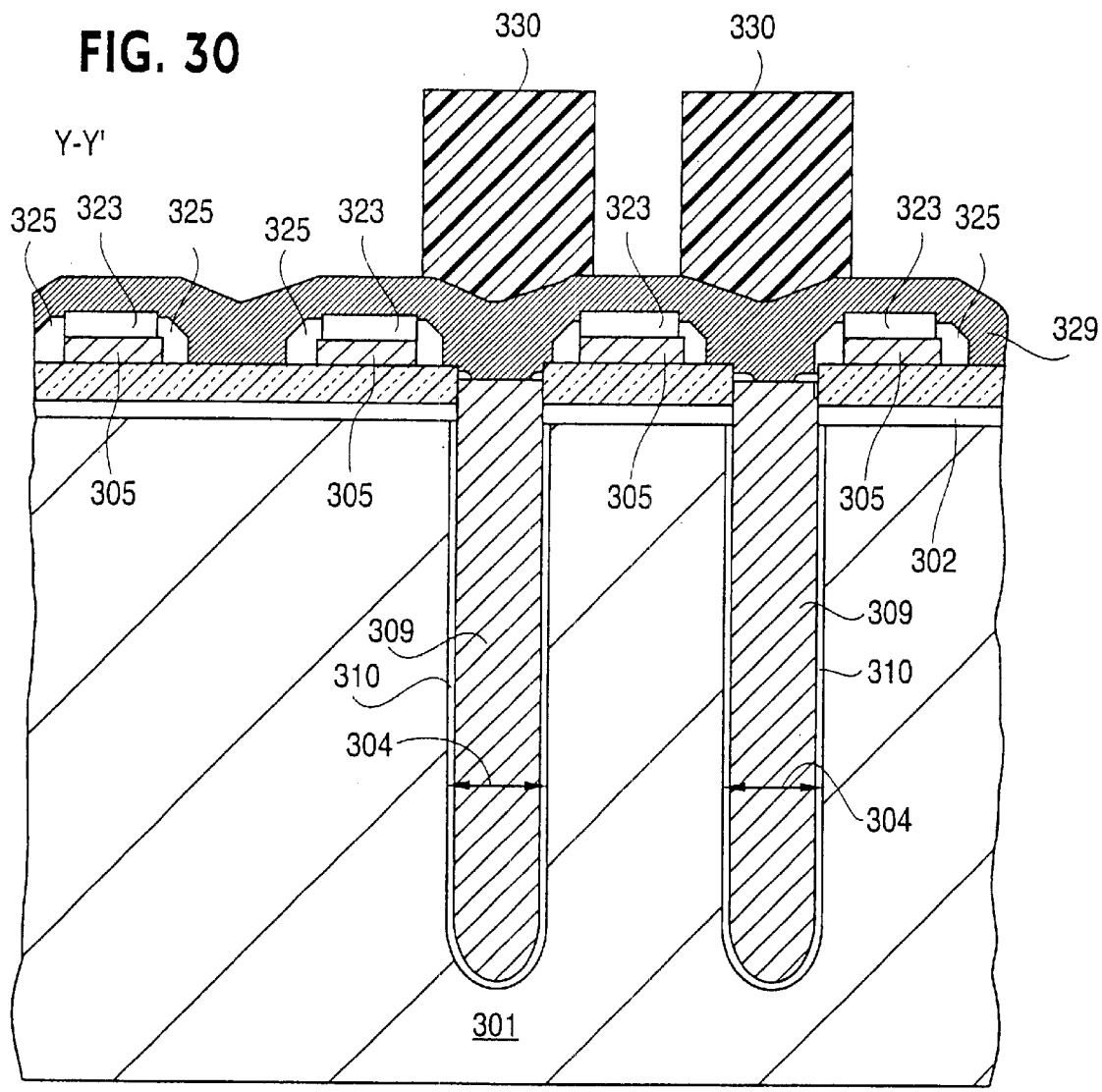
FIG. 30 is a cross-sectional view showing the process of the third embodiment of the present invention (corresponding to the cross-section taken along line Z–Z' of FIG. 15).
Figure 31:
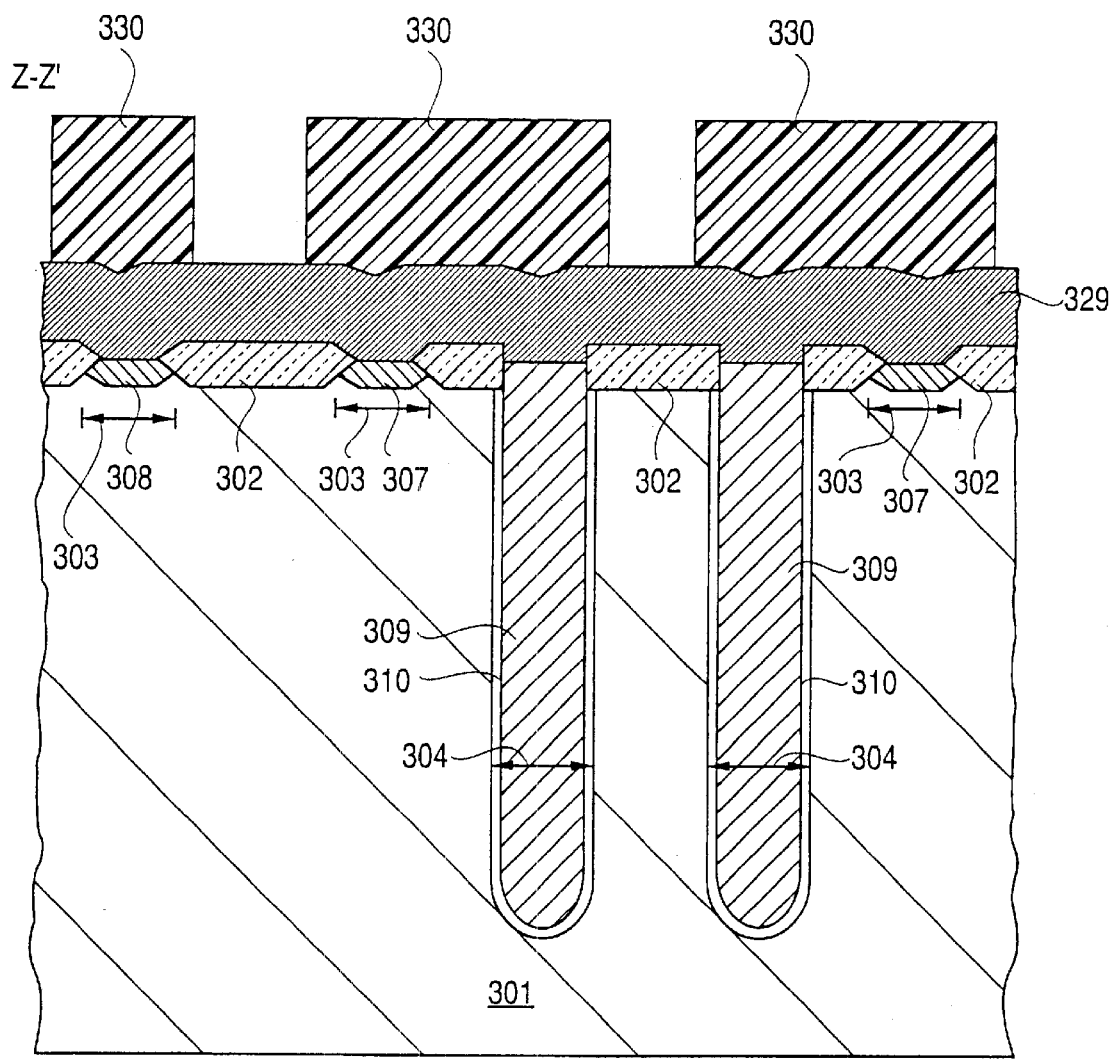
FIG. 31 is a cross-sectional view showing the process of the third embodiment of the present invention (corresponding to the cross-section taken along line X–X' of FIG. 15).
Figure 32:
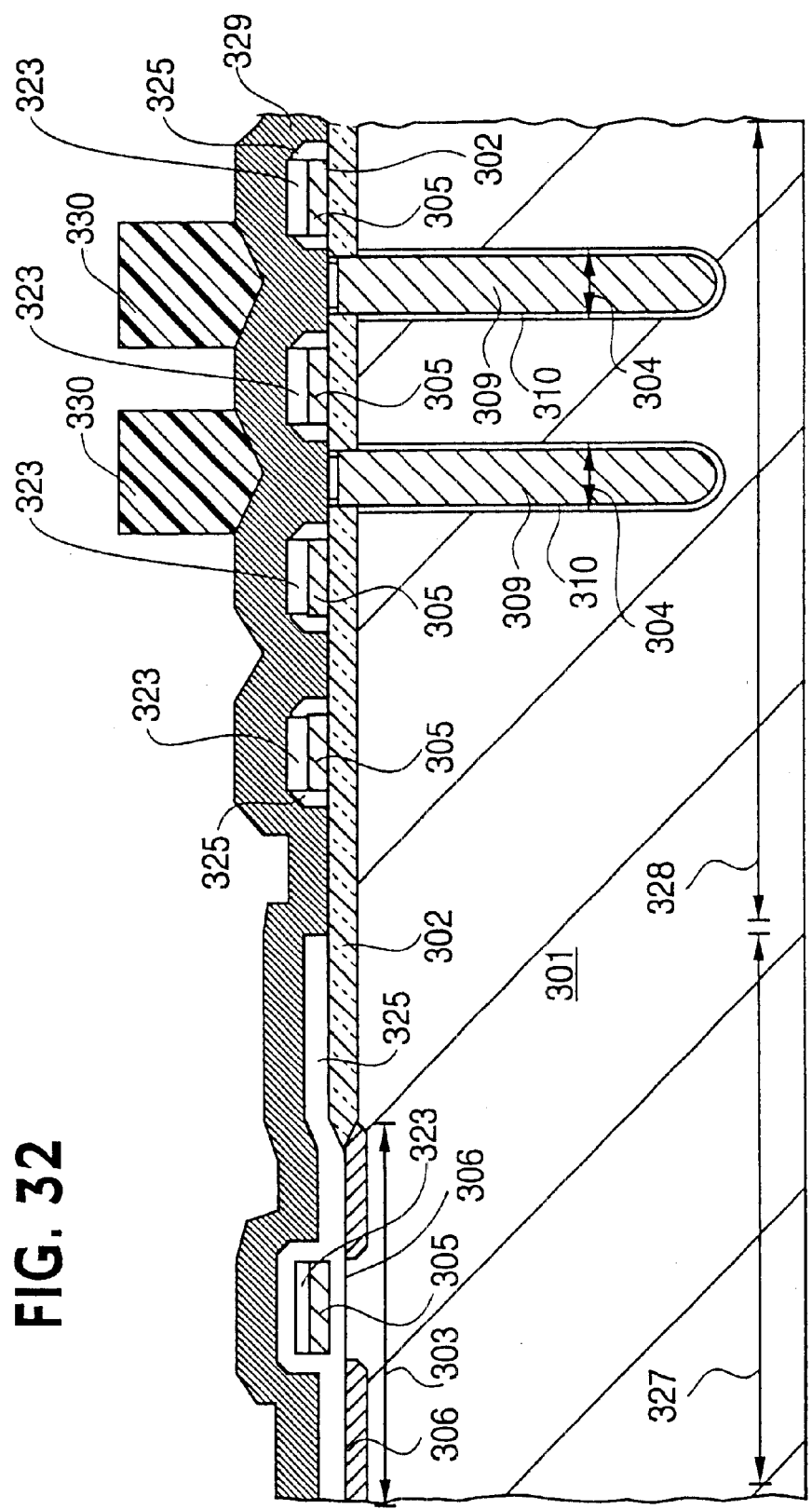
FIG. 32 is a cross-sectional view of the process of the boundary area between the memory cell array area and the peripheral logic circuit other than the memory cell array of the third embodiment of the present invention.
Figure 33:
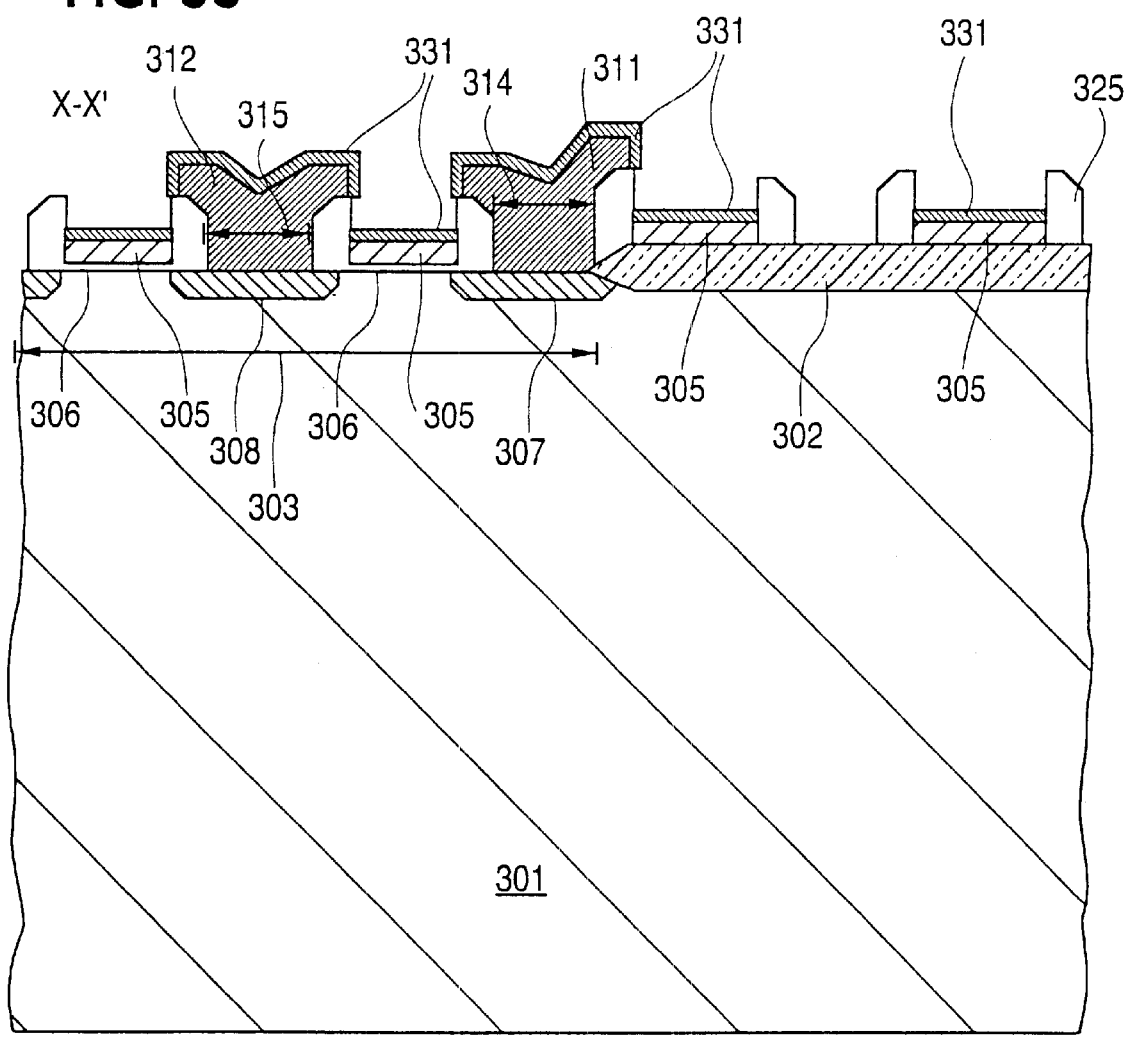
FIG. 33 is a cross-sectional view showing the process of the third embodiment of the present invention (corresponding to the cross-section taken along line X–X' of FIG. 15).
Figure 34:
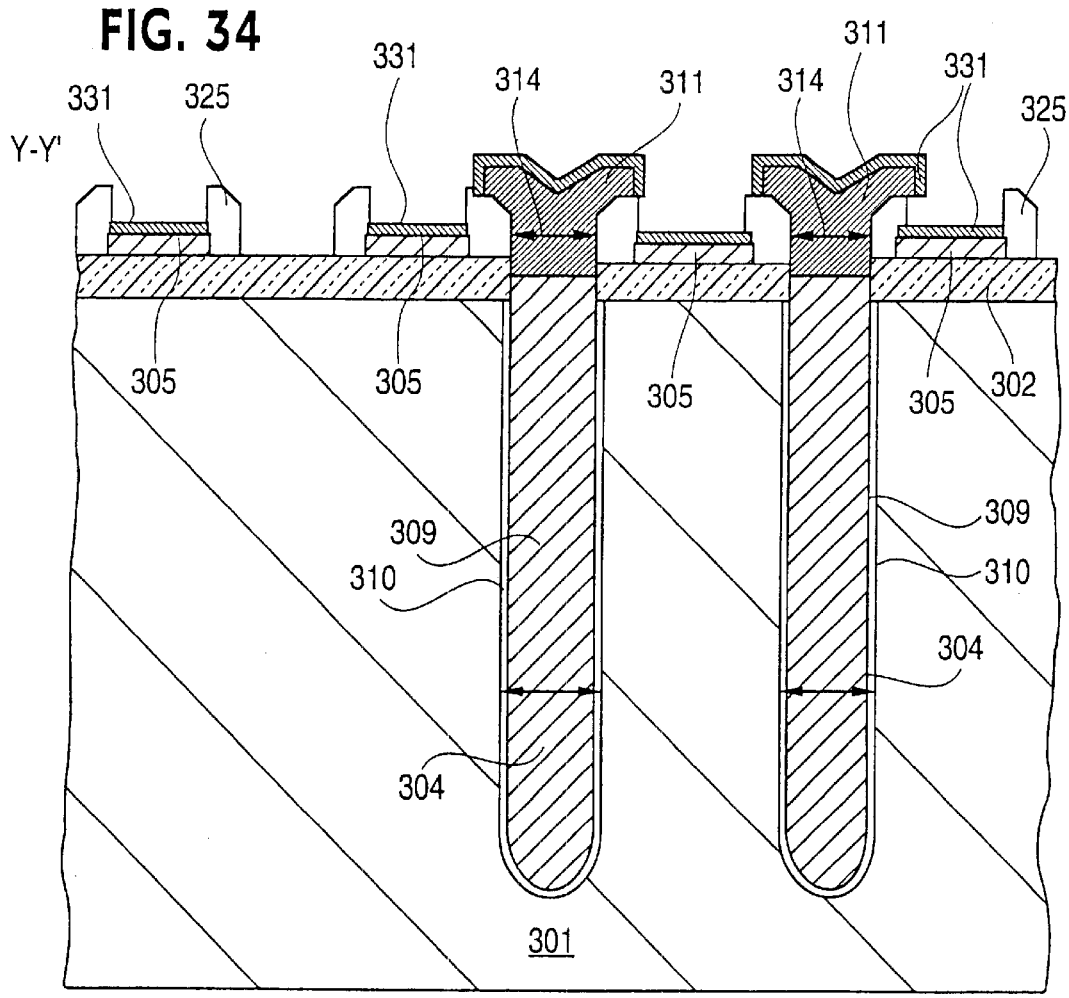
FIG. 34 is a cross-sectional view showing the process of the third embodiment of the present invention (corresponding to the cross-section taken along line Y–Y' of FIG. 15).
Figure 35:
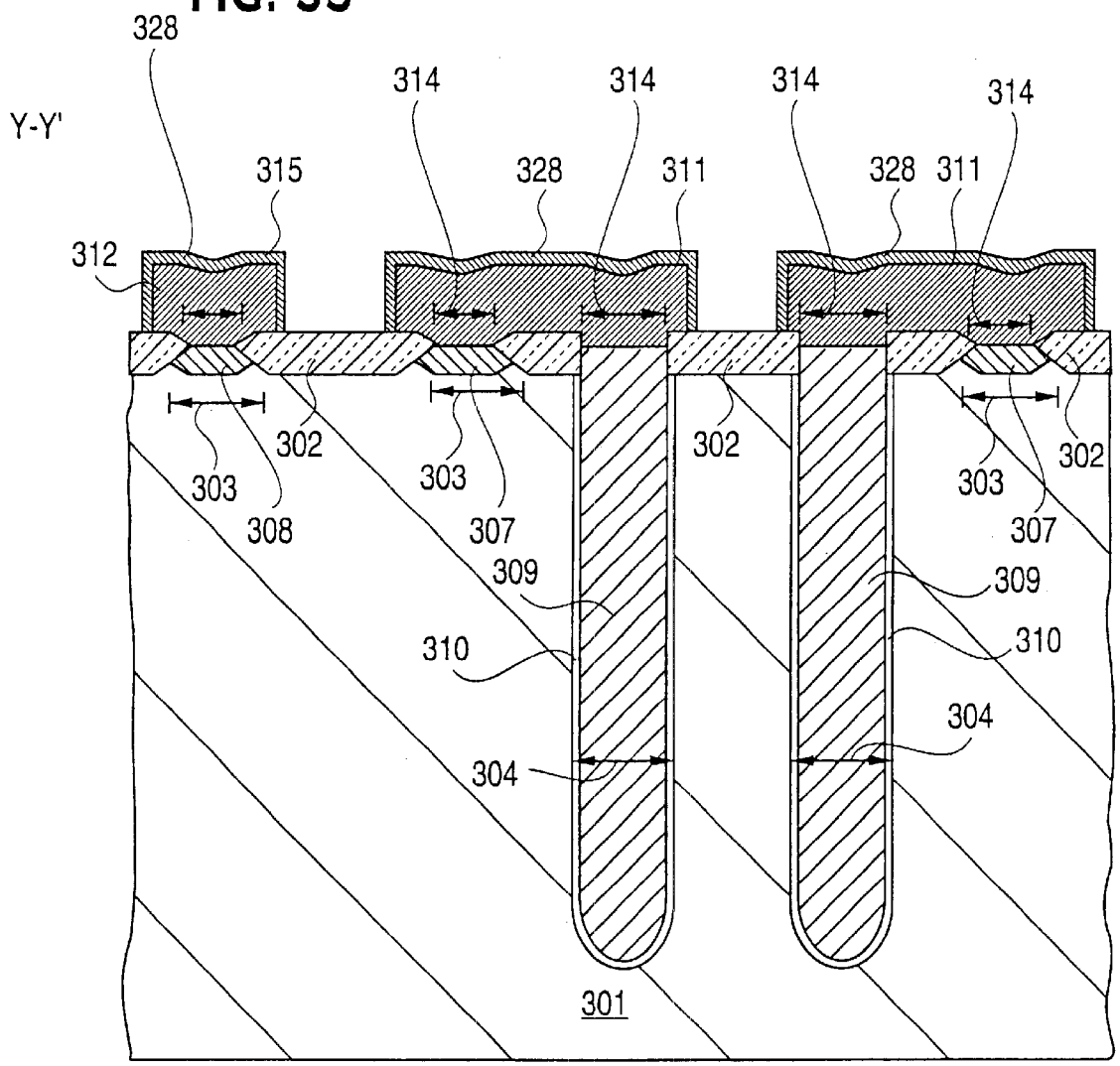
FIG. 35 is a cross-sectional view showing the process of the third embodiment of the present invention (corresponding to the cross-section taken along line Y–Y' of FIG. 15).
Figure 36:
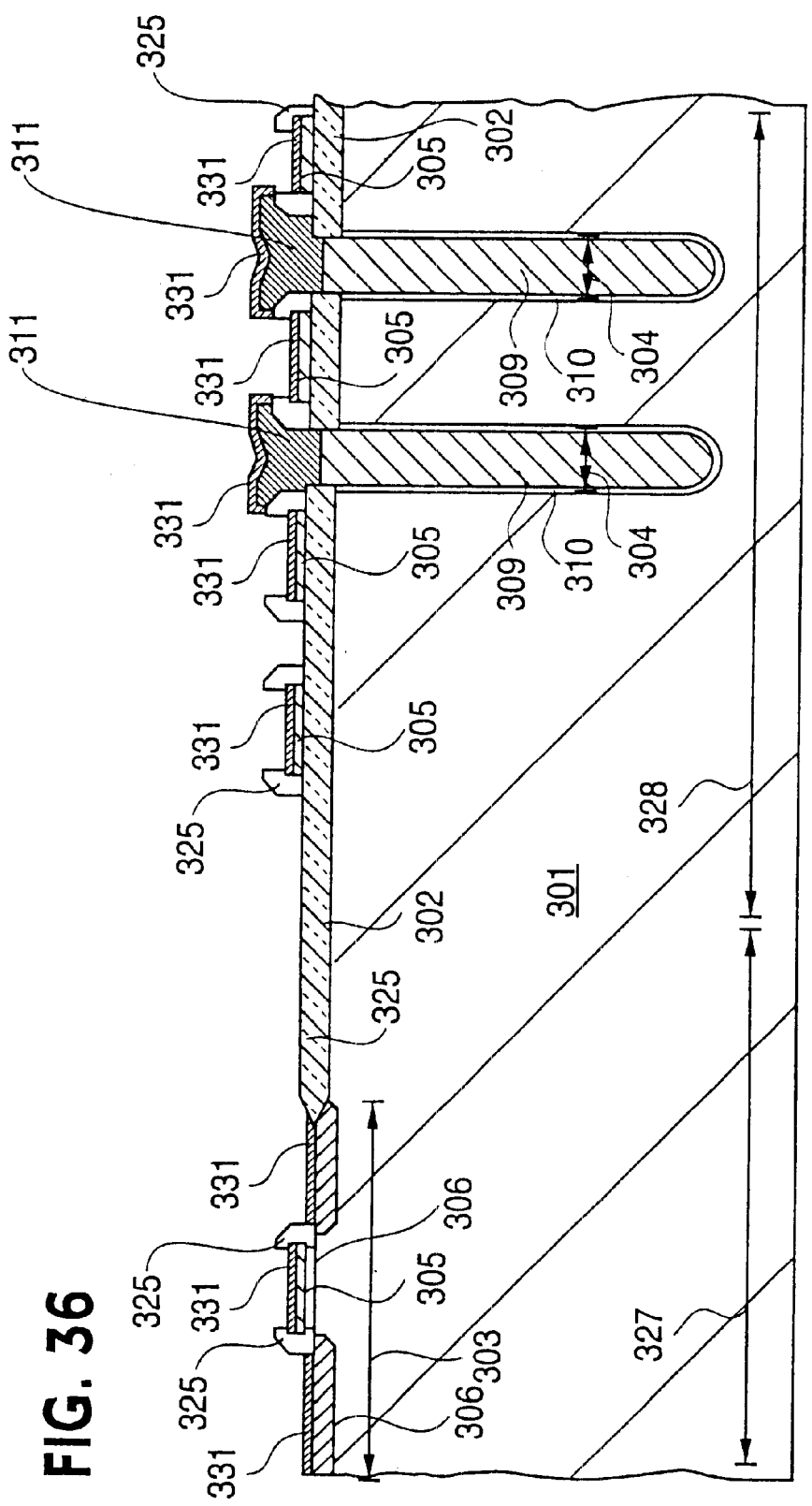
FIG. 36 is a cross-sectional view of the process of the boundary area between the memory cell array area and the peripheral logic circuit other than the memory cell array of the third embodiment of the present invention.
Figure 37:
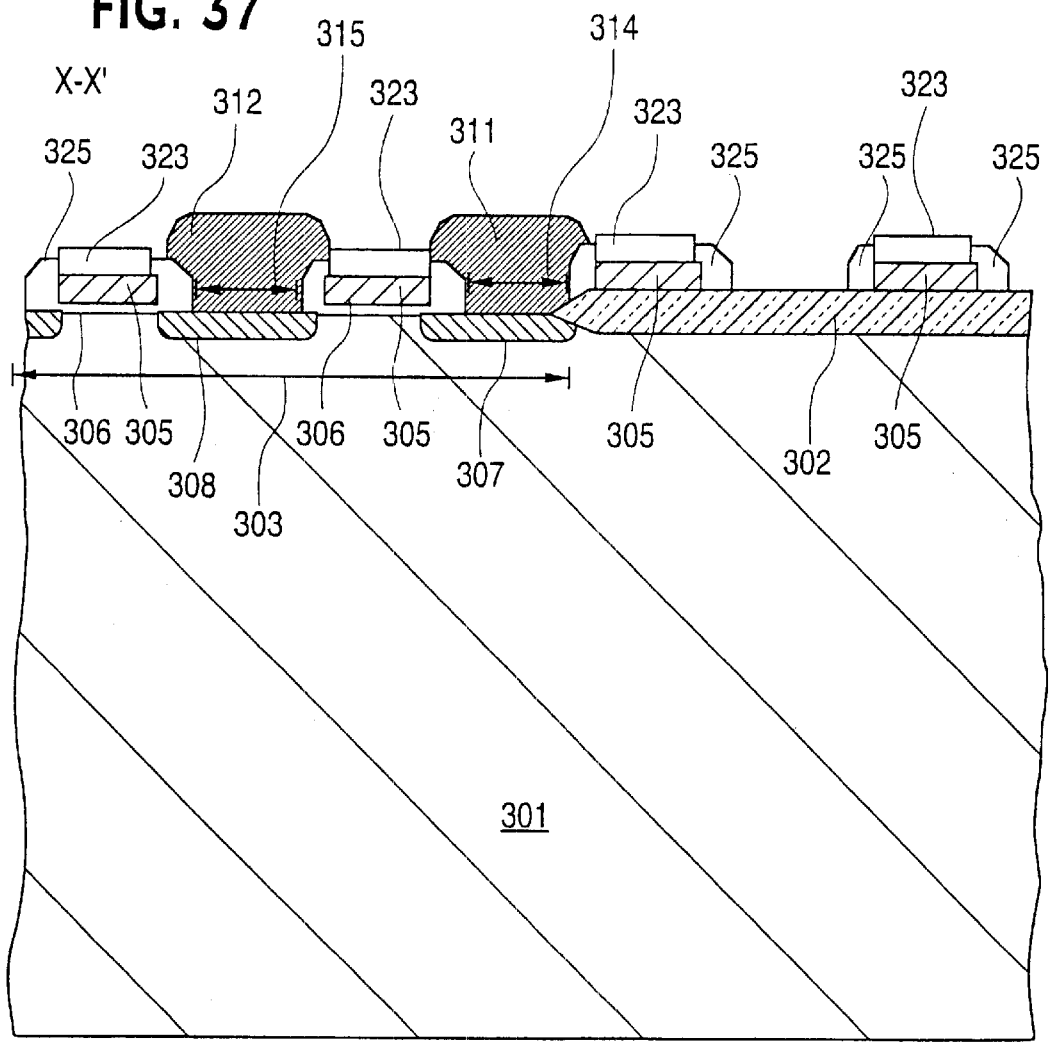
FIG. 37 is a cross-sectional view showing a process of the fourth embodiment of the present invention (corresponding to the cross-section taken along line X–X' of FIG. 15).
Figure 38:
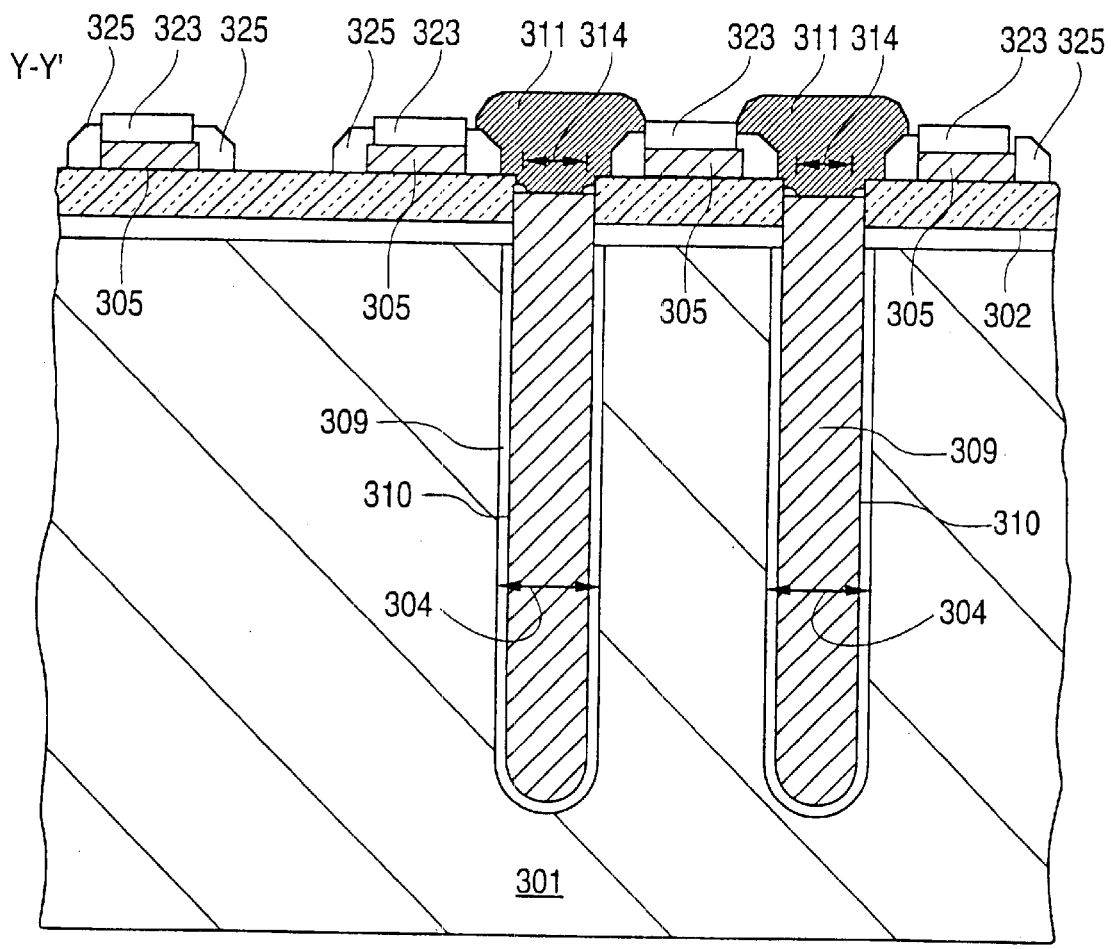
FIG. 38 is a cross-sectional view showing the process of the third embodiment of the present invention (corresponding to the cross-section taken along line Y–Y' of FIG. 15).
Figure 39:
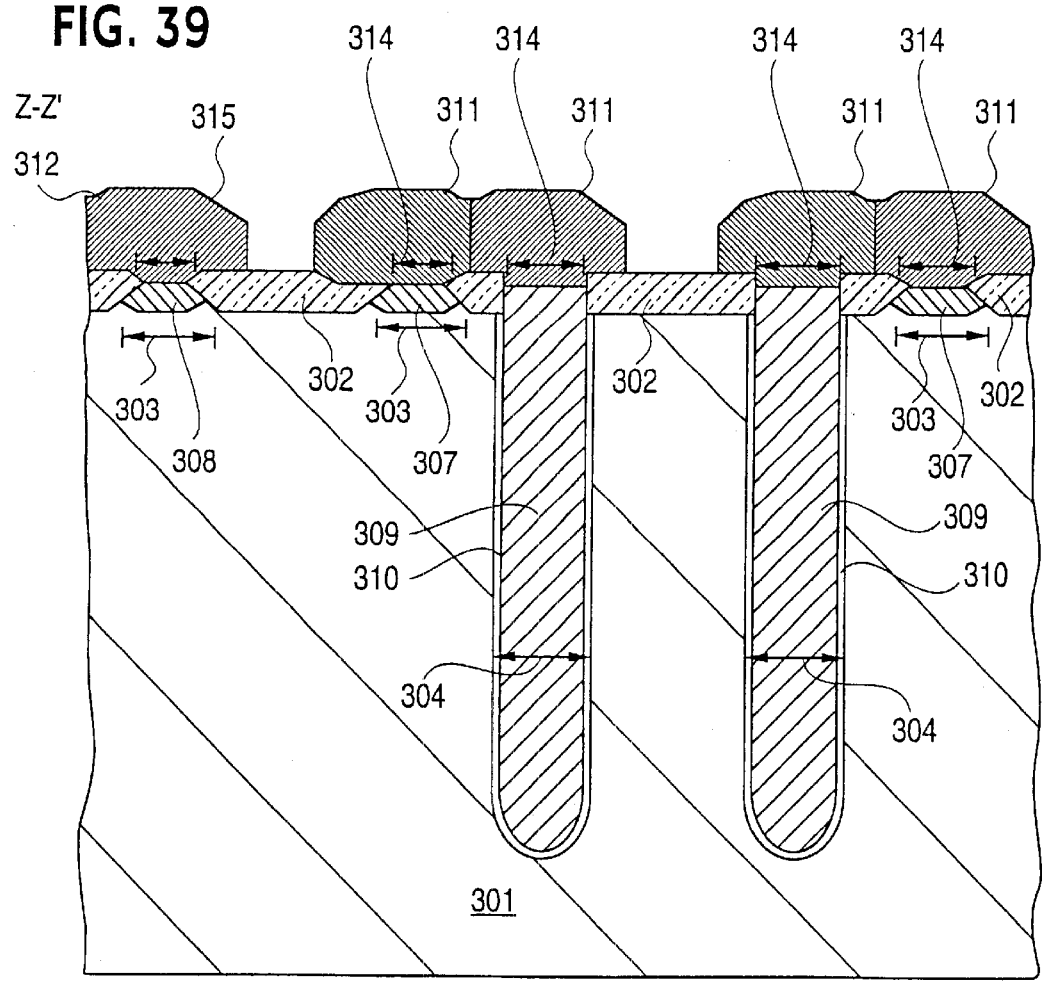
FIG. 39 is a cross-sectional view showing the process of the fourth embodiment of the present invention (corresponding to the cross-section taken along line Z–Z' of FIG. 15).
Figure 40:
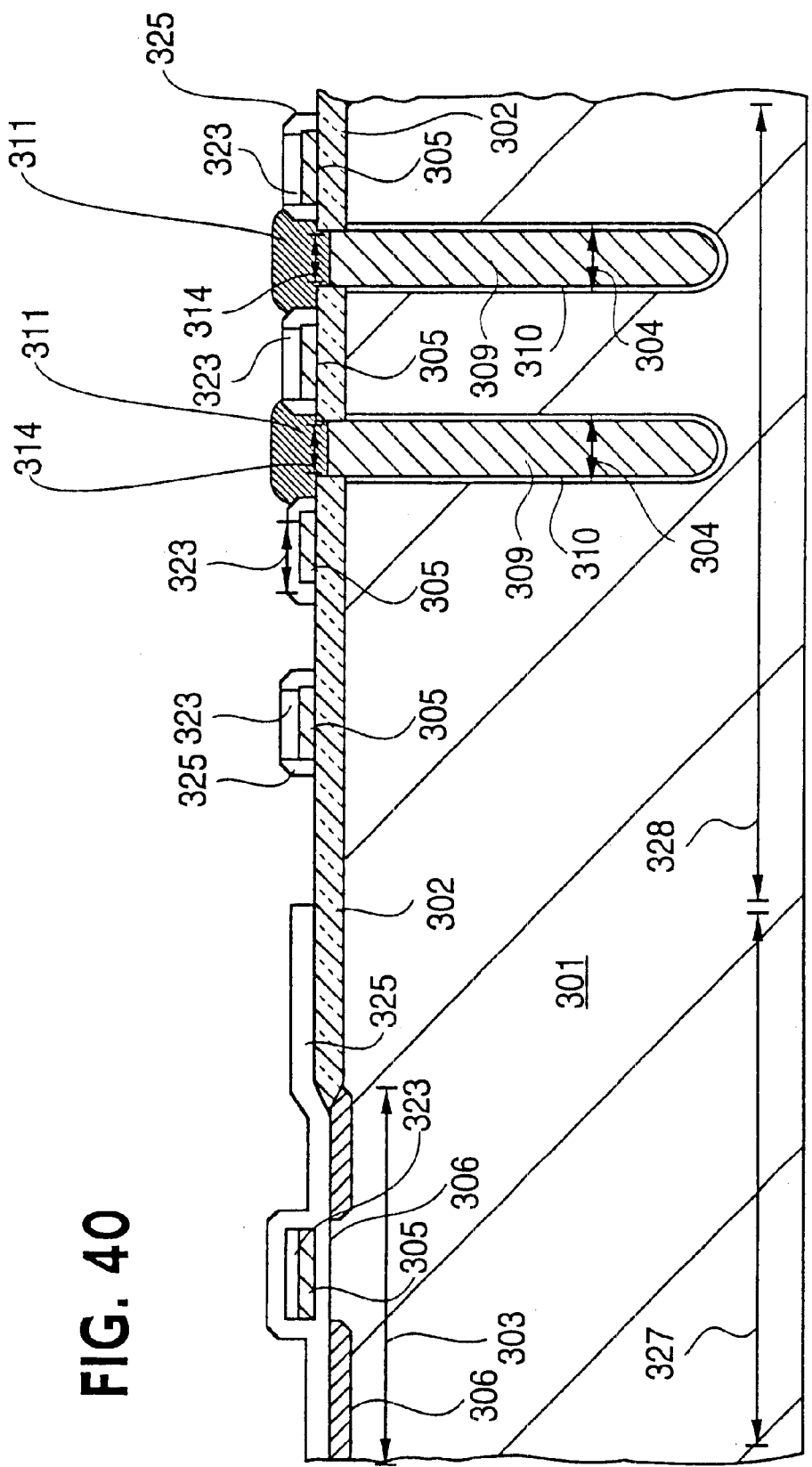
FIG. 40 is a cross-sectional view of the process of the boundary area between the memory cell array area and the peripheral logic circuit other than the memory cell array of the fourth embodiment of the present invention.
Figure 41:
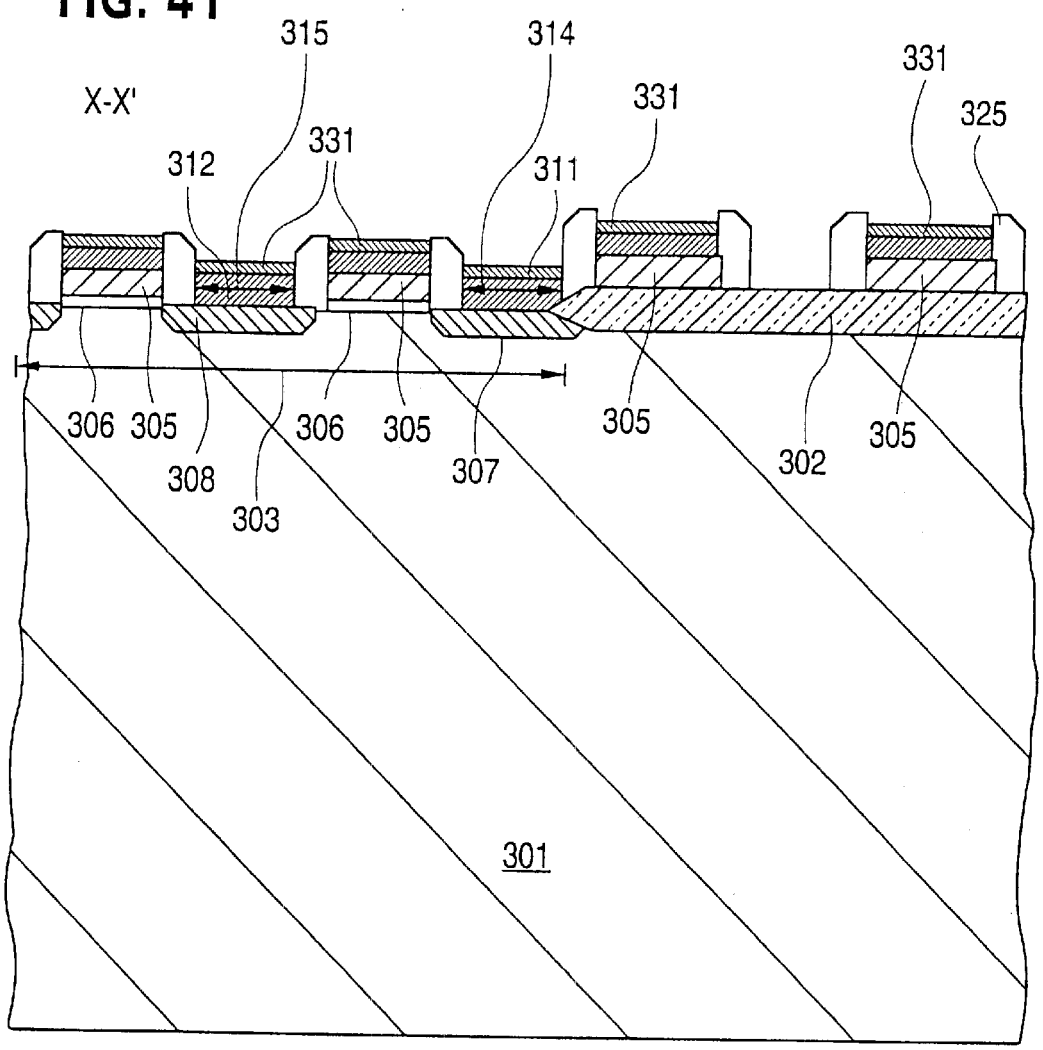
FIG. 41 is a cross-sectional view showing a process of the fifth embodiment of the present invention (corresponding to the cross-section taken along line X–X' of FIG. 15).
Figure 42:
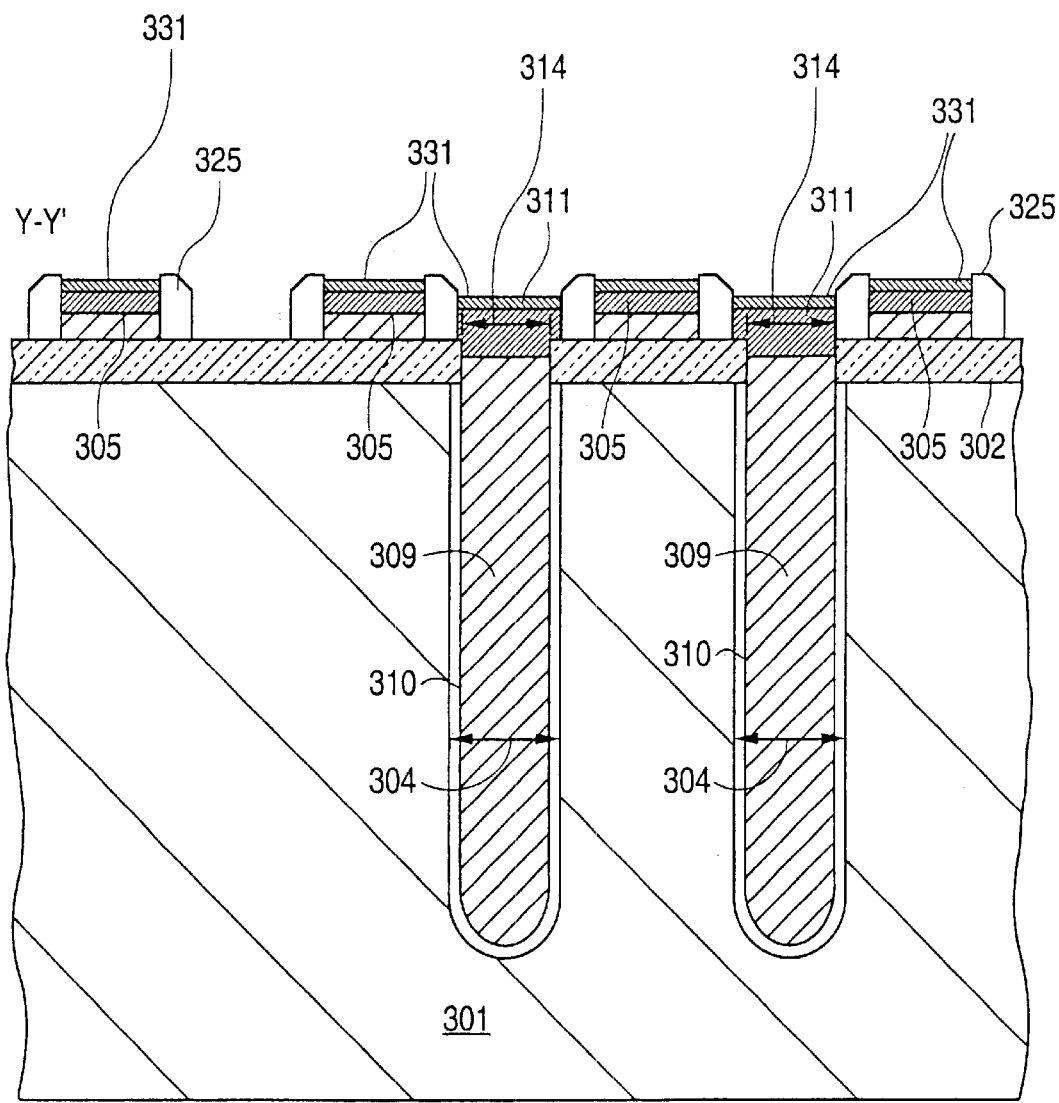
FIG. 42 is a cross-sectional view showing the process of the fifth embodiment of the present invention (corresponding to the cross-section taken along line Y–Y' of FIG. 15).
Figure 43:
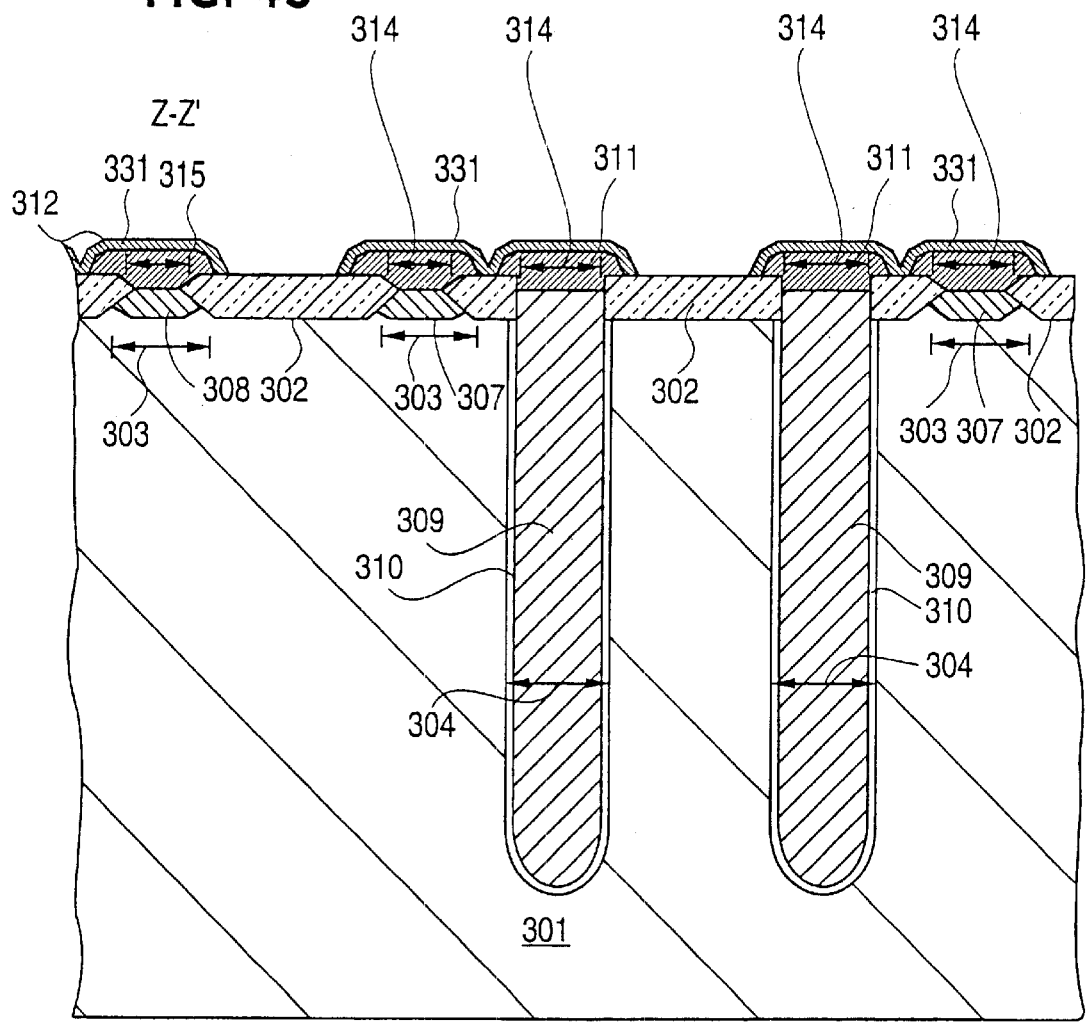
FIG. 43 is a cross-sectional view showing the process of the fifth embodiment of the present invention (corresponding to the cross-section taken along line Z–Z' of FIG. 15).
Figure 44:
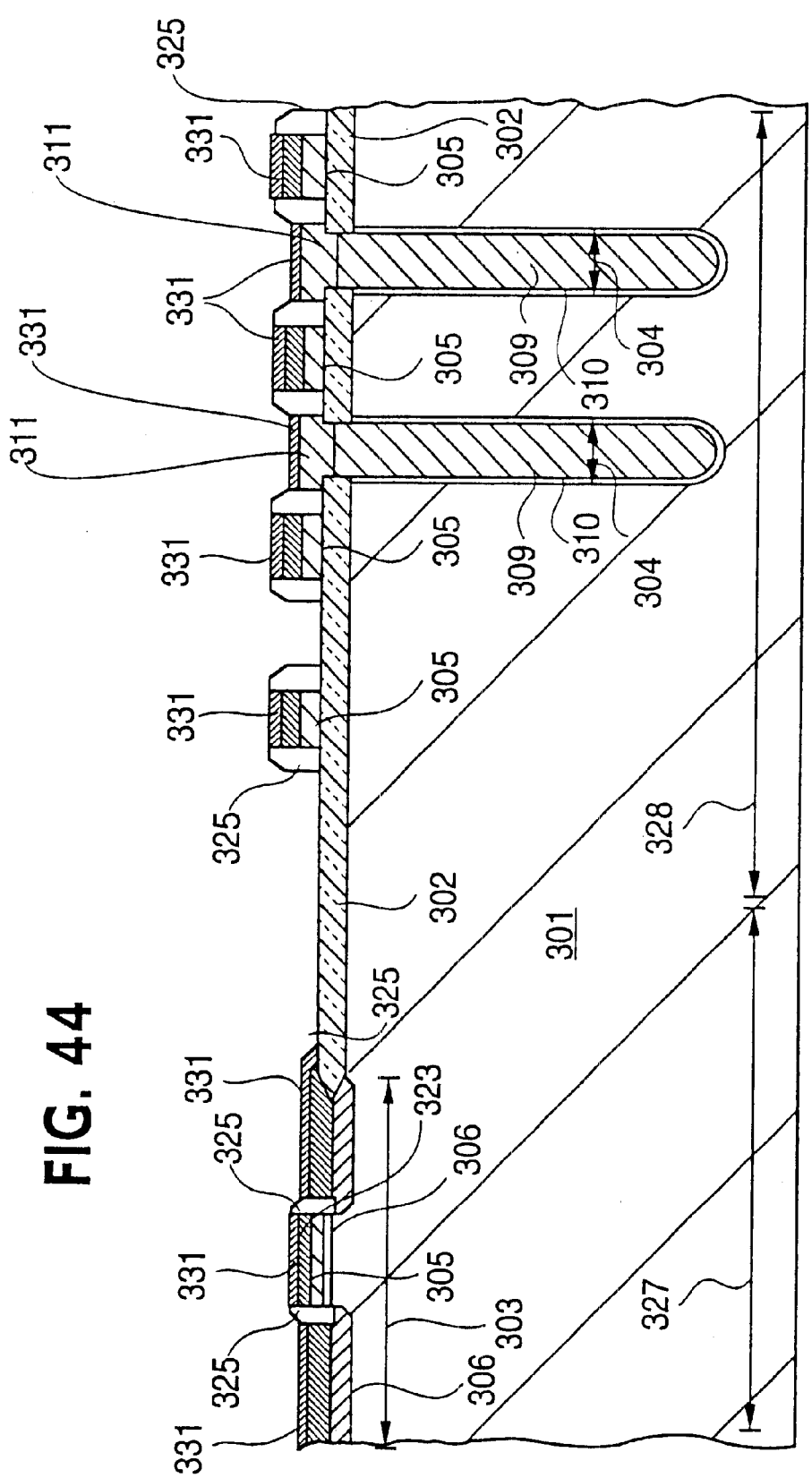
FIG. 44 is a cross-sectional view of the process of the boundary area between the memory cell array area and the peripheral logic circuit other than the memory cell array of the fifth embodiment of the present invention.
Figure 45:
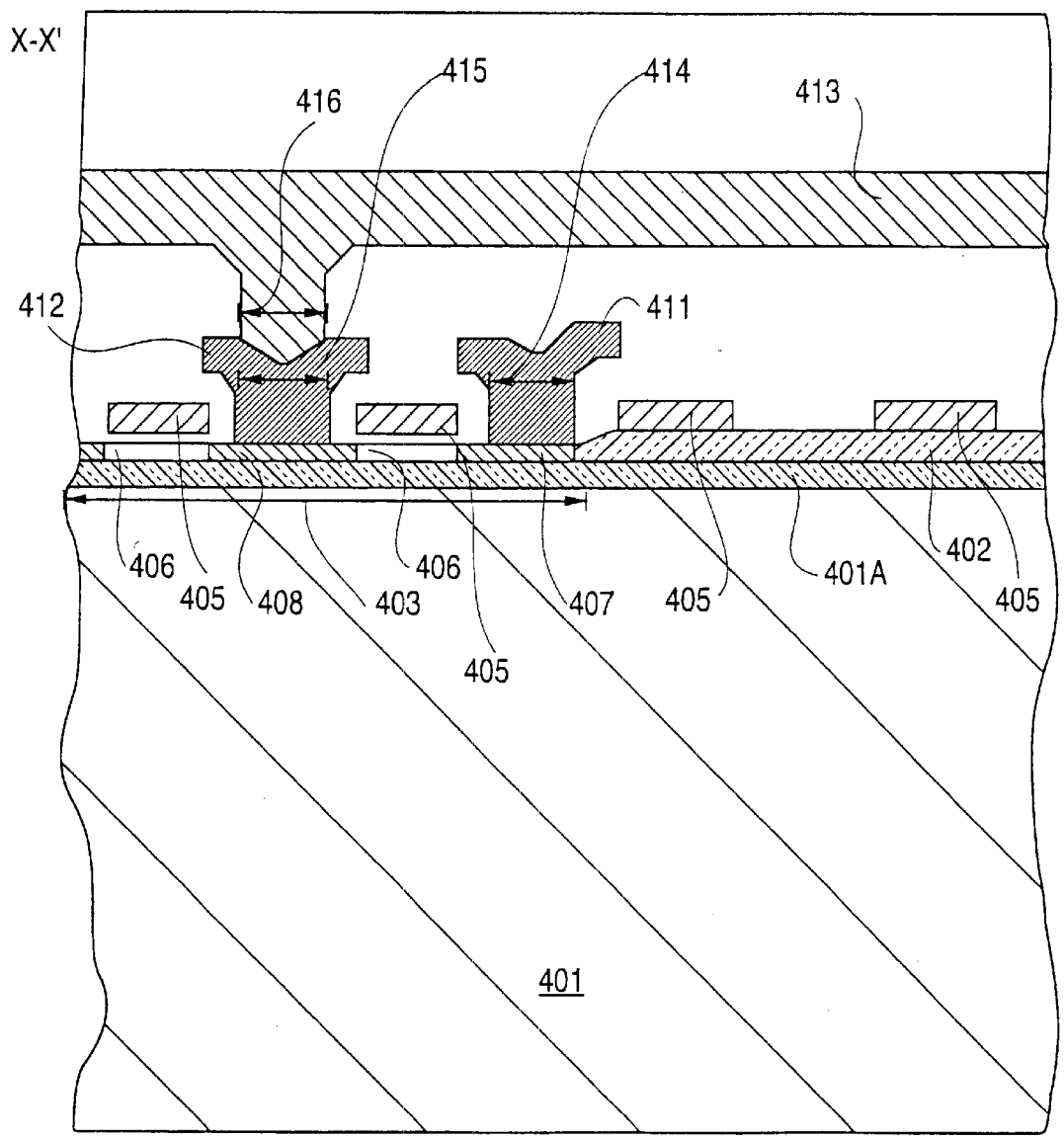
FIG. 45 is a cross-sectional view showing a process of the sixth embodiment of the present invention (corresponding to the cross-section taken along line X–X' of FIG. 15).
Figure 46:
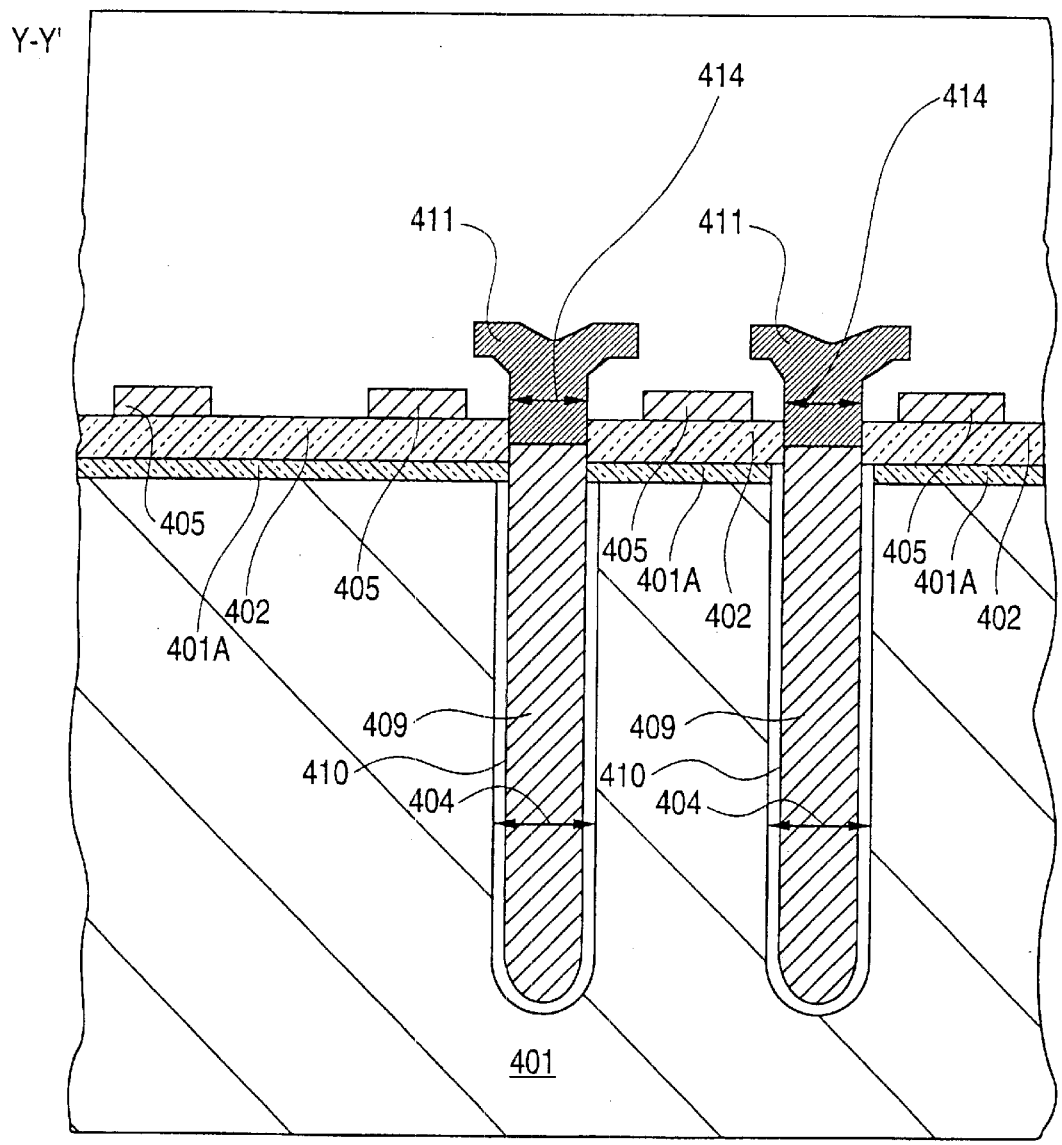
FIG. 46 is a cross-sectional view showing the process of the sixth embodiment of the present invention (corresponding to the cross-section taken along line Y–Y' of FIG. 15).
Figure 47:
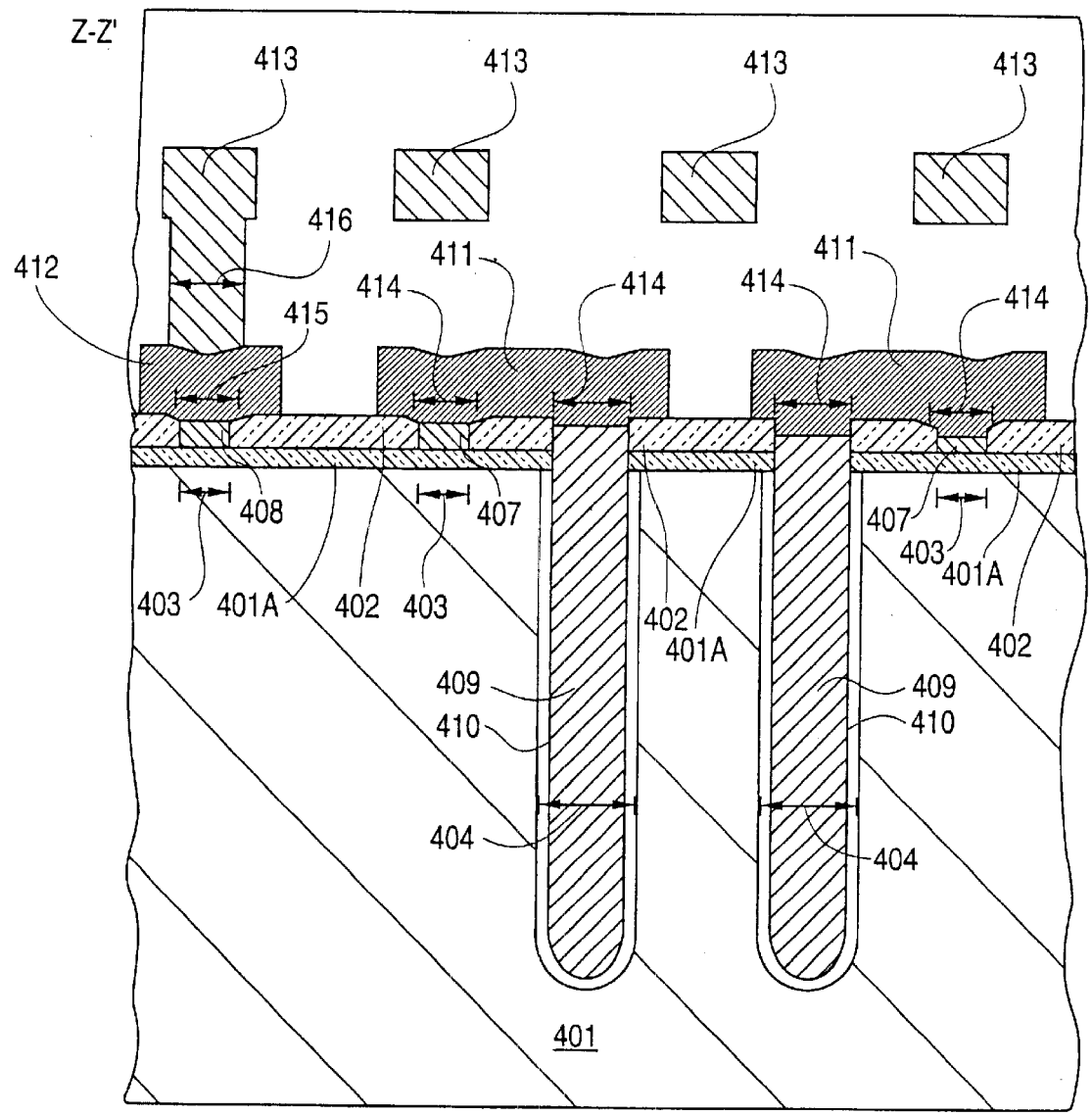
FIG. 47 is a cross-sectional view showing the process of the sixth embodiment of the present invention (corresponding to the cross-section taken along line Z–Z' of FIG. 15).
Figure 48:
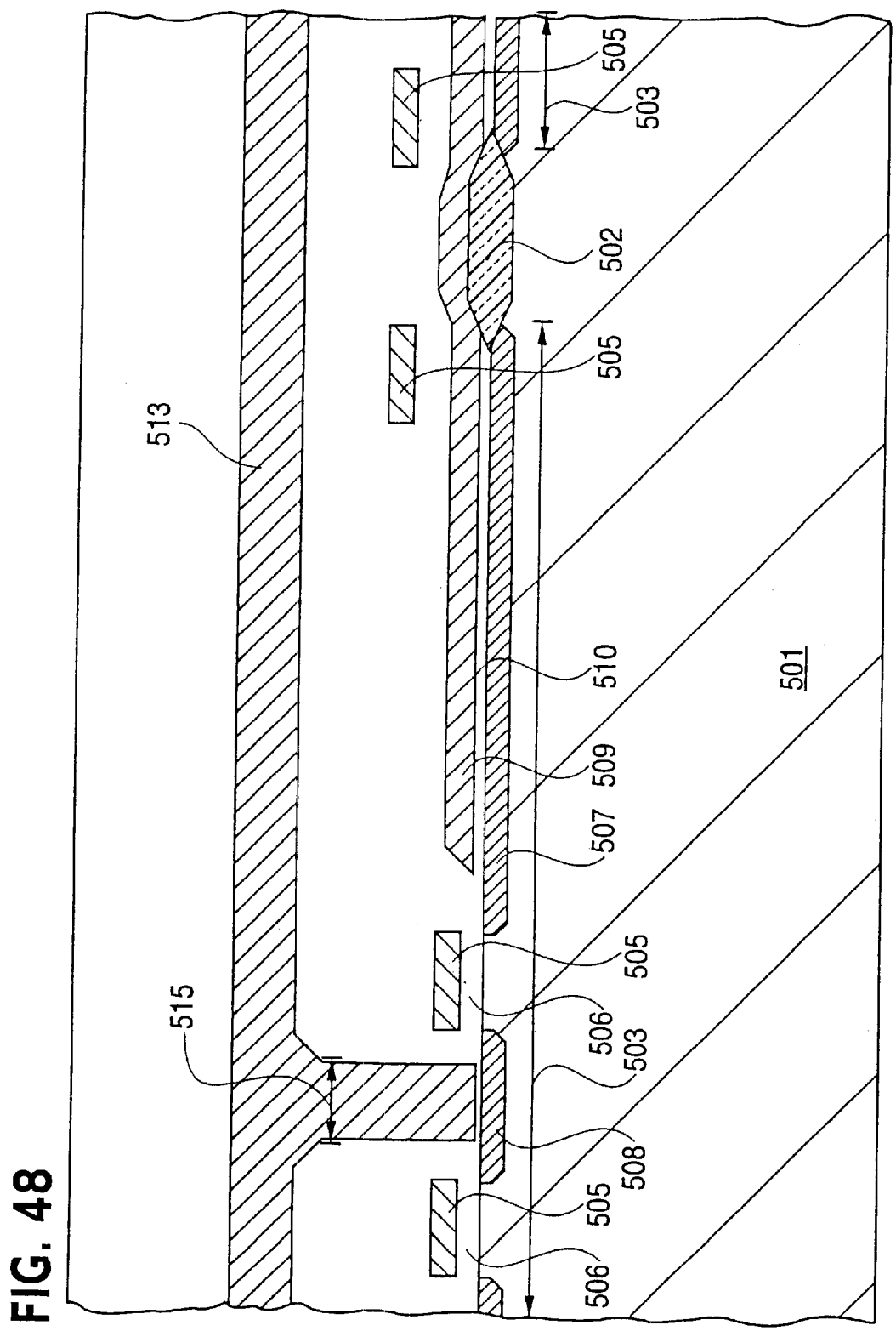
FIG. 48 is a cross-sectional view of a memory cell of a conventional technique having a planar capacitor structure.
Figure 49:
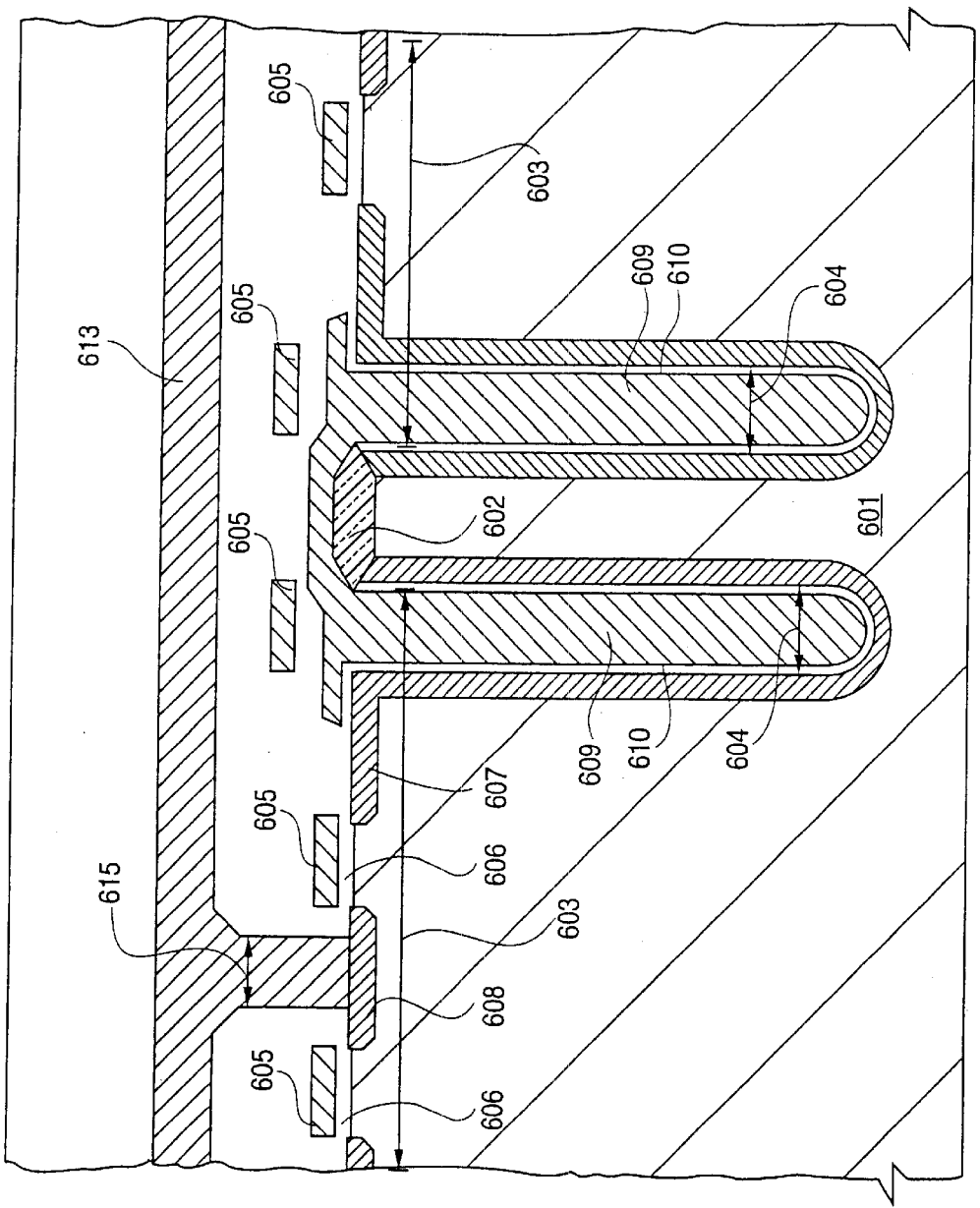
FIG. 49 is a cross-sectional view of a memory cell of the conventional technique having the trench surface as a capacitor charge holding electrode.
Figure 50:
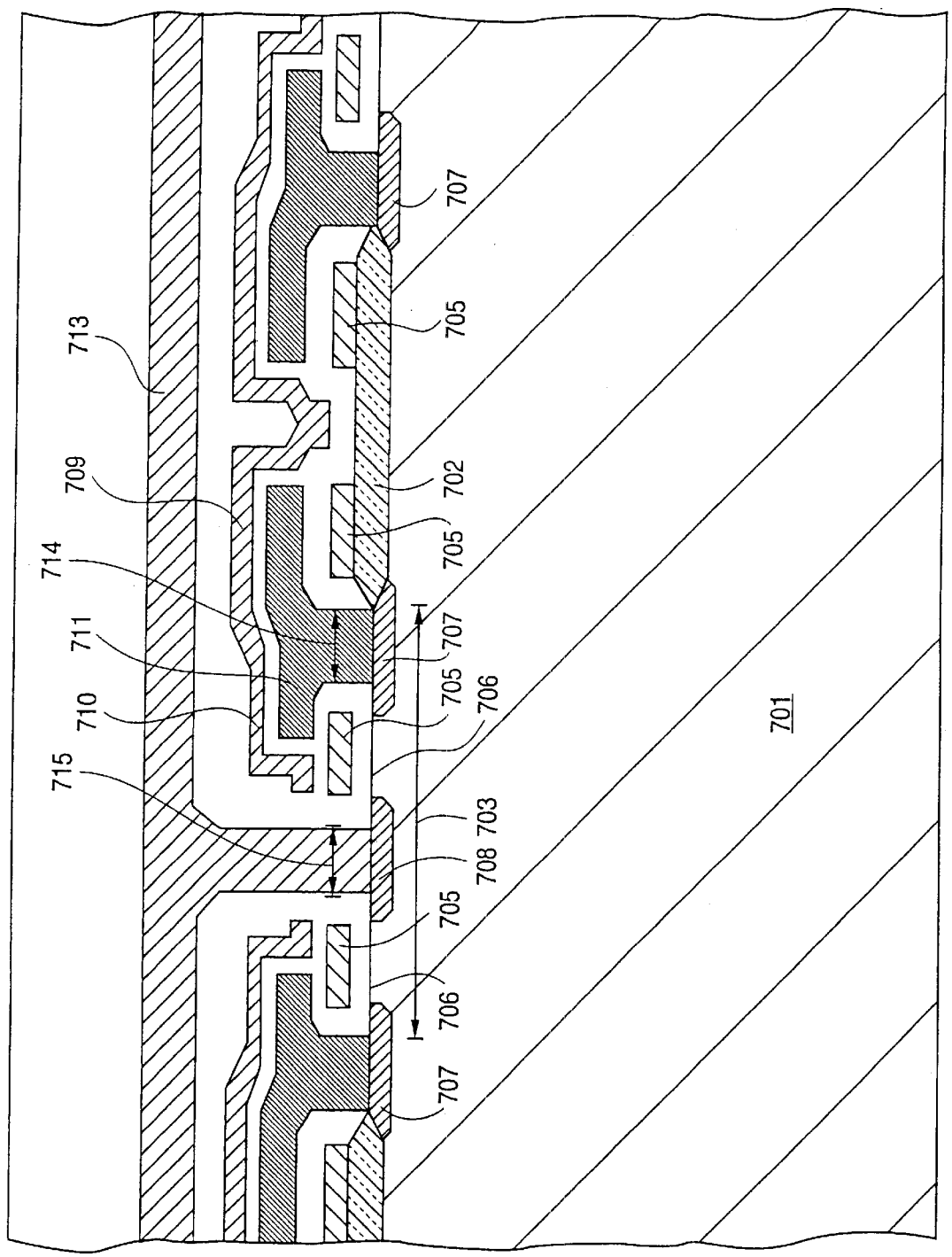
FIG. 50 is a cross-sectional view of a memory cell of the conventional technique having a capacitor of the stacked structure.
Figure 51:
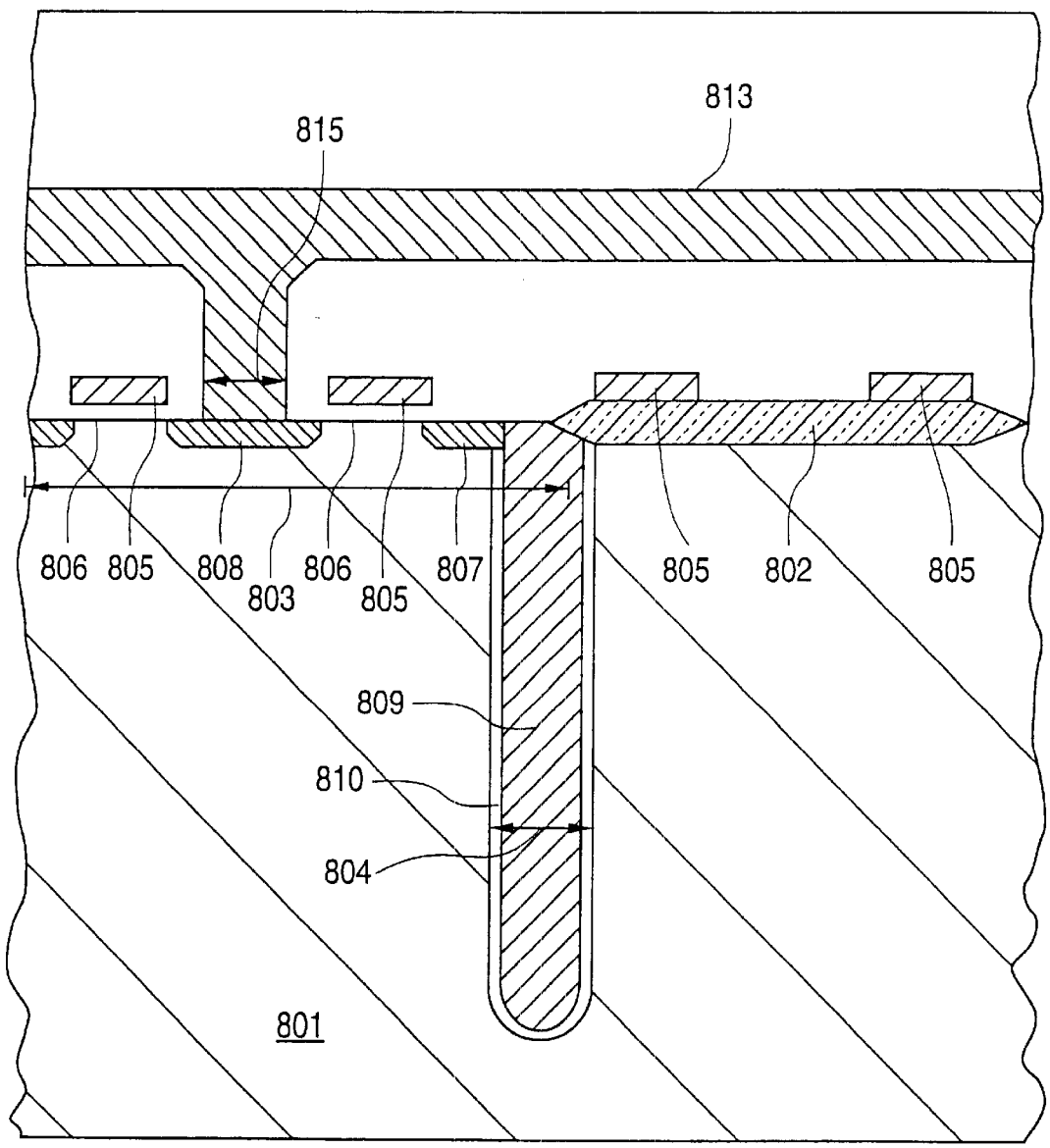
FIG. 51 is a cross-sectional view of a memory cell of the conventional technique having the trench surface as a counterelectrode of a capacitor charge holding electrode.
Figure 52:
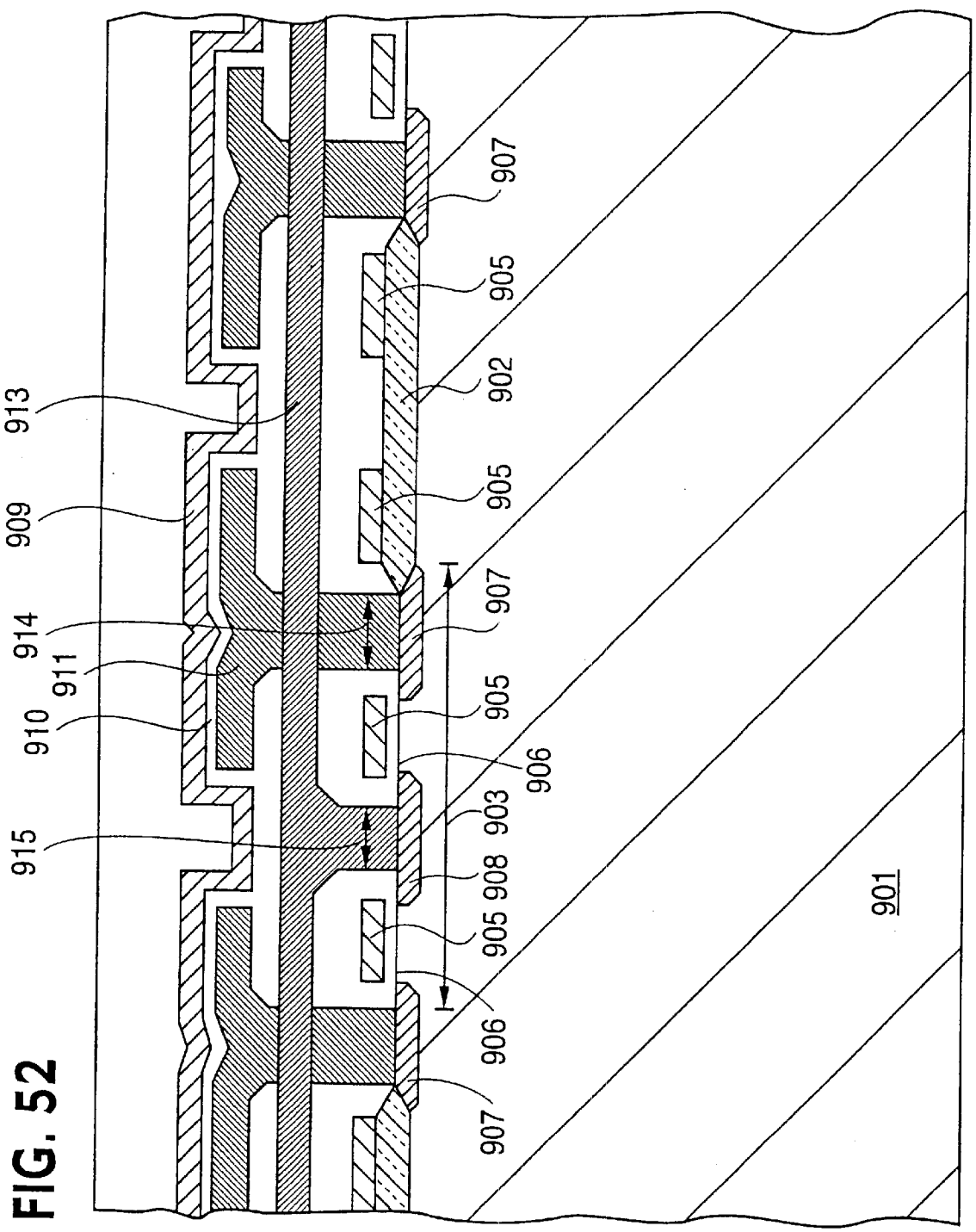
FIG. 52 is a cross-sectional view of a memory cell of the conventional technique having a capacitor bit line of a stacked structure.

FIGS. 28, 32 and 36 are cross-sectional views of the process showing the boundary area of the memory cell array area and the peripheral logic circuit area other than the memory cell array area of the present third embodiment.

Figure 19:
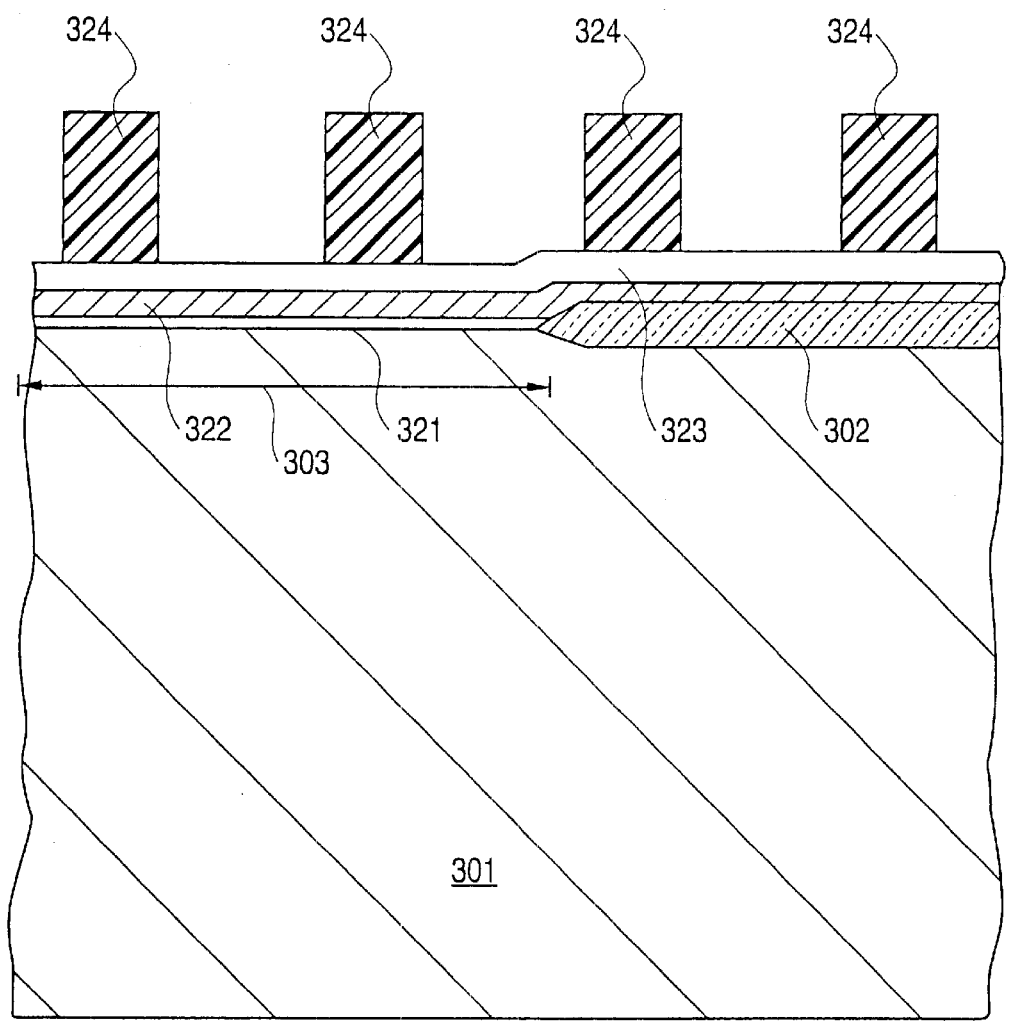
FIG. 19 is a cross-sectional view showing a process of the third embodiment of the present invention (corresponding to the cross-section taken along line X–X' of FIG. 15).
Figure 20:
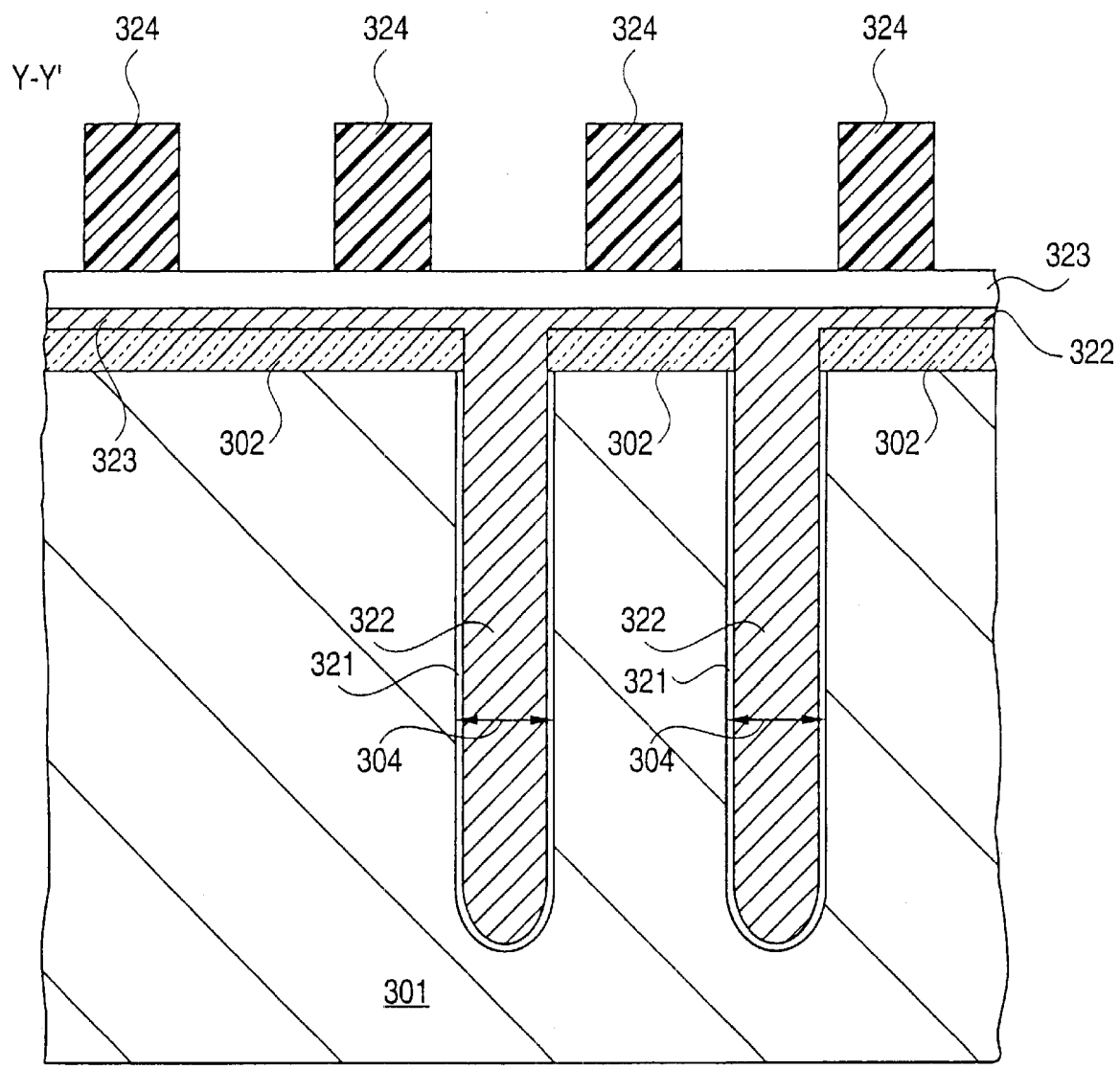
FIG. 20 is a cross-sectional view showing the process of the third embodiment of the present invention (corresponding to the cross-section taken along line Y–Y' of FIG. 15).
Figure 21:
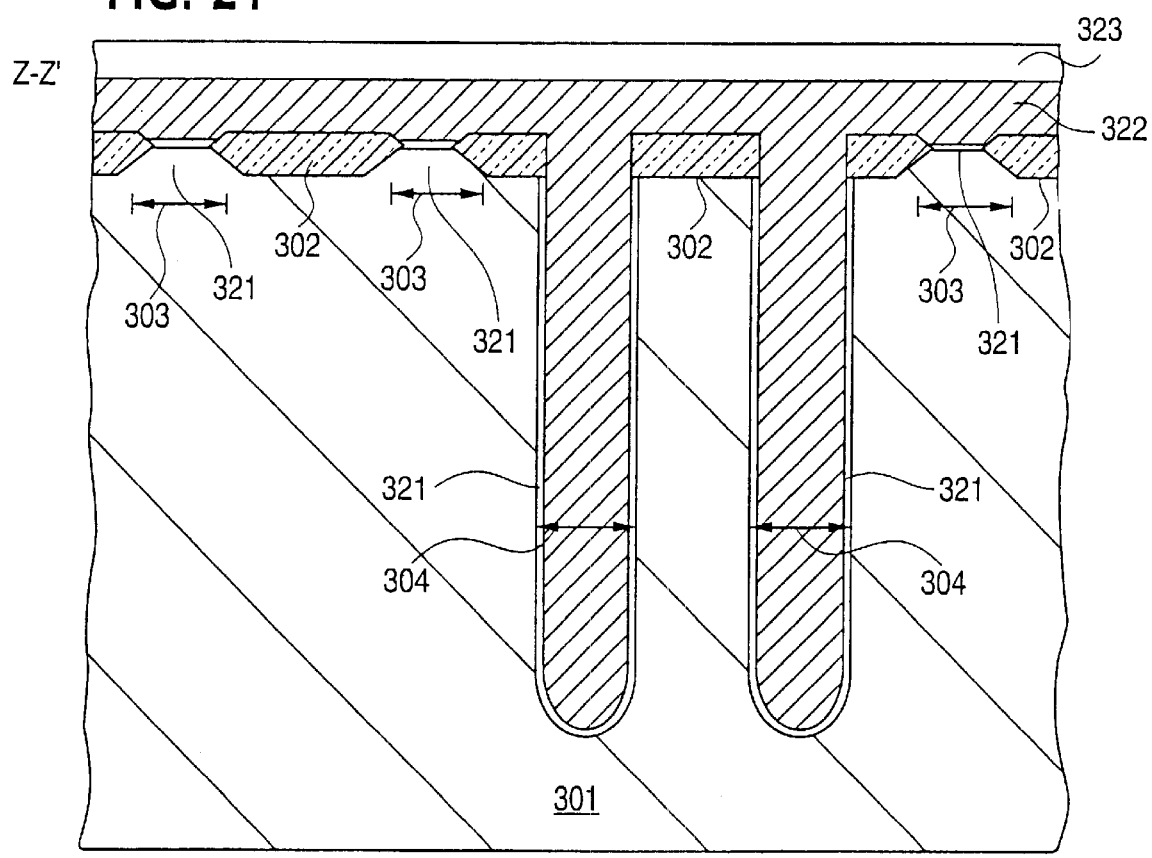
FIG. 21 is a cross-sectional view showing the process of the third embodiment of the present invention (corresponding to the cross-section taken along line Z–Z' of FIG. 15).

Referring to FIGS. 19 to 21, the isolating oxide film 302 and the active area 303 are formed on a semiconductor substrate 301, after which the trench 304 is formed. Then, after a suitable washing step, a silicon oxide film 321 is formed by the thermal oxidation method or the chemical gaseous phase growth method. Then, an electrically conductive film 322 formed by a dual-layer structure of the polycrystalline silicon and metal silicide, and a silicon oxide film 323 containing phosphorus and boron is formed by the thermal oxidation method or the chemical gaseous phase growth (deposition) method. Further, a photoresist 324 having the pattern of the gate electrode 305 is formed by photolithography.

Figure 22:
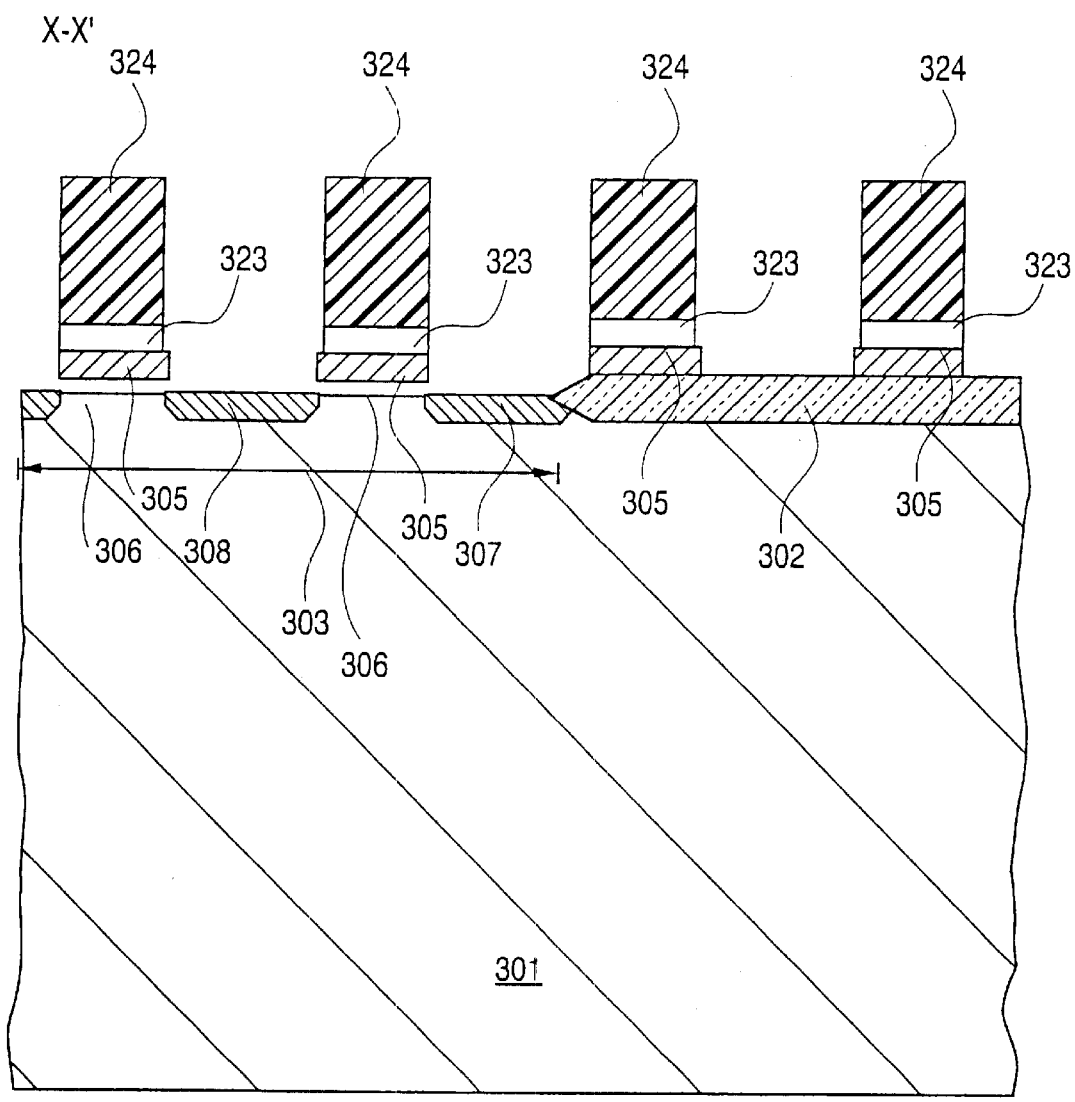
FIG. 22 is a cross-sectional view showing the process of the third embodiment of the present invention (corresponding to the cross-section taken along line X–X' of FIG. 15).
Figure 23:
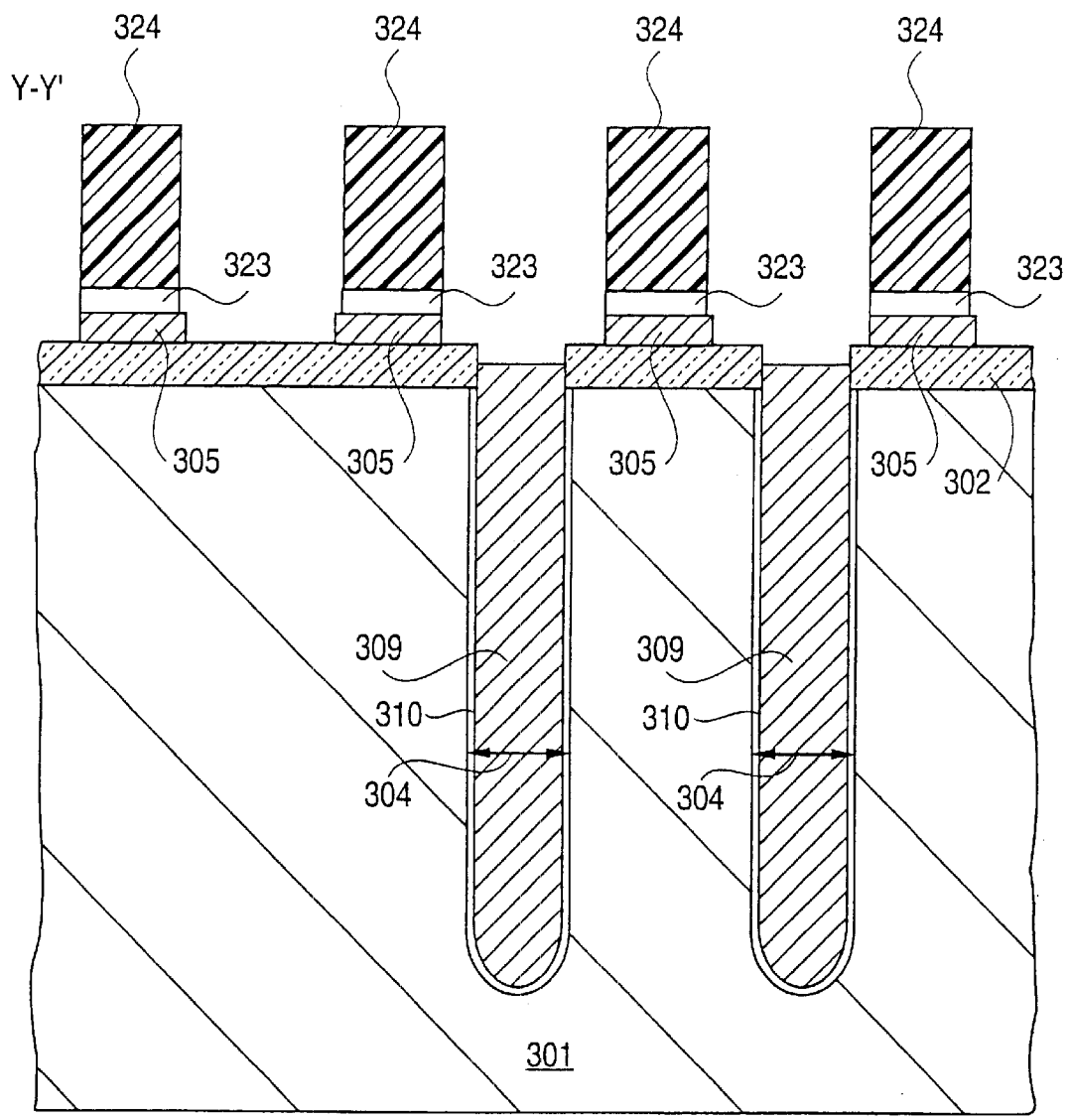
FIG. 23 is a cross-sectional view showing the process of the third embodiment of the present invention (corresponding to the cross-section taken along line Y–Y' of FIG. 15).
Figure 24:
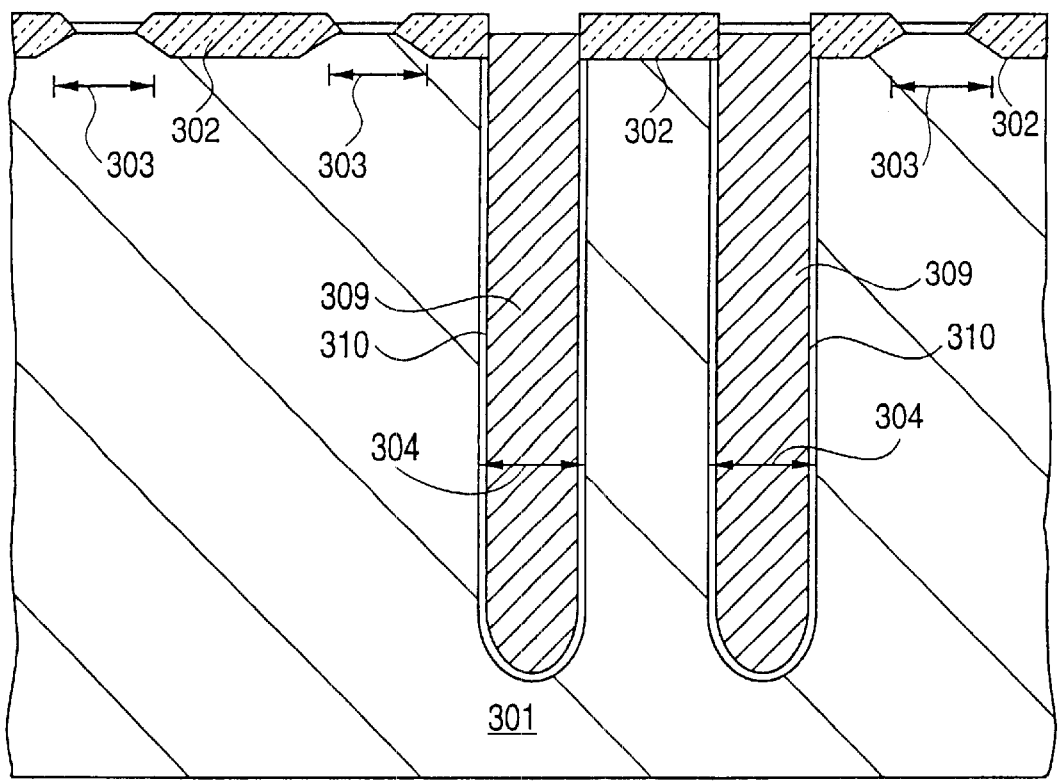
FIG. 24 is a cross-sectional view showing the process of the third embodiment of the present invention (corresponding to the cross-section taken along line Z–Z' of FIG. 15).
Figure 25:
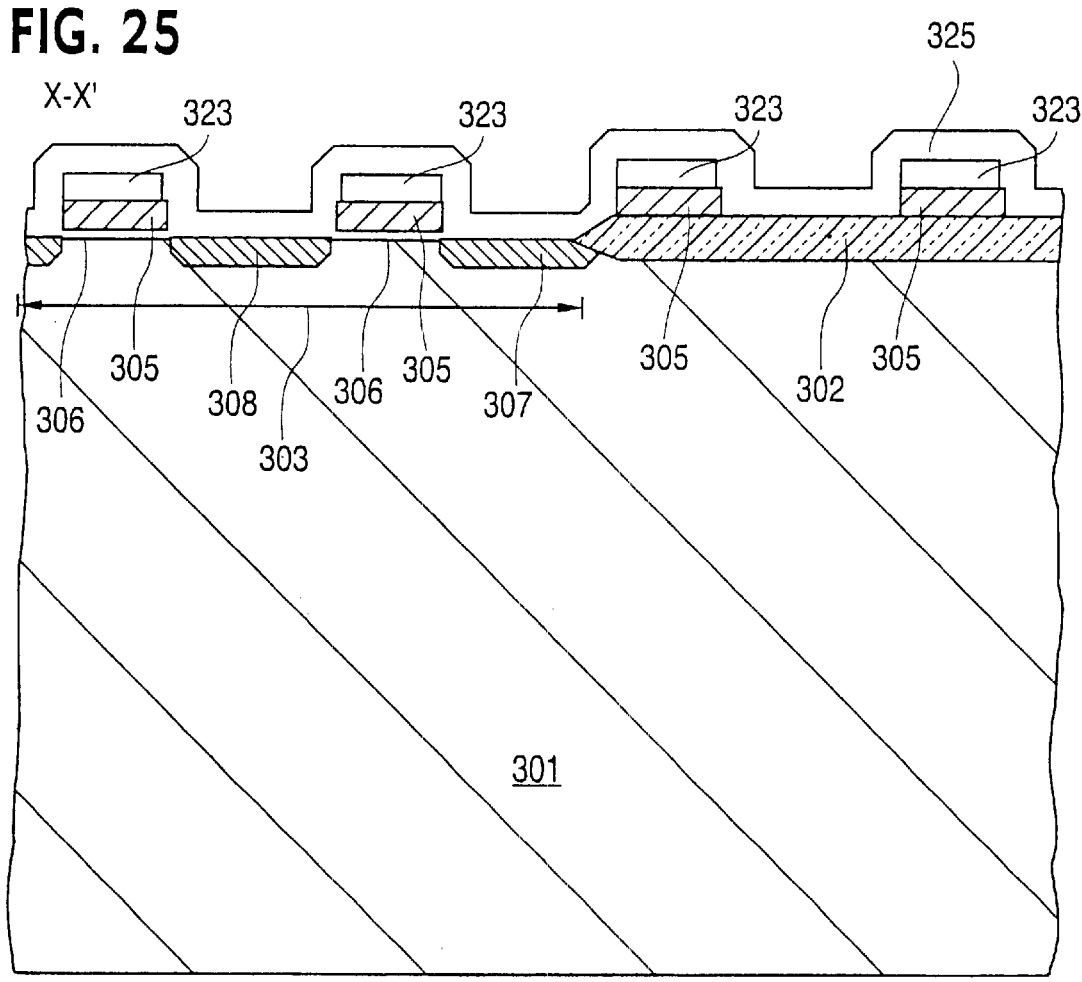
FIG. 25 is a cross-sectional view showing the process of the third embodiment of the present invention (corresponding to the cross-section taken along line X–X' of FIG. 15).
Figure 26:
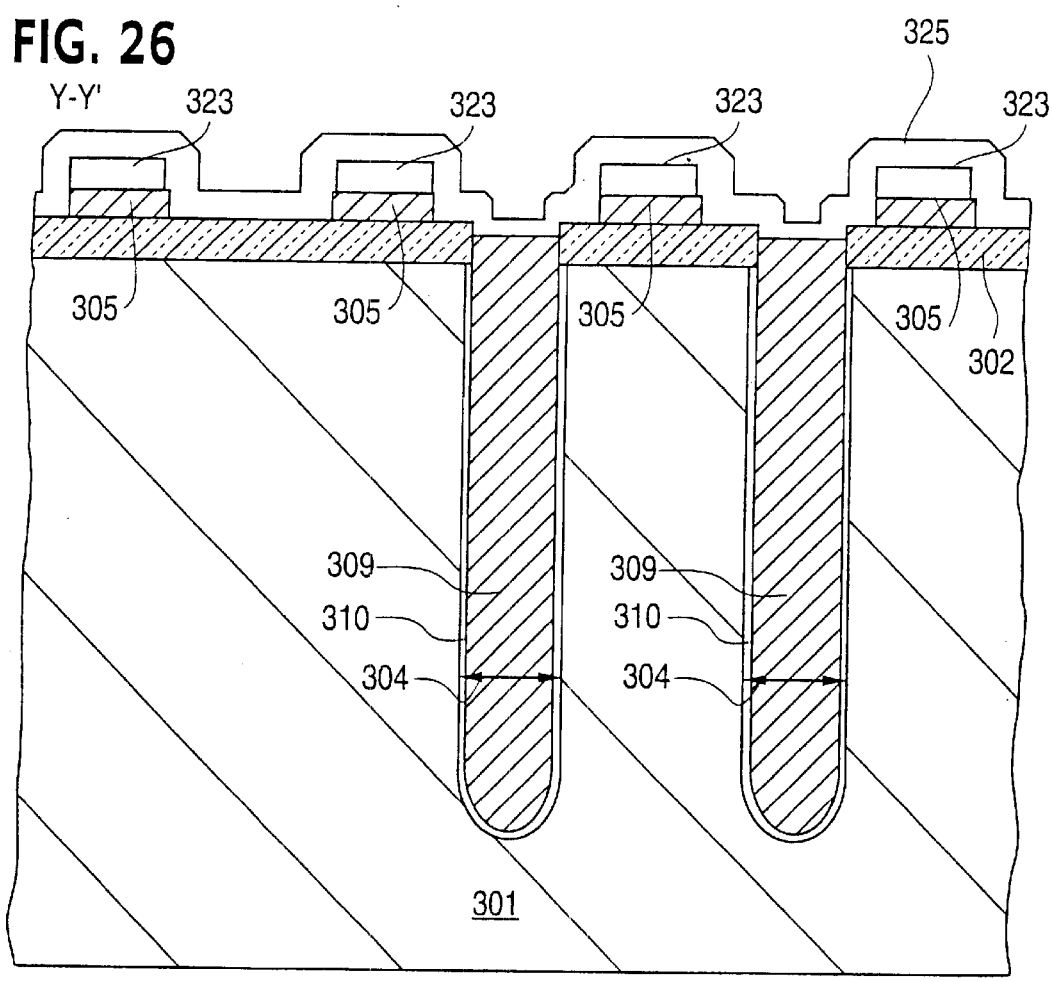
FIG. 26 is a cross-sectional view showing the process of the third embodiment of the present invention (corresponding to the cross-section taken along line Y–Y' of FIG. 15).
Figure 27:
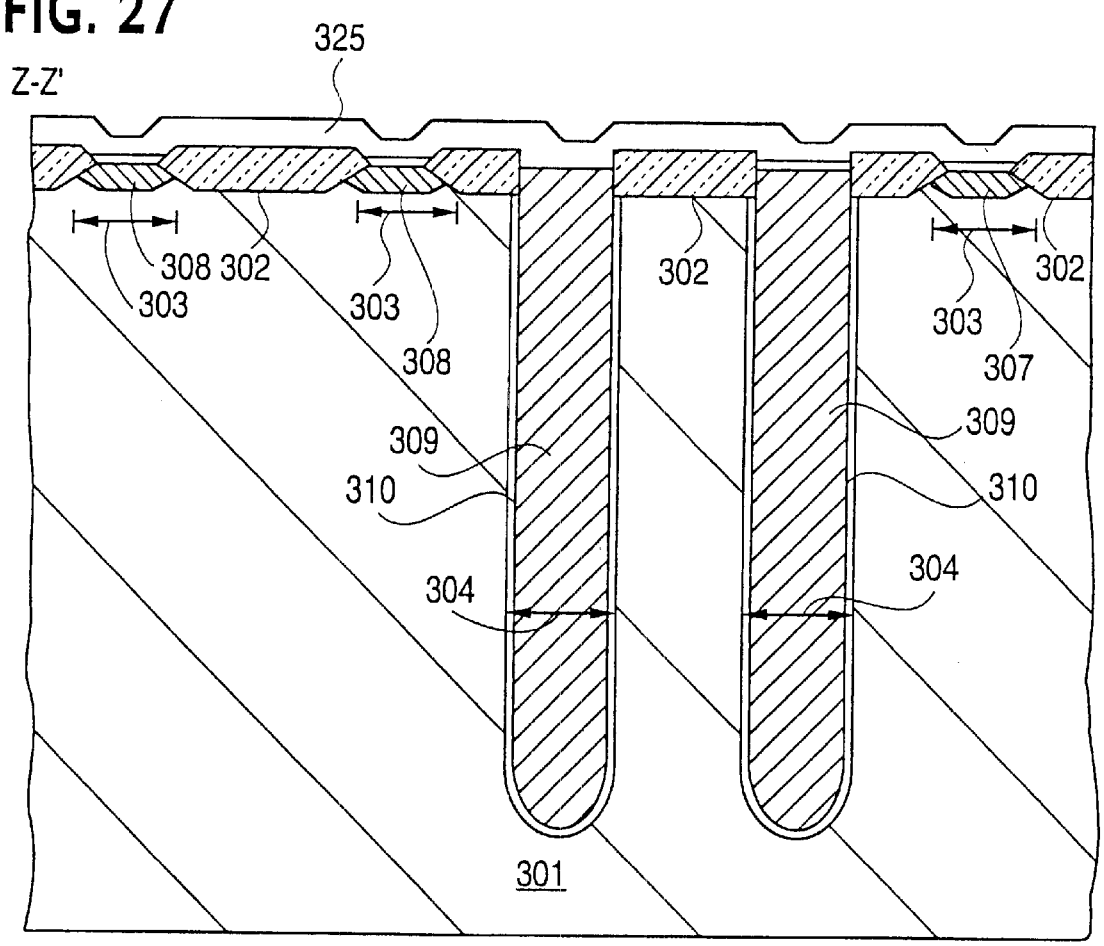
FIG. 27 is a cross-sectional view showing the process of the third embodiment of the present invention (corresponding to the cross-section taken along line Z–Z' of FIG. 15).

Then, unneeded portions of the silicon oxide film 323 containing phosphorus and boron and the electrically conductive film 322 are removed by anisotropic etching to form the gate electrode 305 and the charge holding electrode 309 as shown in FIGS. 22 to 24. At this time, the silicon oxide film 322 below the gate electrode 305 proves to be the gate oxide film 306, while the silicon oxide film 322 below the charge holding electrode 309 becomes the capacitance insulating film 310.

In the present embodiment, there is no lithographic pattern of the charge holding electrode 309, i.e., trench 304 is not covered by the photoresist, so that, when the unneeded portions of the silicon oxide film 323 containing phosphorus and boron and the electrically conductive film 322 are removed by the photoresist pattern of the gate electrode 305, the electrically conductive film 322 over the trench 304 and the silicon oxide film 323 containing phosphorus and boron are etched off by etchback in an amount corresponding to the thickness at the time of film forming, so as to be left in the trench 304 to become the charge holding electrode 309. The photoresist 324 is then removed and, after a suitable washing step and an impurity introducing step by ion implantation, the capacitance forming diffusion layer 307, bit line connection diffusion layer 308 and an interlayer insulating film 325 are formed in this order. Then, as shown in FIGS. 25 to 28, a photoresist 326 having the pattern of the connection holes 314, 315 is formed by photolithography. Since the connection holes 314, 315 are formed by self-alignment contact, the photoresist 327 has a pattern being opened in the whole area of the memory all array.

Then, an unneeded portion of the interlayer insulating film 325 is removed by anisotropic etching and an electrically conductive layer 329 formed mainly of polycrystalline silicon is formed, and a photoresist 330 having a pattern of a capacitance electrode connecting local interconnect ion 311 and a bit line connection local connection 312 is formed by photolithography, as shown in FIGS. 29 to 32.

Then, an unneeded portion of the electrically conductive film 326 is removed to form the capacitance electrode connecting local interconnection 311 and the bit line connection local connection 312. Then, after removing an unneeded portion of the interlayer insulating film 325 of a peripheral logic circuit area 327 by anisotropic etching, silicon oxide film 323 on the gate electrode 305, containing phosphorus and boron, is selectively removed by gaseous phase hydrogen fluoride for siliciding the capacitance electrode connecting local interconnection 311, bit line connection local connection 312, capacitance forming diffusion layer 307 and the bit line connection diffusion layer 308 to form a titanium silicide layer 331.

Then, a connection hole 316 and a bit line 313 are formed by a method similar to that of the above-described first embodiment to form a memory cell structure, thus producing a cross-sectional shape shown in FIGS. 16 to 18.

Embodiment 4

A fourth embodiment of the present invention is hereinafter explained. In the present embodiment, the planar layout and the substrate structure of the memory cell are similar to those of the above-described third embodiment.

In the above-described third embodiment, the capacitance electrode connecting local interconnection 311 and the bit line connection local connection 312 are formed by a an electrically conductive layer of polycrystalline silicon. In the present embodiment, the steps corresponding to FIGS. 29 to 32 of the third embodiment are carried out by the selective epitaxial growth or selective growth of silicon, as shown in FIGS. 37 to 40, and the capacitance electrode connecting local interconnection 311 interconnecting the capacitance forming diffusion layer 307 and the charge holding electrode 309 is formed by lateral selective growth.

In the present embodiment, a semiconductor memory device having the same structure, operation and result as those of the third embodiment can be implemented by a one less number of photolithographic steps.

Embodiment 5

A fifth embodiment of the present invention s hereinafter explained. The present embodiment is similar in the basic structure and in planar layout of the memory cell to the previously described second and fourth embodiments.

In the present embodiment, growth of the silicon oxide film 323 containing phosphorus and boron is not carried out, and the photoresist 326 having the pattern of the connection holes 314, 315 is not formed. Specifically, in the present embodiment, the silicon oxide film 325 is etched back in the step corresponding to the process shown in FIGS. 29 to 32 and FIGS. 33 to 36 as shown in FIGS. 41 to 44. Then, silicon is formed by the selective epitaxial growth or selective growth of silicon, on the overall semiconductor surface, and a titanium silicide layer is then formed by silicidation so that the capacitance electrode connecting local interconnect ion 311 interconnecting the capacitance forming diffusion layer 307 and the charge holding electrode 309 is formed by selective growth and lateral growth (formation) of silicidation.

In the present embodiment, the semiconductor memory device having the same structure and operation as the above-described third embodiment can be realized by the two less number of the photolithographic operations.

Embodiment 6

A sixth embodiment of the present invention is hereinafter explained. In the present embodiment, a memory cell structure similar to that of the above-described third embodiment is formed and laid out on a semiconductor substrate of the SOI (silicon-on-insulator) structure.

Referring to FIGS. 45 to 47, 401 is a semiconductor substrate, 401A is a substrate isolation silicon oxide film and 402 is an isolation oxide film, that is a so-called selective oxide film. In the present embodiment, this isolation oxide film connects to the substrate isolation silicon oxide film 401. 403 is an active area, that is an area on the surface of the semiconductor substrate 401 not covered by the substrate isolation silicon oxide film 402. In the present embodiment, the active area is a silicon crystal layer isolated by oxidation during formation of the substrate isolation silicon oxide film 402 in an amount corresponding to the thickness of the silicon crystal film. 404 is a trench, the semiconductor substrate surface the inside of which constitutes a counterelectrode of the charge holding electrode. 405 is a gate electrode operating simultaneously as a word line. Between this gate electrode 405 and the active area 403 is a gate oxide film 406. 407 is a capacitance forming diffusion layer and 408 is a bit line connecting diffusion layer. 409 is a charge holding electrode. Between the charge holding electrode 409 and the surface of the semiconductor substrate 401 within the trench 404, there is a capacitance insulating film 410. 411 is a capacitance electrode connecting local interconnection and 412 is a bit line connecting local interconnection. 413 is a bit line.

The capacitance electrode connecting local interconnection 411 interconnects the capacitance forming diffusion layer 407 and the charge holding electrode 409 by a connection hole 414. The bit line connecting local interconnection 412 interconnects the bit line connection diffusion layer 408 and the bit line 413 via connection holes 415, 416.

In the present embodiment, the semiconductor substrate carries a silicon oxide film and a silicon crystal on a silicon substrate to provide a SOI substrate structure. However, since the trench 404 is opened in an area of the substrate isolation silicon oxide film 401 connecting to the isolation oxide film 402, the manufacturing method which is the same as the manufacturing method of the first to fifth embodiments can be used for the present embodiment.

The effect of the present invention includes the following advantages.

According to the present invention, as described above, the memory cell structure, strong against software errors, having the semiconductor substrate surface as a counterelectrode of the charge holding electrode can be manufactured by the same number of steps as that used for the CMOS logic device of the ordinary single-layer gate interconnection or the dual-layer metal interconnect ion solely by addition of a trench forming step by forming the gate oxide film and the capacitance insulating film by the same oxide film forming step and by forming the gate electrode and the charge holding electrode by the same electrode forming process.

Further, according to the present invention, additional to the case with the active areas of the gate electrode (word line) of the memory cell transistor neighboring in the channel width direction to each other are offset by two neighboring gate electrodes(word lines), the active areas neighboring to the word line direction can be arranged with a shift of the gate electrode (word line) and the trench is arrayed in a direction offset by 90° from the long side of the active area. Namely the active areas neighboring in the word line direction can be arranged with an offset of one gate electrode (word line), the isolating oxide film area between the traversing word lines is arranged next to the capacitance forming diffusion layer of the active area, such that the trench can be arranged in the isolating oxide film area between the traversed word lines in the direction 90° offset from the long side direction of the active area. Moreover, by eliminating the lithographic pattern of the charge holding electrode and by arranging the trench at the positions close to approximately one-fourth the minimum separation of the gate electrodes, it becomes possible to hold the size of the capacitance electrode and to reduce the gate electrode separation simultaneously. The memory cell area can be reduced to approximately 1.1 times the memory cell size designed by the solely memory dedicated design.

Moreover, according to the present invention, the trench capacitor can be formed to the same insulating film thickness and the electrode as the gate oxide film, it becomes possible to reduce the area by substitution for the compensating capacitor formerly provided by the planar capacitance.

Furthermore, according to the present invention, since the trench is formed penetrating through the isolation oxide film, it becomes possible to suppress the effect of parasitic devices of the separation area between the substrate at the capacitance counterelectrode and the diffusion area connecting to the capacitance holding electrode produced by directly forming the trench in the diffusion area connecting to the capacitance holding electrode of the transistor.

It should be noted that modifications apparent in the art may be done without departing the gist and concept as disclosed herein within the scope as claimed herein.

What is claimed is:

1. A method for manufacturing a semiconductor device having a dynamic random access memory having a plurality of memory cells each having a transistor and a capacitor, comprising the steps of:

forming a gate oxide film of said transistor and a capacitance insulating film of said capacitor by one and the same oxide film forming step;

forming a gate electrode of said transistor and a charge holding electrode of said capacitor by removing an un-needed portion of a same electrical conductor layer to a desired shape;

forming an area covered by an insulating film for isolating an active area; and forming a trench in an area coated by an insulating film for isolating said active area by providing an opening in said insulating film at a pre-set portion other than said active area, thereby forming a memory cell;

wherein said trench is formed between neighboring gate electrodes in a direction 90° offset from the long side direction of said active area;

wherein at least a part of said charge holding electrode of said capacitor is buried in said trench; and wherein said active areas of said gate electrodes neighboring to each other in the direction of the channel width are offset by one neighboring gate electrode.

2. The method as defined in claim 1 wherein the charge holding electrodes are at least partially buried in said trench and the capacitance connecting portion of the active area forming said transistor are connected to each other by lateral growth of a selectively grown electrical conductor.

3. The method as defined in claim 1 wherein the charge holding electrode are at least partially buried in said trench and a capacitor connecting portion of the active area forming said transistor are connected to each other by lateral growth of a selectively grown electrical conductor of silicon and by lateral growth by silicidation of said electrical conductor.

* * * * *